(12) United States Patent
Yoshioka et al.

(10) Patent No.: US 7,637,482 B2
(45) Date of Patent: Dec. 29, 2009

(54) LIQUID SUBSTANCE SUPPLY DEVICE FOR VAPORIZING SYSTEM, VAPORIZER, VAPORIZATION PERFORMANCE APPRAISAL METHOD

(75) Inventors: Naoki Yoshioka, Hadano (JP); Tatsushi Kawamoto, Hadano (JP); Mitsushi Kawao, Hadano (JP); Shigeru Matsuno, Sagamihara (JP); Akira Yamada, Fujisawa (JP); Shoji Miyashita, Sagamihara (JP); Fusaoki Uchikawa, Yokohama (JP)

(73) Assignees: Shimadzu Corporation, Kyoto-shi (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/219,584

(22) Filed: Jul. 24, 2008

(65) Prior Publication Data

US 2009/0045531 A1 Feb. 19, 2009

Related U.S. Application Data

(62) Division of application No. 11/604,235, filed on Nov. 27, 2006, now Pat. No. 7,422,198, which is a division of application No. 09/957,470, filed on Sep. 21, 2001, now Pat. No. 7,163,197.

(30) Foreign Application Priority Data

Sep. 26, 2000 (JP) .............................. 2000-292757
Sep. 26, 2000 (JP) .............................. 2000-292758
Sep. 26, 2000 (JP) .............................. 2000-292759

(51) Int. Cl.
*B01F 3/04* (2006.01)
(52) U.S. Cl. .............................. 261/43; 261/46; 261/47; 261/48; 261/52; 261/72.1

(58) Field of Classification Search .................. 261/43, 261/46, 47, 48, 49, 50.1, 51, 52, 72.1, DIG. 65
See application file for complete search history.

(56) References Cited

U.S. PATENT DOCUMENTS 3,385,113 A * 5/1968 Harris .................... 137/625.18

(Continued)

FOREIGN PATENT DOCUMENTS

JP 63-203590 A 8/1988

(Continued)

OTHER PUBLICATIONS

Office Action dated Oct. 3, 2006 issued in corresponding Japanese Application No. 2000-292757.

(Continued)

*Primary Examiner*—Scott Bushey
(74) *Attorney, Agent, or Firm*—Westerman, Hattori, Daniels & Adrian, LLP

(57) ABSTRACT

In a liquid substance supply device, a three port two valve directional control valve is provided in a transfer line, and a substance container and the transfer line are connected together by a four port three valve directional control valve in such a way that the four port three valve directional control valve and the substance container can be removed from the transfer line as a unit. Furthermore, in a vaporizer, an orifice member is provided to surround the end portion of an internal conduit in which flows a mixture substance consisting of a gas and a liquid substance mixed therewith, and gas for atomization is spouted into a vaporization chamber through a gap defined between the internal conduit and the orifice member. Yet further, the temperature of a vaporization surface in the vaporization chamber can be controlled independently in correspondence with the nature of the liquid substance.

3 Claims, 41 Drawing Sheets

U.S. PATENT DOCUMENTS

| | | | |
|---|---|---|---|
| 4,738,693 A | 4/1988 | Tom | |
| 5,372,754 A | 12/1994 | Ono | |
| 5,711,816 A | 1/1998 | Kirlin et al. | |
| 5,837,316 A | 11/1998 | Fuchita et al. | |
| 5,964,254 A | 10/1999 | Jackson | |
| 6,039,074 A | 3/2000 | Raaijmakers et al. | |
| 6,099,653 A | 8/2000 | Bhandari et al. | |
| 6,157,774 A | 12/2000 | Komino et al. | |
| 6,210,485 B1 | 4/2001 | Zhao et al. | |
| 6,244,291 B1 * | 6/2001 | Hughes | 137/312 |
| 6,273,957 B1 | 8/2001 | Yamamuka et al. | |
| 6,349,887 B1 | 2/2002 | Pyo | |
| 6,470,144 B1 | 10/2002 | Tarutani et al. | |
| 6,511,850 B1 | 1/2003 | Vigh et al. | |
| 6,596,085 B1 | 7/2003 | Schmitt et al. | |
| 6,783,118 B2 | 8/2004 | Sivaramakrishnan et al. | |
| 7,163,197 B2 | 1/2007 | Yoshioka et al. | |
| 7,422,198 B2 | 9/2008 | Yoshioka et al. | |

FOREIGN PATENT DOCUMENTS

| | | |
|---|---|---|
| JP | 5-20323 U | 3/1993 |
| JP | 5-68826 A | 3/1993 |
| JP | 5-253402 A | 10/1993 |
| JP | 7-94426 A | 4/1995 |
| JP | 10-88354 A | 4/1998 |
| JP | 10-89532 A | 4/1998 |
| JP | 10-088354 | 7/1998 |
| JP | 10-251853 A | 9/1998 |
| JP | 11-152571 A | 6/1999 |
| JP | 11-345774 A | 12/1999 |
| JP | 2000-42088 A | 2/2000 |
| JP | 2000-199066 A | 7/2000 |
| JP | 2001-152343 A | 6/2001 |
| JP | 2001-250819 A | 9/2001 |
| JP | 2001-262350 A | 9/2001 |
| JP | 2002-105646 A | 4/2002 |
| JP | 2002-110546 A | 4/2002 |
| JP | 2004-96127 A | 3/2004 |
| JP | 2004-116367 A | 4/2004 |
| WO | WO 94/21840 A | 9/1994 |

OTHER PUBLICATIONS

Korean Office Action dated Jan. 11, 2008 issued in Korean Patent Application No. 10-2007-0046453.

Korean Office Action dated Aug. 21, 2007 issued in corresponding Korean Application No. 2000-44852.

* cited by examiner

FIG.49

| CONCENTRATION OF Ba, Sr, Ti, etc. | 0ppm | 10ppm | 50ppm |
|---|---|---|---|
| INTERNAL STANDARD ELEMENT | 10ppm | 10ppm | 10ppm |
| HYDROCHLORIC ACID | 1% | 1% | 1% |

LIQUID SUBSTANCE SUPPLY DEVICE FOR VAPORIZING SYSTEM, VAPORIZER, VAPORIZATION PERFORMANCE APPRAISAL METHOD

This application is a divisional of application Ser. No. 11/604,235, filed Nov. 27, 2006, now U.S. Pat. No. 7,422,198, which is a divisional of application Ser. No. 09/957,470, filed Sep. 21, 2001, now U.S. Pat. No. 7,163,197.

INCORPORATION BY REFERENCE

The disclosures of the following priority applications are herein incorporated by reference:

Japanese Patent Application No. 2000-292757, filed Sep. 26, 2000;

Japanese Patent Application No. 2000-292758, filed Sep. 26, 2000;

Japanese Patent Application No. 2000-292759, filed Sep. 26, 2000.

BACKGROUND OF THE INVENTION

1. Field of the Invention

The present invention relates to a liquid substance supply device for a vaporizing system which vaporizes a liquid substance such as a liquid organometal or an organometal solution or the like, and also relates to a vaporizer and to a vaporization performance appraisal method.

2. Description of the Related Art

The MOCVD (Metal Organic Chemical Vapor Deposition) method is known as one thin film deposition method in semiconductor device manufacturing processes. In recent years this MOCVD method is rapidly coming into widespread use, since the resulting film quality and the speed of film deposition and step coverage and so on are superior by comparison to spattering methods and the like. There are various methods of supplying the CVD gas which is used in MOCVD devices, such as the bubbling method and the sublimation method. In recent years, the method of supplying a liquid substance that is a liquid organometal or an organometal dissolved in an organic solvent and vaporizing it directly before the CVD reactor has become recognized as an excellent method from the point of view of controllability and stability. In such a vaporization method, a liquid substance is supplied to a vaporizer by a liquid substance supply device, and, in the vaporizer, the liquid substance is sprayed from a nozzle into a vaporization chamber which is maintained at a high temperature, and is thus vaporized.

However, the liquid substance which is used in such a MOCVD method can easily undergo hydrolytic reactions, and there has been a danger that its nature may change due to precipitates being formed in the liquid or the like. Such generation of precipitates can easily lead to problems with the operation of valves provided in the liquid supply lines, or the occurrence of residues within the vaporizer or blockages due to the precipitates or the like. As a result there have been the problems that the rate of flow may become less stable and consistent, and that, if the residues form into particles which arrive at the CVD reactor, the consistency of film deposition may be deteriorated.

In the past, a mass flow controller in which a mass flow meter and a flow amount control valve are combined together has generally been employed for controlling the rate of flow of a liquid substance. If a thermal type mass flow meter is used as the mass flow meter, it can easily be influenced by the ambient temperature, and accordingly it is not desirable to locate such a meter in the vicinity of the vaporizer which attains high temperatures. On the other hand, from the point of view of responsiveness of flow rate control, it is desirable to locate the mass flow controller directly before the vaporizer. As a result there is the problem that, when determining the position in which such a mass flow controller is to be disposed, one or the other of accuracy of flow control and responsiveness must be sacrificed, and accordingly either case causes insufficient installation condition.

Furthermore, when it is not possible to provide a sufficient supply of heat energy to the liquid substance during vaporization, it can happen that non-vaporized residues can be created and can cause blockages in the supply conduits, and there is a danger that the residues can become particulated and can arrived at the CVD reactor and can cause poor film deposition. Yet further, when vaporizing a mixture of a plurality of components, since the vaporization temperatures and the pyrolysis (thermal decomposition) temperature characteristics of the various components are different, it has been easy for residues to be generated by non vaporization or by pyrolysis of some of the components.

Yet further, although it is necessary to appraise the vaporization performance under various conditions of vaporization in order efficiently to implement vaporization while suppressing the generation of non vaporized residues, it is extremely difficult to perform such appraisal due to the characteristics of the substances and so on, and up to the present no established appraisal method has been developed.

SUMMARY OF THE INVENTION

A primary objective of the present invention is to provide a liquid substance supply device which suppresses the generation of residues or bubbles, and with which the stability and controllability of liquid substance supply are good.

Another objective of the present invention is to provide a vaporizer which can reduce the generation of non vaporized residues and particles, and furthermore to provide a reliable vaporization performance appraisal method.

In order to achieve the above described objectives, in the liquid substance supply device according to the present invention, there is provided a three port two valve directional control valve of unitary structure, disposed at a branch point where a liquid substance transfer line which supplies a liquid substance to a vaporizer branches into three directions. This three port two valve directional control valve comprises a first valve body, provided between a first conduit and a second conduit, which performs an ON-OFF control of transfer of fluid between the first conduit and the second conduit, and a second valve body, provided between the second conduit and a third conduit, which performs an ON-OFF control of transfer of fluid between the second conduit and the third conduit, with the second conduit being provided between the first valve body and the second valve body.

Furthermore, according to another aspect of the liquid substance supply device according to the present invention, a four port three valve directional control valve of unitary structure is provided between the liquid substance transfer and the gas supply lines and the substance container, and the substance container and the four port three valve directional control valve can be attached to and removed from the gas supply line and the liquid substance transfer line as one unit. This four port three valve directional control valve comprises (a) a first valve body, provided between a first conduit and a second conduit, which performs an ON-OFF control of transfer of fluid between the first conduit and the second conduit, (b) a second valve body, provided between the first conduit and a third conduit, which performs an ON-OFF control of transfer of fluid between the first conduit and the third conduit, and (c) a third valve body, provided between the third conduit and a fourth conduit, which performs an ON-OFF control of transfer of fluid between the third conduit and the fourth conduit; and the first conduit is provided between the first valve body and the second valve body, while the third conduit is provided between the second valve body and the third valve body. Moreover, the first conduit and the gas supply line are connected together, the second conduit and a gas region of the substance container are connected together, the third conduit and the liquid substance transfer line are connected together, and the fourth conduit and a liquid region of the substance container are connected together.

According to another aspect of the liquid substance supply device according to the present invention, the substance container which contains the liquid substance may comprise a casing to which gas from the gas supply line is supplied, and an inner bag which is flexible or bellows-shaped, is housed within the casing, and stores the liquid substance. When the gas is supplied to within the casing, the liquid substance in the inner bag is expelled from the substance container towards the liquid substance transfer line. It is also possible to provide to this liquid substance supply device a measurement means which measures the amount of liquid substance in the inner bag, based upon variation of the pressure of the gas supplied to the interior of the casing.

Furthermore, according to another aspect of the liquid substance supply device according to the present invention, the substance container may comprise a first bellows-shaped bag into which the liquid substance is charged, and a second bellows-shaped bag which is connected to the first bellows-shaped bag in series in the expansion and contraction direction of the first bellows-shaped bag, and which contracts the first bellows-shaped bag by gas supply from the gas supply line, so as to expel the liquid substance within the first bellows-shaped bag towards the liquid substance transfer line. An indication member is provided to a connection portion between the first bellows-shaped bag and the second bellows-shaped bag and indicates the position of the connection portion.

There may also be provided a drain tank whose interior is evacuated to a low pressure state, which is connected via a valve to the liquid substance transfer line directly before the vaporizer, and which receives waste fluid from the liquid substance transfer line.

Furthermore, there may also be provided in the liquid substance transfer line a detection device which detects the presence or absence of the liquid substance or the presence or absence of bubbles. A photoelectric sensor may be used for this detection device.

Yet further, there may be provided a thermal mass flow rate meter and a flow rate control valve which are separated from one another, with the flow rate meter being disposed on the side of the liquid substance transfer line towards the substance container, and the flow rate control valve being disposed on the side of the liquid substance transfer line towards the vaporizer. The flow rate control valve may also comprise a cutoff mechanism which can cut off the supply of the liquid substance.

One of PEEK (polyether ether ketone), PTFE (polytetrafluoroethylene), PI (polyimide), and PBI (polybenzimidazole) may be used as the material for making a resin member which contacts the liquid substance, provided in the liquid substance transfer line.

In the liquid substance transfer line there may be provided a filter which comprise a plurality of layers of a first mesh made of stainless steel (SUS) which has a fine wire diameter and a plurality of layers of a second mesh made of stainless steel (SUS) which has a coarse wire diameter. PTFE mesh may be employed instead of the stainless steel (SUS) mesh.

Moreover, in the vaporizer according to the present invention, there is provided a transfer conduit from which a gas and liquid mixture substance is sprayed, which is made as a double conduit comprising an internal conduit in which a liquid substance is transferred as a gas/liquid two phase flow, and an external conduit into which the internal conduit is inserted keeping a space and which transfers gas for atomization. And an end portion of the internal conduit is inserted keeping a gap into an orifice member, and gas for atomization is spouted into the vaporization section through this gap.

Furthermore, at the tip of the atomization section there may be provided a nozzle ring having a vaporization surface, and the orifice member may be disposed between the nozzle ring and the tip of the external conduit and may be made from PEEK (polyether ether ketone), and a seal member made from PTFE (polytetrafluoroethylene) may be disposed between the orifice member and the tip of the external conduit. This orifice member and seal member work to hinder the transfer of heat between the nozzle ring and the external conduit, so that the liquid substance which adheres to the vaporization surface can easily vaporize, and it is possible to prevent the occurrence of residues of the liquid substance upon the end portion of the atomization section. The nozzle ring may be fixed to the vaporization section.

Yet further, the nozzle ring may comprise a first member which is engaged with the tip of the atomization section by screwing, and a second member which is provided separately from the first member and is sandwiched between the orifice member and the first member.

The internal conduit and the atomization section may be connected by a gasket type seal coupling which employs a metal gasket. The atomization section is fixed to one of a pair of coupling members of this gasket type seal coupling, while the internal conduit is fixed to the other coupling member. The amount of projection of the internal conduit end portion from the orifice member can be adjusted by adjusting the amount of screwing in the axial direction of the gasket type seal coupling.

Furthermore, the vaporizer may comprise an atomization section which sprays a gas/liquid mixture substance consisting of a mixture of a liquid substance which contains a liquid organometal or an organometal solution and a carrier gas, from an end portion of a transfer conduit, and a vaporization section which vaporizes the sprayed liquid substance, with the liquid substance flowing through the transfer conduit in an annular spray flow state.

Yet further, in a vaporizer in which a liquid substance is sprayed into a vaporization chamber which is kept at a high temperature and is vaporized, a vaporization surface, the temperature of which can be controlled independently of the temperature of the vaporization chamber, may be provided within the vaporization chamber. Moreover, a plurality of spray sections may be provided, and in this case each such spray section should oppose a vaporization surface whose temperature can be independently controlled.

It is also possible to form, in the vaporization chamber, a tubular chamber extending in the horizontal direction, with the liquid substance being sprayed in the vertically downwards direction into the tubular chamber against its inner wall surface. Furthermore, by coating the vaporization surface with a film of the same substance as the film which is deposited by the CVD film deposition device, it is possible to prevent the occurrence of chemical reactions between the vaporization surface and the liquid substance.

Appraisal of the vaporization performance of the vaporizer is performed as follows. In detail, after a predetermined amount of the liquid substance has been sprayed into the vaporization chamber and has been vaporized therein, the non-vaporized adherent material in the vaporization chamber is removed using an organic solvent, the amount of the liquid substance which is contained in the organic solvent which has been used for this removal is measured, and the vaporization performance is appraised based upon this contained liquid substance amount which has been measured.

BRIEF DESCRIPTION OF THE DRAWINGS

FIG. 29 is a figure showing a first variant embodiment of a method of connecting a conduit 224 and an internal conduit 200a.

FIG. 30 is a figure showing a second variant embodiment of a method of connecting the conduit 224 and the internal conduit 200a.

FIG. 31 is a figure showing a third variant embodiment of a method of connecting the conduit 224 and the internal conduit 200a.

FIG. 34 is a figure showing the temperature distribution in the axial direction within the internal conduit 200a.

FIG. 49 is a figure showing the details of test materials which are used as benchmarks.

DESCRIPTION OF THE PREFERRED EMBODIMENTS

In the following, various embodiments of the present invention will be described with reference to the appended drawings.

Overall Structure of the Vaporizing System

Figure 1:
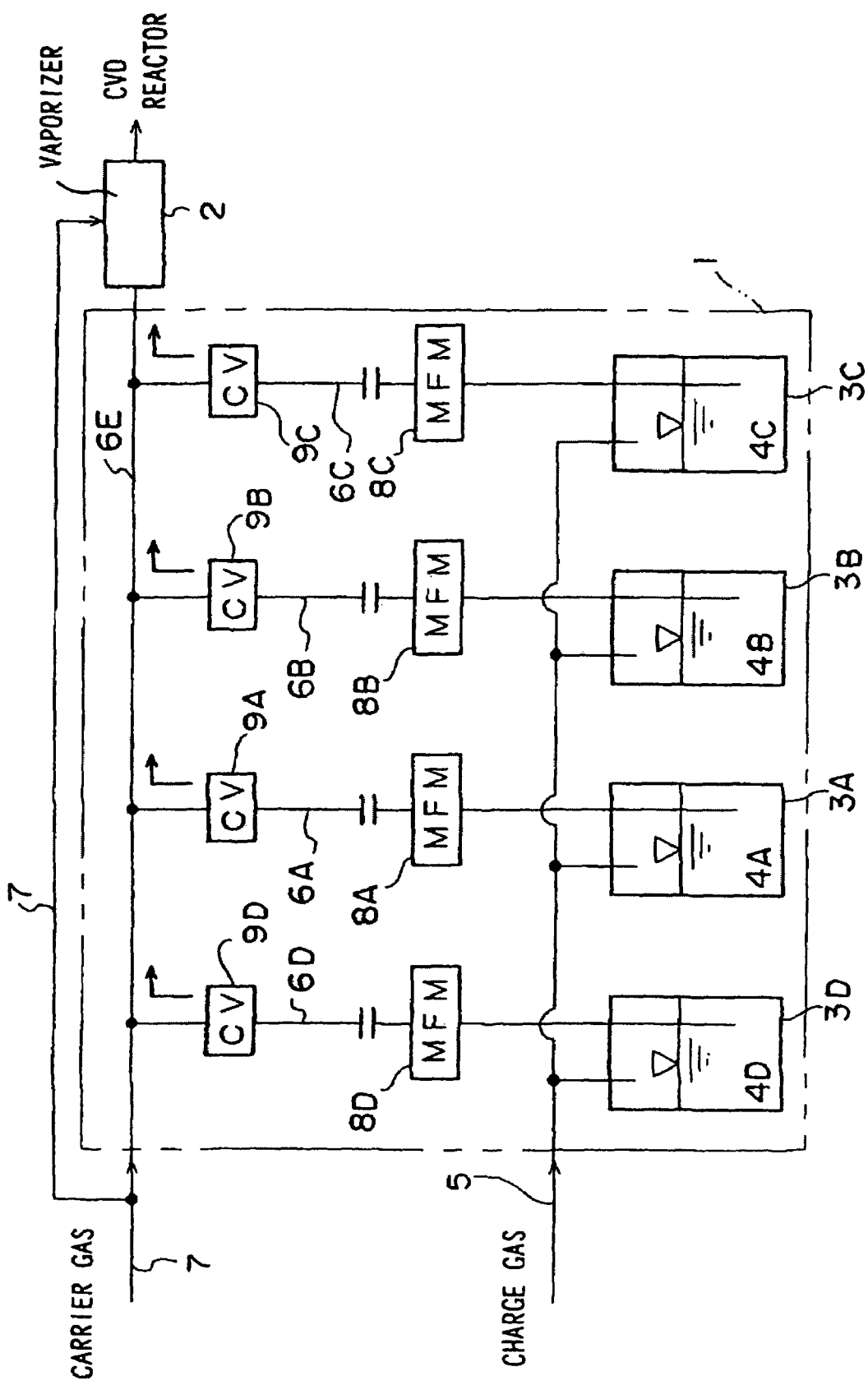
FIG. 1 is a figure showing the general structure of a vaporizing system.

FIG. 1 is a figure showing the general structure of the vaporizing system. This liquid substance vaporizing system is comprised of a liquid substance supply device 1 and a vaporizer 2. Liquid substance which has been supplied from the liquid substance supply device 1 to the vaporizer 2, after having been vaporized in said vaporizer 2, is supplied to a CVD reactor provided in a CVD device. Various liquid substances may be used in such a MOCVD process, for example a liquid organometal such as Cu or Ta, or an organometallic solution where an organometal such as Ba, Sr, Ti, Pb, or Zr is dissolved in an organic solvent. The liquid substance may be referred to as the CVD source.

Substance containers 3A, 3B, and 3C which are provided in the liquid substance supply device 1 are charged with quantities 4A, 4B, and 4C of liquid substances which are to be used for the MOCVD process. For example, if a BST (Ba—Sr—Ti oxide) film is to be formed, the liquid substances 4A, 4B, and 4C may respectively be the raw materials Ba, Sr, and Ti dissolved in an organic solvent such as THF (tetrahydrofuran). Furthermore, a quantity of the raw solvent THF is charged into a solvent container 3D. It should be noted that the number of the containers 3A through 3D is not limited to four; an appropriate number should be provided for the number of types of raw material which are to be employed.

A charge gas line 5 is connected to all the containers 3A through 3D, and transfer lines 6A through 6D are connected to said containers 3A through 3D respectively. When charge gas is supplied via the charge line to the containers 3A through 3D, the pressure of this charge gas is applied to the surfaces of the masses of liquid substance 4A through 4C and the mass of solvent 4D which are charged into the containers 3A through 3D respectively. As a result, the liquid substances 4A through 4C and the solvent 4D are expelled towards the respective transfer lines 6A through 6D. These liquid substances 4A through 4C and the solvent 4D which are expelled into the respective transfer lines 6A through 6D flow into a transfer line 6E due to the effects of the gas pressure, and are mixed together within this transfer line 6E.

Carrier gas from the carrier gas line 7 is also supplied into the transfer line 6E. This carrier gas, the liquid substances 4A through 4C, and the solvent 4D within the transfer line 6E are supplied towards the vaporizer 2 in the state of a two-phase-flow of liquid phase and gas phase. Carrier gas is also supplied to the vaporizer 2 via a carrier gas line 7, and the substances which have been vaporized therein are transported towards the CVD reactor (not shown) by the carrier gas.

An inert gas such as nitrogen gas or argon gas is used as the carrier gas. It is desirable to reduce the amounts of the liquid substances 4A through 4C and of the solvent 4D which remain behind in the transfer lines 6A through 6E to the minimum, and therefore, in this preferred embodiment of the present invention, ⅛ inch conduit is used for the transfer lines 6A through 6E.

Mass flow meters 8A through 8D and flow rate control valves 9A through 9D which can be cut off are provided within each of the transfer lines 6A through 6D, respectively. While observing the flow rates of the liquid substances 4A through 4C and of the solvent 4D via the mass flow meters 8A through 8D, the flow rate control valves 9A through 9D are controlled so that said flow rates of the liquid substances 4A through 4C and of the solvent 4D may be set to their most suitable values. It should be noted that it would be acceptable also to provide a mixer in the transfer line 6E directly before the vaporizer, so as to enhance the state of mixing of the various liquid substances therein. Furthermore, instead of the flow rate control valves 9A through 9D which control the flow rates of the various liquid substances 4A through 4D and of the solvent 4D, it would also be acceptable to perform this flow control by using pumps such as plunger pumps or the like.

Explanation of the Liquid Substance Supply Device

Figure 2:
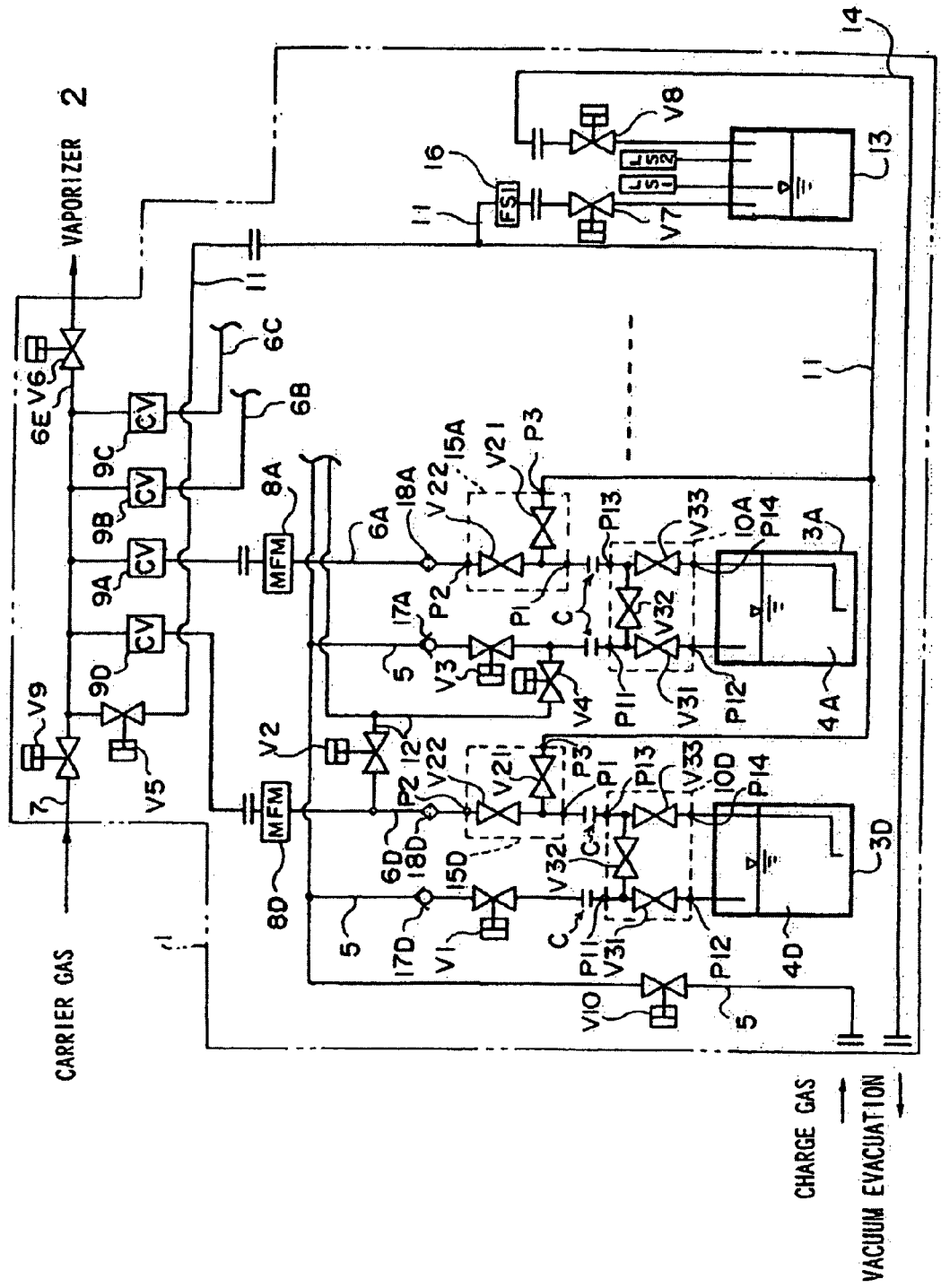
FIG. 2 is a figure showing the details of a liquid substance supply device.

FIG. 2 is a figure showing the details of the liquid substance supply device which is the preferred embodiment of the present invention. In FIG. 2, the structure of the transfer lines which are related to the substance containers 3B and 3C is omitted, since it is the same as that of the transfer line for the substance container 3A. First, the positions of arrangement of the mass flow meters 8A through 8D and the flow rate control valves 9A through 9D will be explained. Although in prior art devices, as described above, a type of mass flow controller is used in which a mass flow meter and a flow rate control valve are combined, by contrast, with the liquid substance supply device according to this preferred embodiment of the present invention, independent mass flow meters 8A through 8D and flow rate control valves 9A through 9D are provided in each of the transfer lines 6A through 6D.

The mass flow meters 8A through 8D are thermal mass flow rate meters, and they take advantage of the fact that the energy which is required to raise the substance flow by a specified temperature is proportional to the mass flow rate. Each of these mass flow meters 8A through 8D comprises a heater for warming up the mass flow and a pair of temperature meters for measuring the temperature difference in the direction of the mass flow. The flow meters 8A through 8D control the heat amount q of the heaters so as to make the temperature difference $\Delta T$ along the direction of flow equal to a specified value. Since the mass flow rate is proportional to the heat amount q which is being supplied at this time, conversely, the mass flow rate can be obtained from the heat amount q.

With the liquid substance supply device shown in FIG. 2, the mass flow meters 8A through 8D are disposed at positions in their transfer lines 6A through 6D which are close to the containers 3A through 3D, and the flow rate control valves 9A through 9D are disposed at positions in their transfer lines 6A through 6D which are close to the vaporizer 2. As a result, along with it becoming possible to prevent thermal influence of the vaporizer 2 from affecting the mass flow meters 8A through 8D, it is also possible to anticipate enhanced responsiveness.

Figure 3:
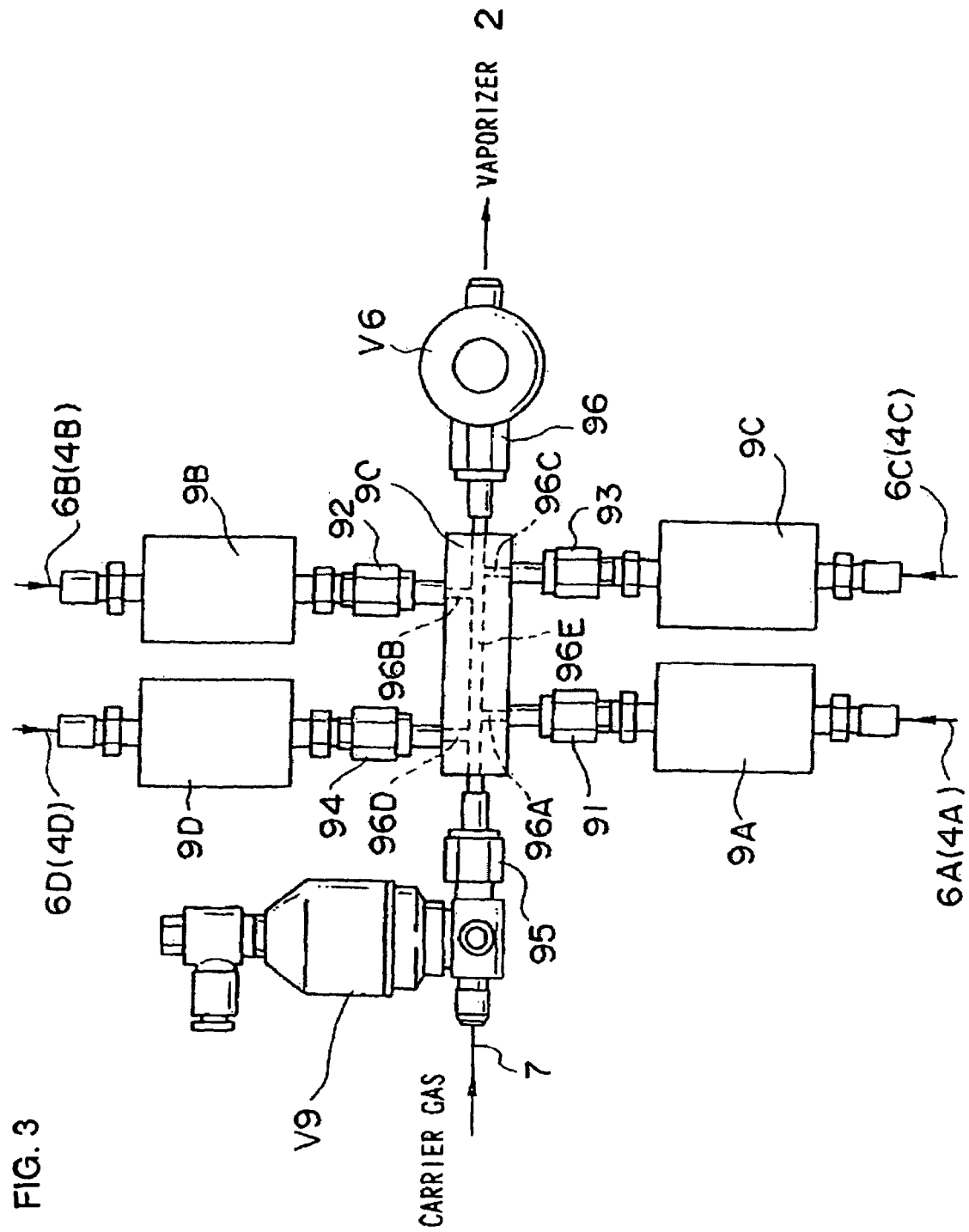
FIG. 3 is a figure showing an external view of flow rate control valves 9A through 9D.

FIG. 3 is a figure showing an external view of the flow rate control valves 9A through 9D. These flow rate control valves 9A through 9D are connected to a block 90 by respective ports 91, 92, 93, and 94. Internally to the block 90 there are formed conduits 96A through 96E which respectively correspond to the transfer lines 6A through 6E. The above described ports 91 through 94 are connected respectively to the conduits 96A through 96D, and the two opposite ends of the conduit 96E are connected to ports 95 and 96. Open/close valves V9 and V6, shown in FIG. 2, are provided to the ports 95 and 96 connected to the conduit 96E respectively.

The liquid substances 4A through 4C and the solvent 4d are conducted to the conduits 96A through 96D via the flow rate control valves 9A through 9D respectively, and these flows then mix together in the conduit 96E. Carrier gas is supplied to the conduit 96E through the port 95. As a result, a mixture of the liquid substances 4A through 4C and the carrier gas in the two phase flow state of liquid phase and gas phase is present in the conduit 96E. The liquid substance present in this two phase flow state of liquid phase and gas phase is supplied into the vaporizer 2 shown in FIG. 2 via the open/close valve V6.

Since only the flow rate control valves 9A through 9D, which are provided in positions remote from the corresponding mass flow meters 8A through 8D, are connected to the block 90, thereby it is possible to make the block 90 compact. Since not only is the block 90 provided in the vicinity of the vaporizer 2, but also the flow rate control valves 9A through 9D are employed which have the additional function of cutoff valves, thereby it is possible to minimize the conduit volume between the flow rate control valves 9A through 9D and the vaporizer 2. As a result, it is possible to enhance the responsiveness of flow rate control. Furthermore it is possible to minimize the volume of conduit through which the mixture flows, so that it is possible to reduce deterioration etc. of the liquid substance due to stop or stay.

Returning to FIG. 2, the substance container 3A and the solvent container 3D are connected to the charge gas line 5 and the transfer lines 6A and 6D via connectors C which can be attached and removed individually. Four port three valve directional control valve assemblies 10A and 10D of unitary construction are provided between the connectors C and the containers 3A and 3D respectively. Thanks to this structure, each of the containers 3A and 3D can be attached or removed as a unit together with each of four port three valve directional control valve assemblies 10A and 10D.

This liquid substance supply device 1 is provided with auxiliary lines 11 and 12 for performing evacuation, gas purging, solvent rinsing, liquid substitution, and so on of the transfer lines 6A and 6D. These auxiliary lines 11 and 12 are connected to a drain tank 13 which receives waste fluid during solvent rinsing or liquid substitution. Sensors LS1 and LS2 are provided to the drain tank 13 for detecting a high level of waste fluid within said tank. A vacuum evacuation line 14 is connected to the drain tank 13 for bringing the interior of said drain tank 13 to a low pressure state. The auxiliary line 11 is connected to the transfer lines 6A and 6D, respectively, via three port two valve directional control valve assemblies 15A and 15D which are of unitary construction. Furthermore, an observation device 16 is provided in the auxiliary line 11, and, by looking through this observation device 16, it is possible to check the state of the substance which is flowing through said line 11, in other words whether said substance is liquid or gaseous. It should be noted that the details of the structures of the four port three valve directional control valve assemblies 10A and 10D, the three port two valve directional control valve assemblies 15A and 15D, and the observation device 16 will be described hereinafter.

Open/close valves V1 through V10 are provided in the charge gas lines 5, the transfer lines 6A, 6D, and 6E, the carrier gas line 7, the auxiliary lines 11 and 12, and the vacuum evacuation line 14 respectively. Vacuum evacuation, gas purging, and solvent rinsing are performed by appropriately changing over the open and closed states of the open/close valves V1 through V10 and the switchover states of the three port two valve directional control valve assemblies 15. Moreover, check valves 17A and 17D are respectively provided in the charge gas lines 5, and filters 18A and 18D are respectively provided in the transfer lines 6A and 6D.

Figure 4:
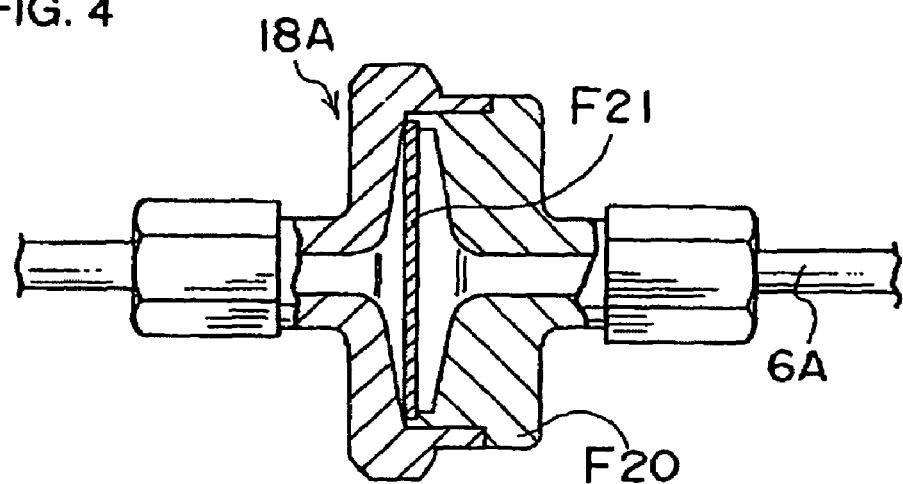
FIG. 4 is a sectional view of a filter 18A.

With the liquid substance supply device 1 shown in FIG. 2, in order to ensure stability of fluid supply, along with providing in the transfer lines 6A and 6D the filters 18A and 18D which hinder the generation of bubbles, it is also arranged to reduce the dead volume in the conduits to as low a value as possible in order to hinder the development of precipitates in the liquid substance. FIG. 4 is a sectional view of the filter 18A. A sheet shaped filter element F21 is disposed within the body F20 of the filter 18A provided in the transfer line 6A, oriented almost perpendicularly to the direction of fluid flow. It should be noted that the filter 18D shown in FIG. 2 has exactly the same structure as the filter 18A.

A layered mesh with material such as stainless steel (SUS) wire may be used for the filter element F21. In this preferred embodiment, the filter element F21 is made with layers of two types of mesh, one consisting of fine diameter mesh and the other consisting of coarse diameter mesh. Due to this, the filter 18A presents a low pressure loss as compared to prior art sintered type filters, and moreover has a desirable flow regulation action, and suppresses the occurrence of bubbles, thus stabilizing the flow rate. Furthermore, the strength of the filter element F21 is enhanced by using not only the fine diameter mesh but also the coarse diameter mesh. Yet further, it would also be acceptable to use a combination of layers of PTFE mesh for the filter element F21, and in this case the resistance is enhanced, by comparison with stainless steel mesh.

Figure 5:
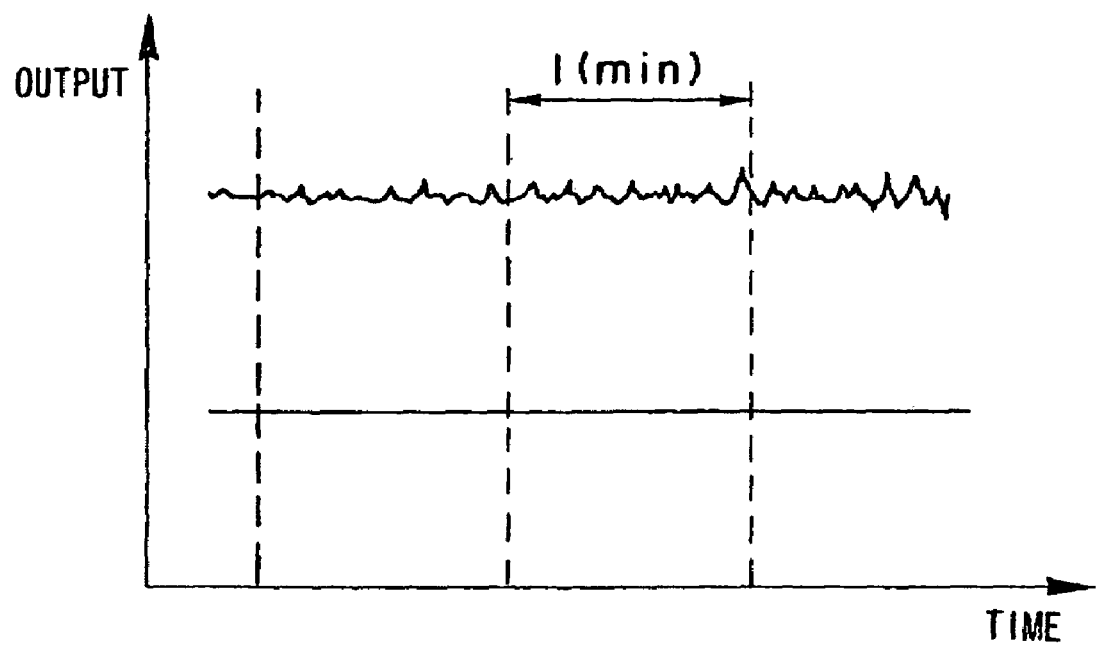
FIG. 5 is a figure showing the stability of the flow rate through the filter 18A.

FIG. 5 is a figure showing a comparison between the performance of the above filter 18A which uses the filter element F21, and the performance of a prior art filter which uses a sintered type filter element. In FIG. 5, there is shown the output of a mass flow controller positioned at a distance of 2 m from the filter 18A in a conduit of $\phi$ 1.6×0.5 when the THF solvent was flowing at a flow rate of 0.8 ml/min. In the upper portion of FIG. 5 there is shown the case of a prior art sintered type filter, and it is seen that the output wobbles somewhat upwards and downwards due to the generation of bubbles. On the other hand the case of the filter 18A of this preferred embodiment is shown in the lower portion of FIG. 5, and it will be clear that the wobbling which was present in the prior art does not now appear, so that the flow rate is stabilized.

When performing flow rate control using a mass flow controller, it becomes necessary to keep the pressure differential presented by the mass flow controller above a minimum of 0.5 $kg/cm^2$ and it is easy for bubbles to be generated in the filter portion. Due to this, the filter 18A described above operates very effectively with regard to flow rate stabilization.

Figure 6:
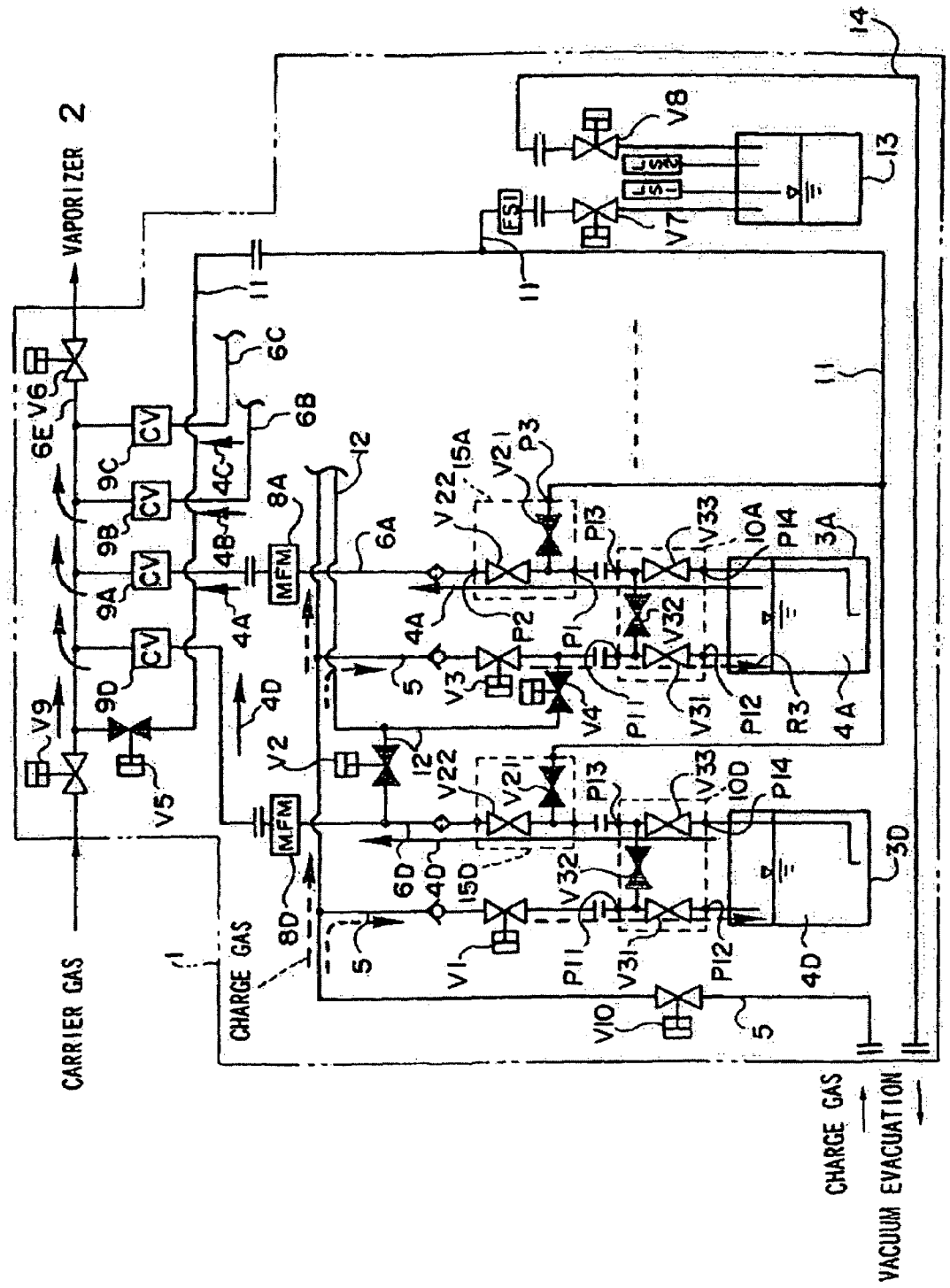
FIG. 6 is a figure showing the open and closed states of the various valves during liquid substance supply.

The opening and closing of the various valves is controlled as shown in FIG. 6 when supplying the liquid substances 4A through 4C to the vaporizer 2. For the convenience of explanation of the open and closed states of the valves, in FIG. 6, the symbols for the valves which are closed are colored black. The flows of charge gas are shown by the broken line arrows, while the flows of the liquid substances 4A through 4C and of the solvent 4D are shown by the solid arrows. During liquid substance supply, the open/close valves V1, V3, and V5 through V10, the valve units V22 of the three port two valve directional control valve assemblies 15A and 15D, and the valve units V31 and V33 of the four port three valve directional control valve assemblies 10A and 10D are put into the open state. On the other hand, the open/close valves V2, V4, and V5, the valve units V21 of the three port two valve directional control valve assemblies 15A and 15D, and the valve units V32 of the four port three valve directional control valve assemblies 10A and 10D are put into the closed state. The details of the structure of the three port two valve directional control valve assemblies 15A and 15D and of the four port three valve directional control valve assemblies 10A and 10D will be explained hereinafter.

When controlling the opening and closing states of the various valves as shown in FIG. 6, the charge gas flows into the substance containers 3A through 3C and into the solvent container 3D, so that the liquid substances 4A through 4C and the solvent 4D are expelled from the containers 3A through 3D into the transfer lines 6A through 6D respectively. The liquid substances 4A through 4C and the solvent 4D expelled into the transfer lines 6A through 6D are transferred into the transfer line 6E, in which they mix. Furthermore, the carrier gas flows into this transfer line 6E, so that the liquid substances in the mixed state and the carrier gas form a mass in the two phase flow state of liquid phase and gas phase, which is then supplied to the vaporizer 2.

Figure 7:
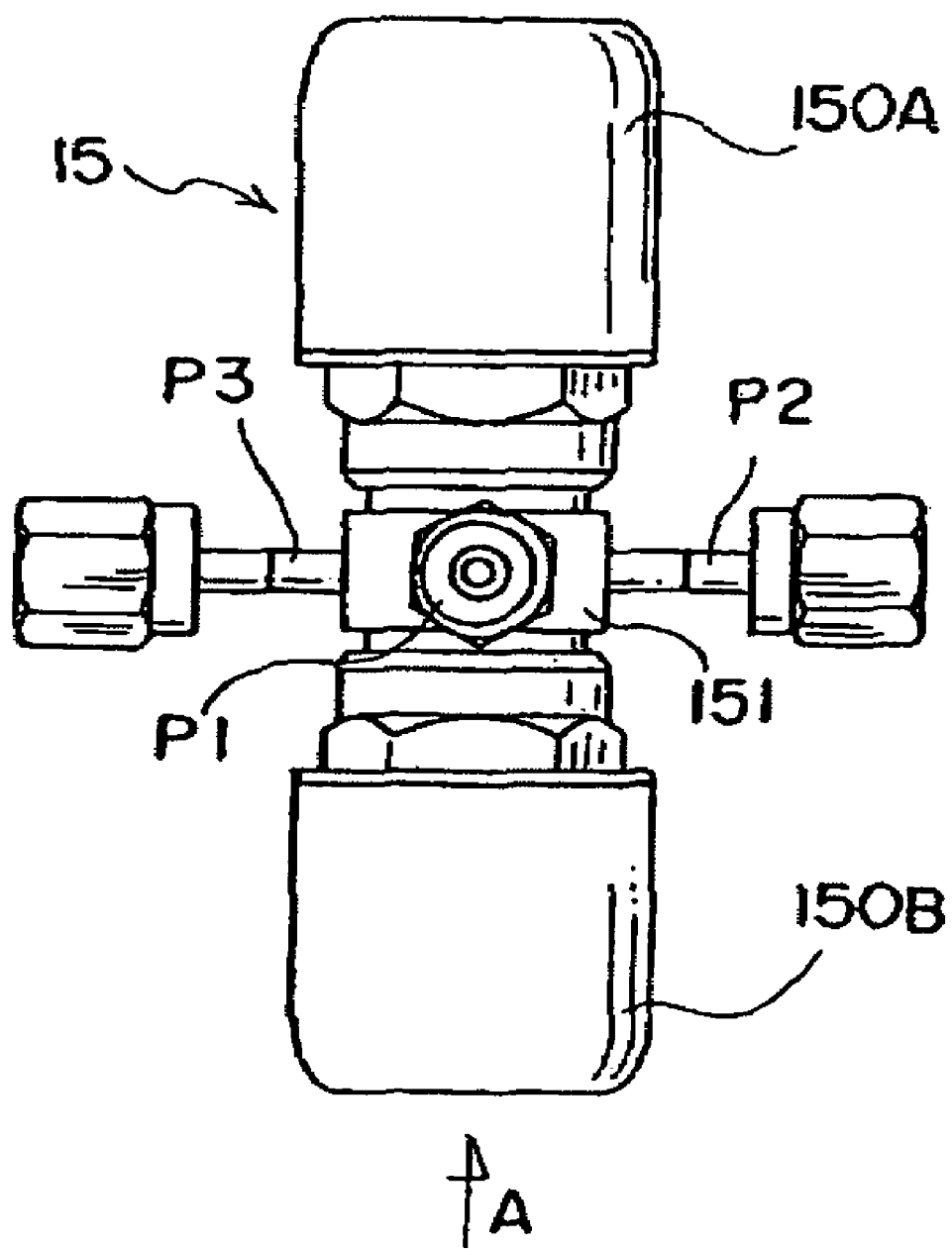
FIG. 7 is a front elevation view of a three port two valve directional control valve assembly 15.
Figure 8:
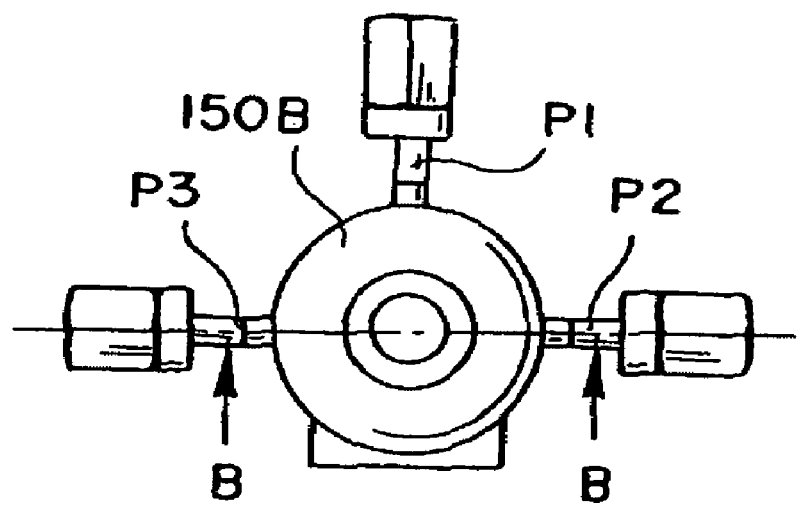
FIG. 8 is a view of the valve assembly 15 of FIG. 7 as seen in the direction shown by the arrow A in FIG. 7.
Figure 9:
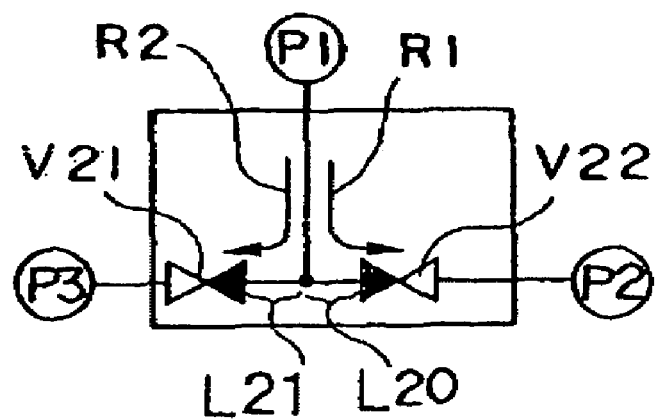
FIG. 9 is a flow diagram for this three port two valve directional control valve assembly 15.
Figure 10:
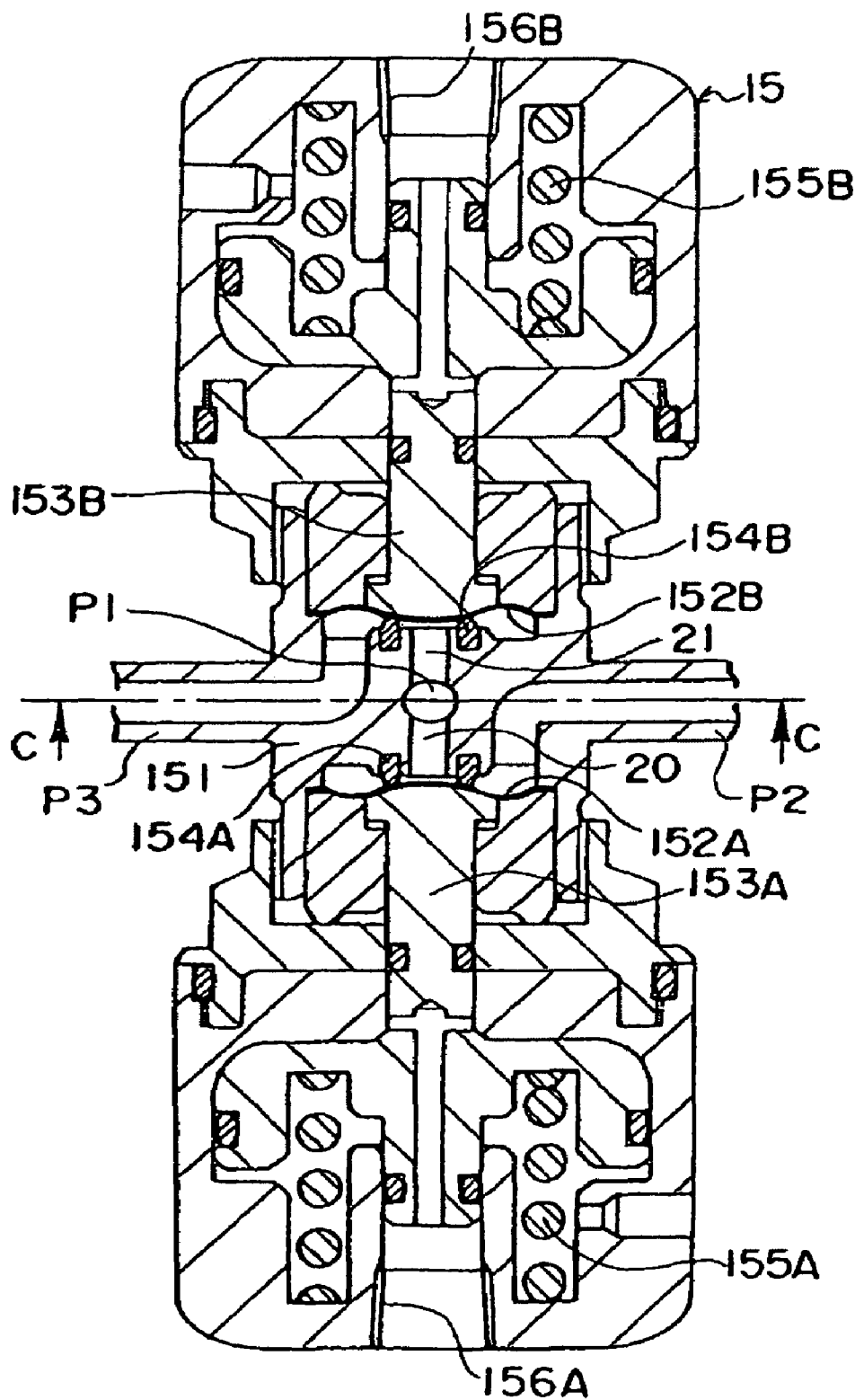
FIG. 10 is a sectional view of this valve assembly 15 taken in a plane shown by the arrows B-B in FIG. 8.
Figure 11:
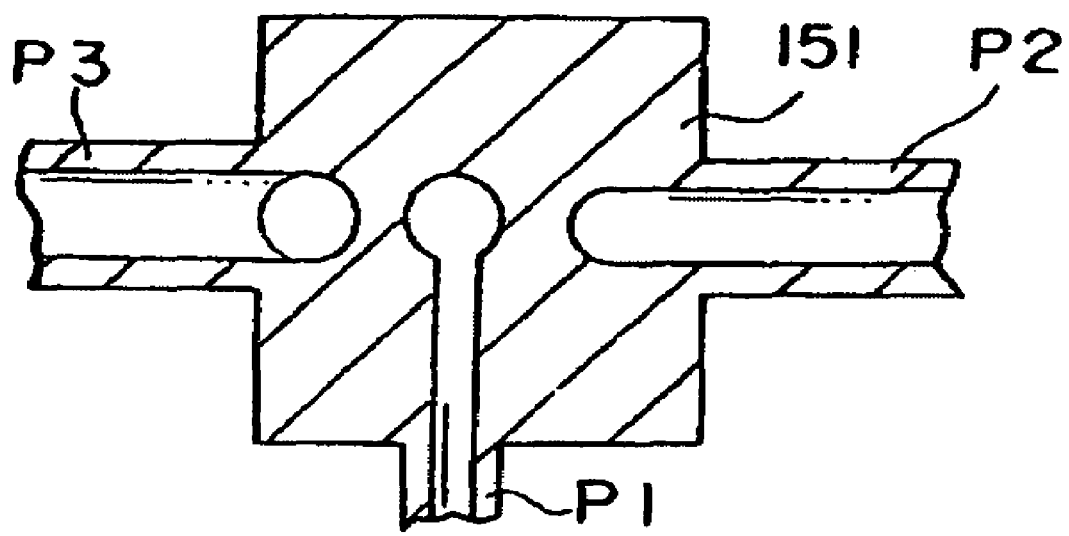
FIG. 11 is a sectional view of this valve assembly 15 taken in a plane shown by the arrows C-C in FIG. 10.

Concrete Structural Example of the Three Port Two Valve Directional Control Valve Assemblies FIGS. 7 through 11 are figures showing an example for the structure of the three port two valve directional control valve assembly 15. FIG. 7 is a front elevation view of the three port two valve directional control valve assembly 15; FIG. 8 is a view thereof as seen in the direction shown by the arrow A in FIG. 7; FIG. 10 is a sectional view of this valve assembly 15 taken in a plane shown by the arrows B-B in FIG. 8; and FIG.

11 is a sectional view of this valve assembly 15 taken in a plane shown by the arrows C-C in FIG. 10. Furthermore, FIG. 9 is a flow diagram for this three port two valve directional control valve assembly 15. As shown in this FIG. 9 flow diagram, this three port two valve directional control valve assembly 15 comprises two open/close valves V21 and V22 in a unitary structure, and has three ports P1, P2, and P3. In this preferred embodiment, the open/close valves V21 and V22 will be termed the valve units V21 and V22.

The reference symbols 150A and 150B denote valve drive sections which are driven by externally supplied compressed air. As shown in FIG. 10, a pair of diaphragms 152A and 152B related to the valve units V22 and V21 are provided in a body 151. Opening and closing operation of the valve units V22 and V21 is respectively performed by pistons 153A and 153B which are driven in the upwards and downwards directions in the figure.

In the open/closed state shown in FIG. 10, the piston 153A is driven by the biasing force of a spring 155A in the upwards direction in the figure, so that the diaphragm 152A is pressed against a valve seat 154A. On the other hand, the piston 153B is driven by the biasing force of a spring 155B in the downwards direction in the figure, so that the diaphragm 152B is pressed against a valve seat 154B. As a result the port P1 and the port P2 are cut off from one another, and the port P1 and the port P3 are also cut off from one another.

When, in the state shown in FIG. 10, compressed air is supplied to the air inlet 156A, then the piston 153A is driven in the downwards direction in the figure by the pressure of this air. As a result, the diaphragm 152A is driven away from the valve seat 154A against which it was previously pressed, and the port P1 and the port P2 are communicated together. On the other hand, when compressed air is supplied to the air inlet 156B, then the piston 153B is driven in the upwards direction in the figure by the pressure of this air. As a result, the diaphragm 152B is driven away from the valve seat 154B against which it was previously pressed, and the port P1 and the port P3 are communicated together.

With the three port two valve directional control valve assemblies 15A and 15D shown in FIG. 2, the ports P1 and P2 are connected to the transfer lines 6 (6A and 6D), and the port P3 is connected to the auxiliary line 11. For example, when the liquid substance 4A is expelled from the substance container 3A into the transfer line 6A, along with opening the valve unit V22 of the three port two valve directional control valve assembly 15A, the valve unit V21 is closed, and the liquid substance 4A is conducted from the port P1 to the port P2 as shown by the flow R1 in FIG. 9. On the other hand, when as will be explained hereinafter conduit rinsing is being performed in case that the substance container 3A is removed and attached, along with closing the valve unit V22, the valve unit V21 is opened, and the waste rinsing fluid is conducted from the port P1 to the port P3 as shown by the flow R2 in FIG. 9.

When the liquid substance 4A is being expelled to the transfer line 6A as shown by the flow R1 in FIG. 9, the conduit portion L21 constitutes dead volume. On the other hand, when the waste rinsing fluid is flowing as shown by the flow R2 is FIG. 9, the conduit portion L20 constitutes dead volume. As shown in FIG. 10, the port P1 is provided between the diaphragm 152A and the diaphragm 152B. Due to this, the conduit L20 is constituted by the space between the port P1 and the diaphragm 152A, while the conduit L21 is constituted by the space between the port P1 and the diaphragm 152B. Since in the prior art the portions which corresponded to the valve units V21 and V22 were constituted by independent open/close valves, the portions which corresponded to the conduits L20 and L21 were constituted by conduits. By comparison with the structure of this type of prior art, in this preferred embodiment, since the three port two valve directional control valve assembly 15 is used, it is possible to make the dead volumes of the branch portions of the three-way branched conduit system much smaller.

Figure 12:
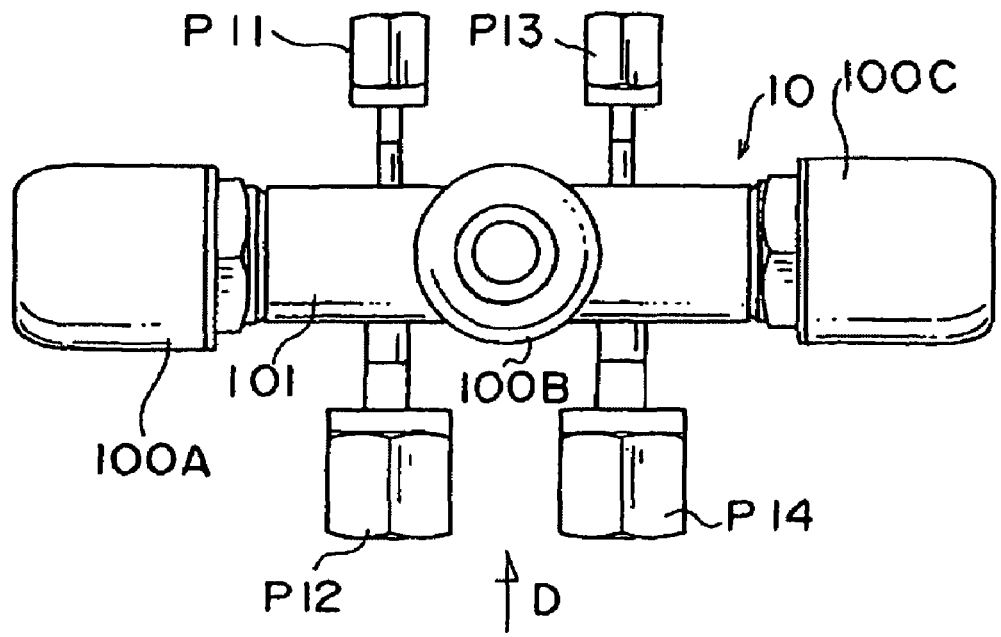
FIG. 12 is a plan view of a four port three valve directional control valve assembly 10.
Figure 13:
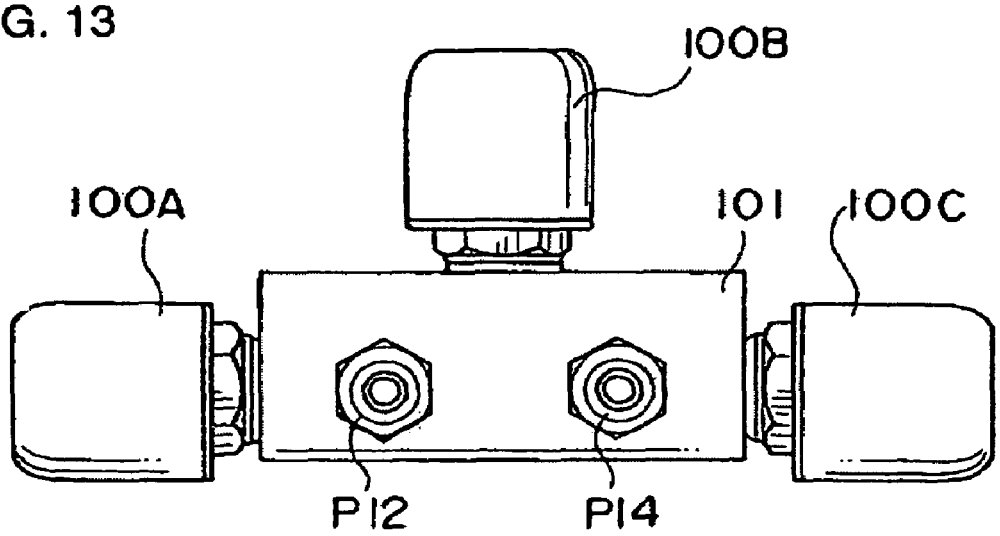
FIG. 13 is a view of this valve assembly 10 as seen in the direction shown by the arrow D in FIG. 12.
Figure 14:
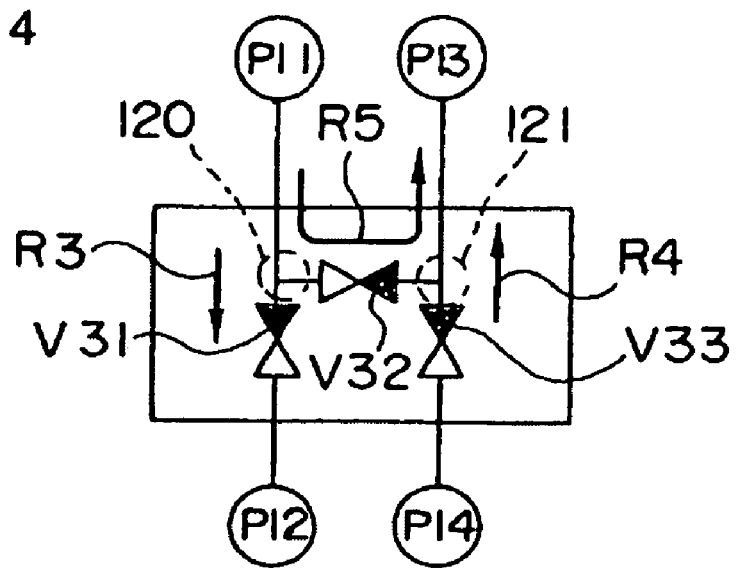
FIG. 14 is a flow diagram for this four port three valve directional control valve assembly 10.

Concrete Structural Example of the Four Port Three Valve Directional Control Valve Assemblies Next, the four port three valve directional control valve assemblies 10 (10A and 10D) will be explained. FIGS. 12 and 13 are figures showing one of these four port three valve directional control valve assemblies 10: FIG. 12 is a plan view thereof, while FIG. 13 is a view thereof as seen in the direction shown by the arrow D in FIG. 12. Four ports P11 through P14 are provided in a body 101, and the reference numerals 100A through 100C denote drive sections. FIG. 14 is a flow diagram for this four port three valve directional control valve assembly 10. The four port three valve directional control valve assembly 10 is of unitary structure, and comprises three valve units V31, V32, and V33.

Figure 15:
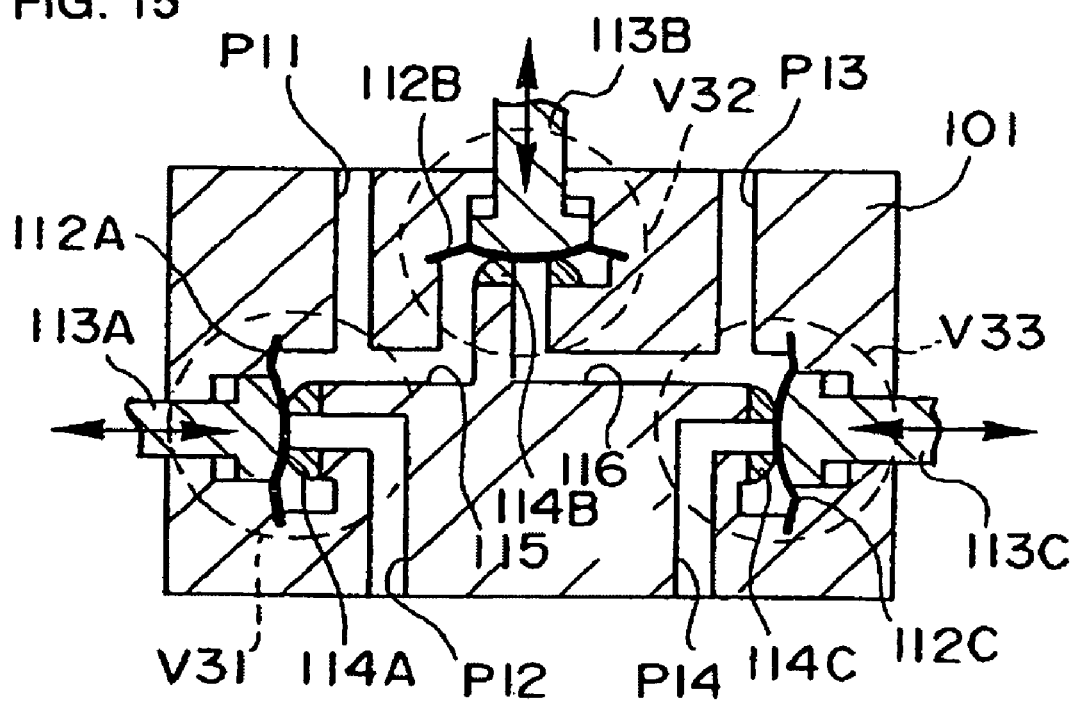
FIG. 15 is a sketch figure showing the structures within a body 101 of the four port three valve directional control valve assembly 10.

FIG. 15 is a sketch figure showing the structures within the body 101. Each of the valve units V31 through V33 has the same structure, and they compose respective diaphragms 112A, 112B, and 112C, respective pistons 113A, 113B, and 113C, and respective valve seats 114A, 114B, and 114C which are all provided within the body 101. Since the drive mechanisms for the pistons 113A through 113C in FIG. 15 are generally the same as those shown in FIG. 10 for the three port two valve directional control valve assembly 15 and described above, explanation thereof will be curtailed. In the state shown in FIG. 15, each of the diaphragms 112A through 112C is pressed by its respective piston 113A through 113C against its respective valve seat 114A through 114C. As a result, all of the valve units V31 through V33 are in their closed states.

When the piston 113A is driven in the leftwards direction as seen in the figure from the state shown in FIG. 15, the corresponding diaphragm 112A is removed away from its valve seat 114A, and the ports P11 and P12 are communicated with one another. Furthermore, when the piston 113C is driven in the rightwards direction as seen in the figure from the state shown in FIG. 15, the corresponding diaphragm 112C is removed away from its valve seat 114C, and the ports P13 and P14 are communicated with one another. Within the body 101, a conduit 115 is formed which connects to the port P11, and a conduit 116 is formed which connects to the port P13. When the piston 113B is driven in the upwards direction as seen in the figure from the state shown in FIG. 15, the corresponding diaphragm 112B is removed away from its valve seat 114B, and the conduit 115 and the conduit 116 are connected to one another. As a result, the port P11 and the port P13 are communicated with one another.

With the liquid substance supply device shown in FIG. 2, the ports P11 are connected to connectors C on the charge gas line 5, while the ports P12 are connected to the substance container 3A and to the solvent container 3D. Furthermore, the ports P13 are connected to connectors on the transfer lines 6 (6A and 6D), while the ports P14 are connected to the substance container 3A and the solvent container 3D.

For example, when the liquid substance 4A is expelled from the substance container 3A to the transfer line 6A, as shown in FIG. 6, the valve unit V32 is closed while the valve units V31 and V33 are opened. The charge gas flows from the port P11 to the port P12 along the path R3 shown in FIGS. 6 and 14 and is conducted into the substance container 3A. The liquid substance 4A in the substance container 3A is conducted from the port P14 to the port P13, and is led into the transfer line 6A. Furthermore, during gas purging and conduit rinsing which will be described hereinafter, the valve units V31 and V33 of FIG. 14 are closed while the valve unit V32 is opened, and the charge gas or the rinsing solvent flows from the port P11 to the port P13 along the path R6.

With this four port three valve directional control valve assembly 10 as well, just as with the three port two valve directional control valve assembly 15 described above, it is possible to reduce the dead volume to a minimum. In other words, in the case of a building a circuit like that of FIG. 14 using independent open/close valves such as in the prior art, the valve units V31 through V33 are constituted by various open/close valves. In this case, since the portions shown by the reference numerals 120 and 121 in FIG. 14 are constituted as conduits, it is inevitable that the dead volume is comparatively great. On the other hand, with the preferred embodiment described above, since it is possible to minimize the volume of the conduits 115 and 116 by using the four port three valve directional control valve assemblies 10 which are of unitary structure, accordingly it becomes possible to reduce the dead volume to a minimum.

As described above, the four port three valve directional control valve assemblies 10A and 10D are provided on the sides of the substance container 3A and the solvent container 3D respectively at the respective connectors C. When supplementing further quantities of the relevant substances, each of the four port three valve directional control valve assemblies 10A and 10D and each of the containers 3A and 3D are detached as a combined unit at the connectors C. For example, in the case that the substance container 3A is to be detached at the connectors C from the charge gas line 5 and the transfer line 6A, as shown in FIG. 16, from the state shown in FIG. 6, the open/close valves V3 and V6 and the valve units V22, V31, and V33 are closed, while the open/close valves V2 and V4 and the valve units V21 and V32 are opened.

When the opened and closed states of the valves are controlled in this manner, the solvent 4D which has been expelled from the solvent container 3D into the transfer line 6D flows in order from the open/close valve V2 to the auxiliary line 12, thence to the open/close valve V4, thence to the valve unit V32, thence to the valve unit V21, and thence to the auxiliary line 11, thence to be exhausted into the drain tank 13. Due to the solvent 4D flowing along this path, the liquid substance 4A remaining within the conduit portion F1 shown in FIG. 16 by thick lines is rinsed away by the flow of this solvent 4D. The waste fluid after rinsing is exhausted via the auxiliary line 11 to the drain tank 13. It should be understood that the conduit portion F1 corresponds to the ports P11 and P13 and the conduits 115 and 116 of FIG. 15.

Figure 17:
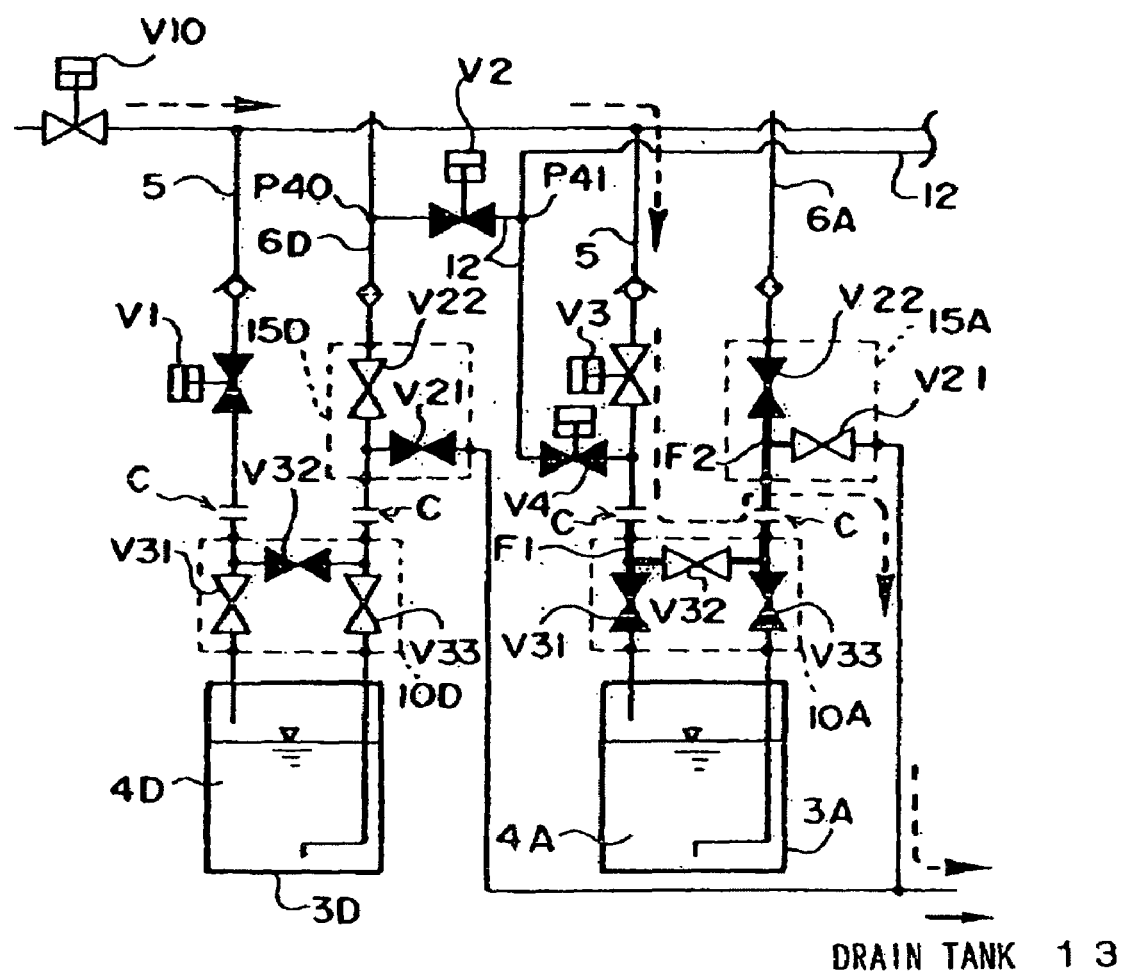
FIG. 17 is a figure showing the open and closed states of the valves during gas purging.

When the rinsing of the conduit portion F1 has been completed, the substance container 3A and the four port three valve directional control valve assembly 10A are removed from the connectors C as a unit. And, after supplementing a further quantity of the liquid substance 4A into the substance container 3A, the substance container 3A is again connected to the connectors C. It should be noted that, after the rinsing of the conduit portion F1 has been completed, furthermore, it would also be acceptable to change over the opened and closed states of the valves as shown in FIG. 17, and to purge the interior of the conduit portion F1 with charge gas, so as to eliminate the remaining solvent within the conduit F1.

Figure 16:
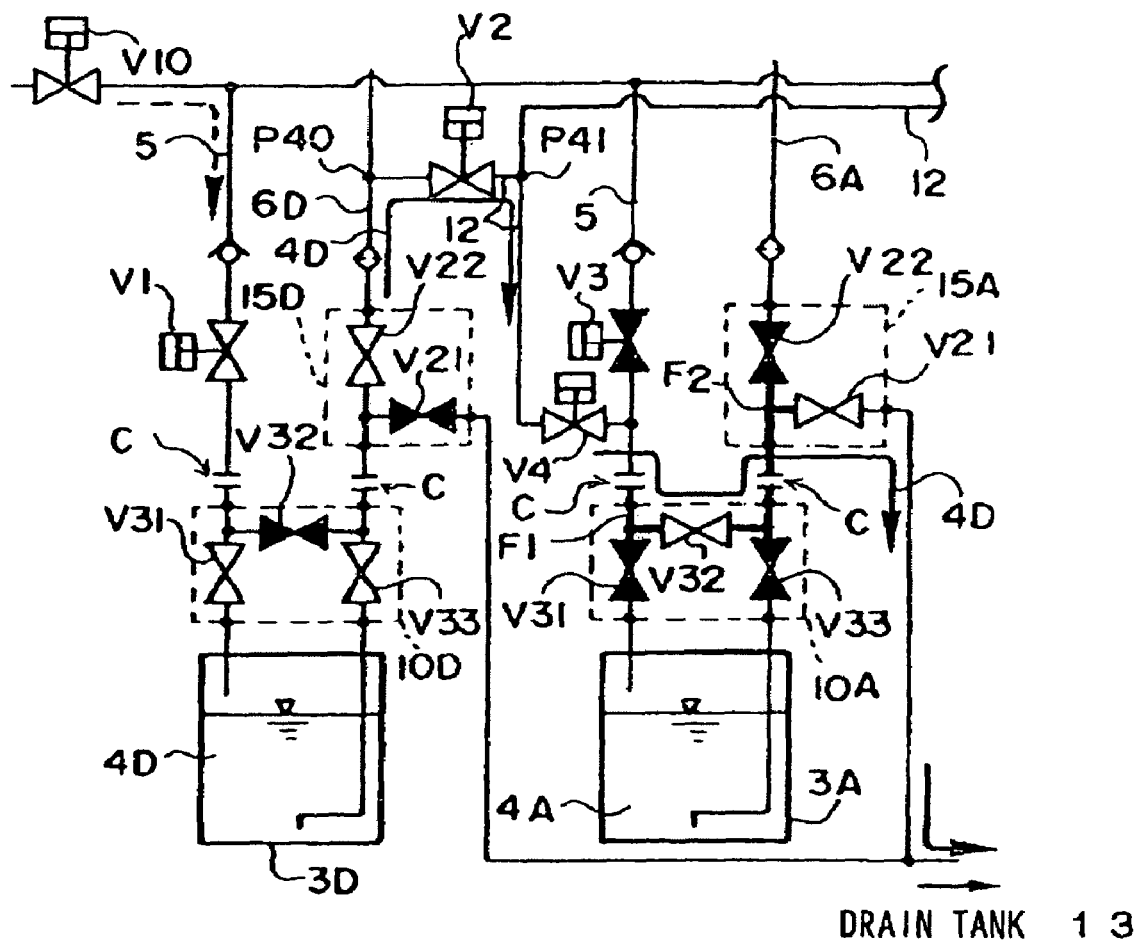
FIG. 16 is a figure showing the open and closed states of the valves during rinsing.

By making the substance container 3A and the four port three valve directional control valve assembly 10A as a unit which can be removed from the lines 5 and 6A as described above, and moreover by making the substance container 3A so that it can be removed after the conduit portion F1 has been rinsed as shown in FIG. 16, it is ensured that no liquid substance remains within the conduit portion F1, which is the portion which is in contact with the atmosphere. As a result, even when performing the operations of attachment and detachment of the substance container 3A, it is ensured that reaction products between the liquid substance 4A and atmospheric gases do not occur in the interior of the conduit portion F1.

If a resin material is to be used for the diaphragms 152A, 152B and 112A through 112C and for the valve seats 154A, 154B and 114A through 114C of the three port two valve directional control valve assemblies 15A through 15D and the four port three valve directional control valve assemblies 10A through 10D, it is desirable to use PEEK (polyether ether ketone), PTFE (polytetrafluoroethylene), PI (polyimide), PBI (polybenzimidazole) or the like, which have superior heat resistance and chemical resistance. It is possible to anticipate enhanced durability by using this type of substance.

Explanation of the Rinsing Operation

Next the operation of rinsing, which is performed before starting the vaporization operation, will be explained. Herein, the operations of vacuum evacuation, gas purging, and solvent rinsing which are performed during the rinsing operation will be explained. In an actual rinsing operation, these processes are employed in various orders and combinations in order to perform rinsing of the interiors of the lines efficiently. For example, vacuum evacuation (or gas purging) and then solvent rinsing may be performed in order, or vacuum evacuation and gas purging may be performed several times in succession, and then solvent rinsing may be performed. Furthermore, after the solvent rinsing operation, it may be desirable to perform gas purging in order to eliminate remaining rinsing liquid left over from the rinsing operation.

(1) Vacuum Evacuation

Figure 18:
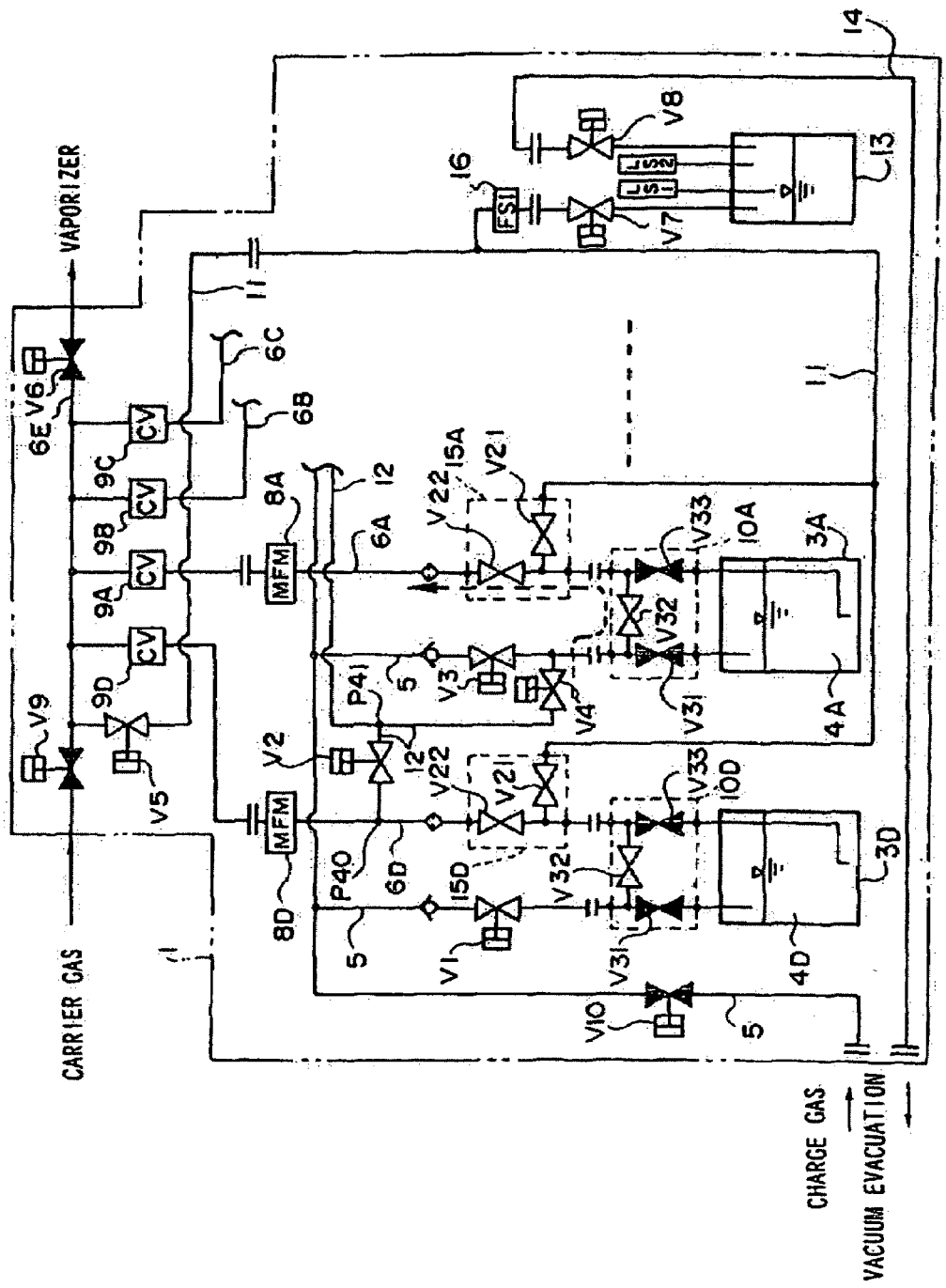
FIG. 18 is a figure showing the open and closed states of the valves during vacuum evacuation.

First, the operation of vacuum evacuation of the transfer lines 6A through 6D and of the auxiliary lines 11 and 12 using the evacuation line 14 will be explained. FIG. 18 is a figure showing the open and closed states of the valves during vacuum evacuation. The open/close valves V6, V9, and V10 and the valve units V31 and V33 of the four port three valve directional control valve assemblies 10A and 10D are put into the closed state, while the other valves are put into the open state. When the opening and closing of the various valves is controlled in this manner, the charge gas line 5, the transfer lines 6A through 6D, and the auxiliary lines 11 and 12 are evacuated to vacuum via the vacuum evacuation line 14 by a vacuum evacuation device not shown in the figures.

(2) Gas Purging

Figure 19:
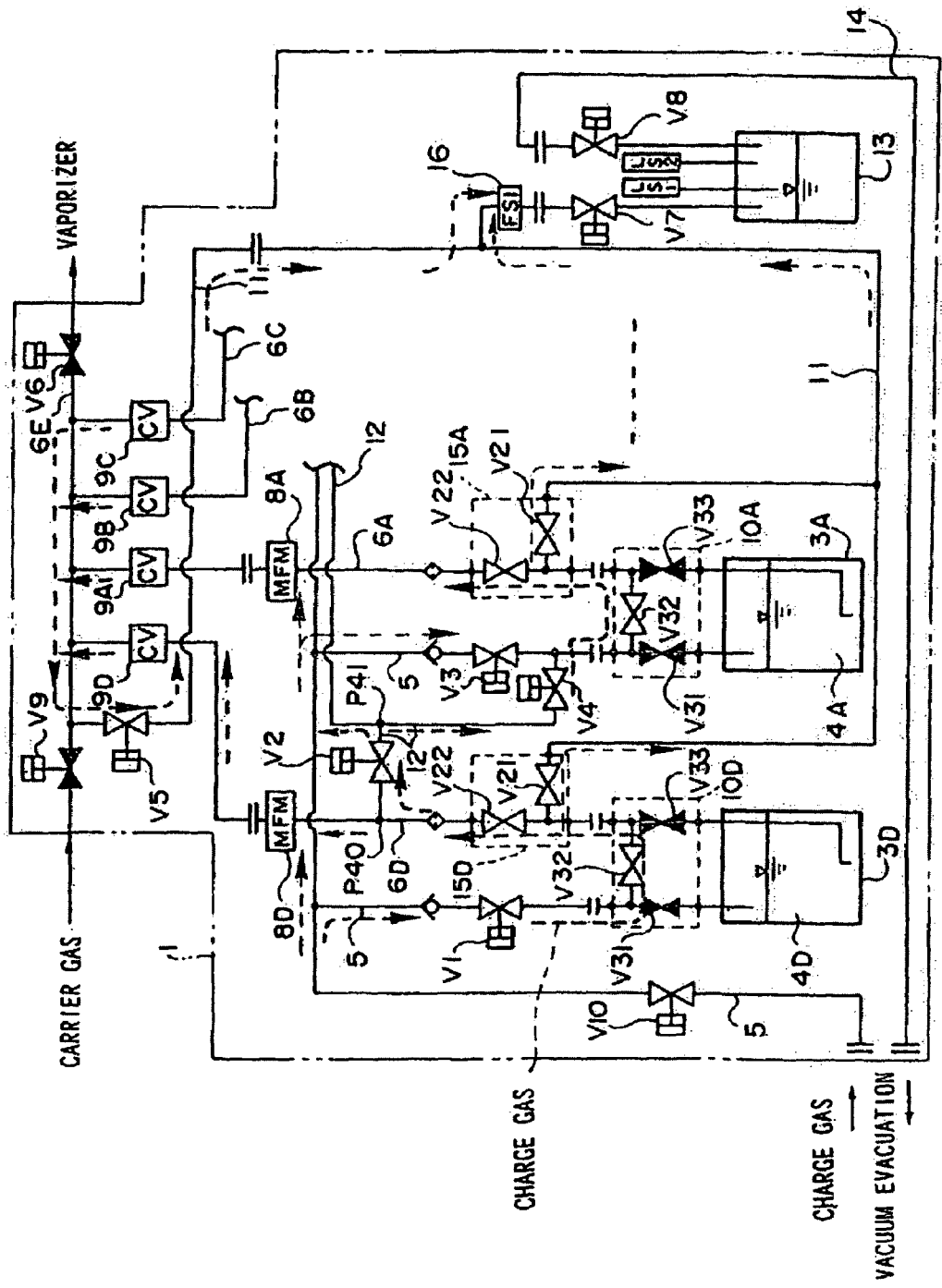
FIG. 19 is a figure showing the open and closed states of the valves during gas purging.

FIG. 19 is a figure showing the open and closed states of the valves during gas purging. In FIG. 19, the open/close valve V10 of FIG. 18 is changed over from the closed state to the opened state. As shown by the broken line in the figure, the charge gas flows into the charge gas line 5, the transfer lines 6A through 6D, and the auxiliary lines 11 and 12, and is exhausted to the drain tank 13 which is connected to the vacuum evacuation line 14.

(3) Solvent Rinsing

Figure 20:
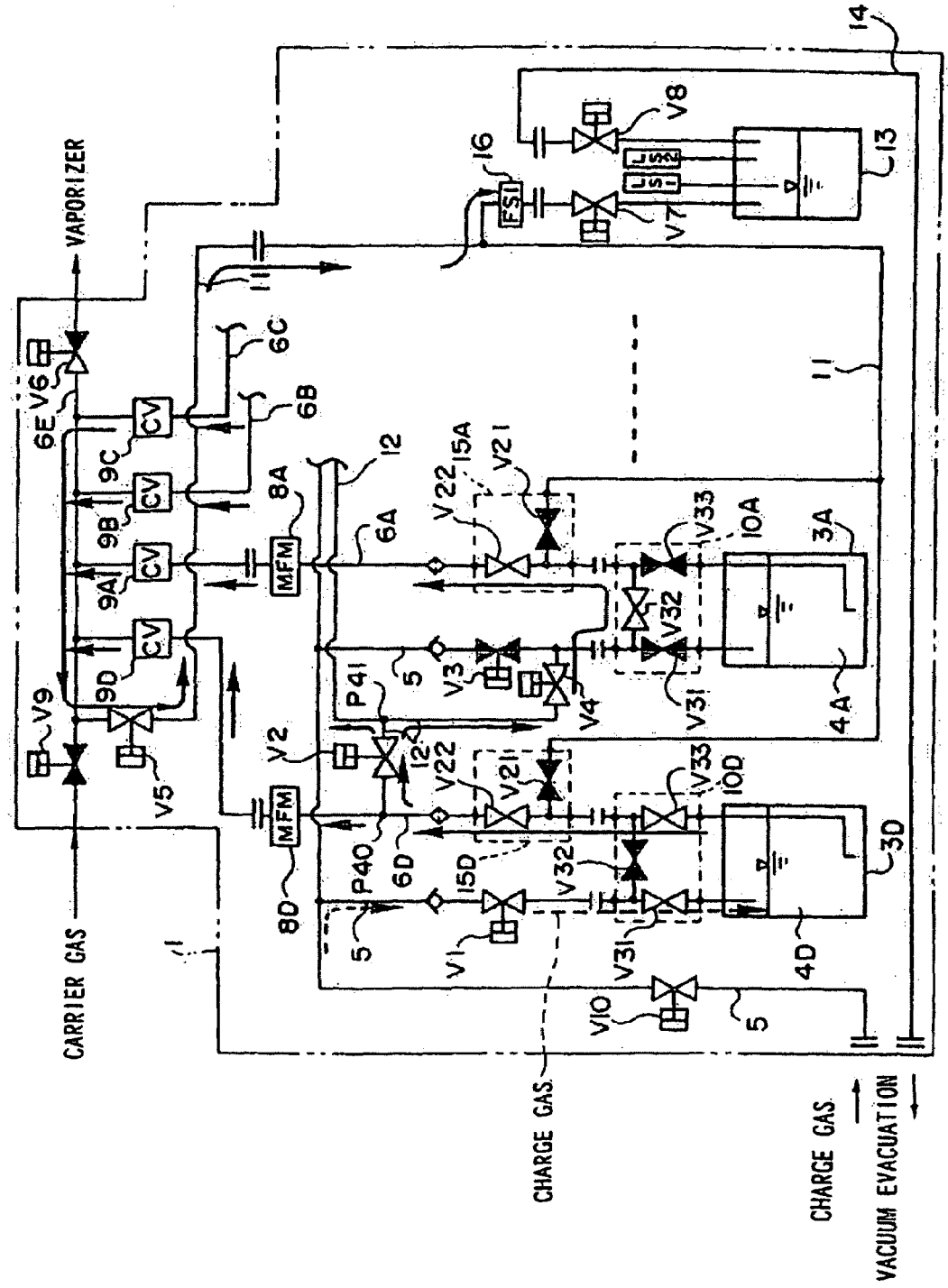
FIG. 20 is a figure showing the open and closed states of the valves during solvent rinsing.

FIG. 20 is a figure showing the open and closed states of the valves during solvent cleansing. In this process, rinsing of the conduits is performed using the solvent 4D in the solvent container 3D. The open/close valve V3, the valve units V21 of the three port two valve directional control valve assemblies 15A and 15D, and the valve units V32 of the four port three valve directional control valve assembly 10D are changed over from the open state to the closed state. And the valve units V31 and V33 of the four port three valve directional control valve assembly 10D are changed over from the closed state to the opened state.

Pressurized charge gas from the charge gas line 5 is supplied into the solvent container 3D, and the solvent 4D in this solvent container 3D is expelled towards the transfer line 6D. The solvent 4D which is expelled into the transfer line 6D is divided, at the branch point P40, so as to flow through said transfer line 6D in the direction to the flow rate control valve 9D at the upper portion of the figure, and also so as to flow via the open/close valve V2 into the auxiliary line 12.

The solvent 4D which has flowed into the auxiliary line 12 from the branch point P40 is again divided into two portions at the branch point P41. The portion of the flow which is branched at the branch point P41 in the downward direction as seen in the figure flows in order to the open/close valve V4, thence to the valve unit V32 of the four port three valve directional control valve assembly 10A, thence to the valve unit V22 of the three port two valve directional control valve assembly 15A, and thence into the transfer line 6A, and is conducted in the transfer line 6A in the direction of the flow rate control valve 9A.

On the other hand, the portion of the flow of the solvent 4D which is branched at the branch point P41 in the upward direction as seen in the figure is conducted towards the substance container 3B via the auxiliary line 12. For the substance containers 3B and 3C as well, there are provided conduit systems which are the same as the conduit system for the substance container 3A—in detail, there are provided in these systems elements which are analogous to the auxiliary line 12 shown on the right side of the open/close valve V2 in the figure, the charge gas line 5, the transfer line 6A, the auxiliary line 11, the valves which are disposed in these lines, and the like. However, in FIGS. 2 and 18, the conduit systems for the substance containers 3B and 3C are omitted. In the case of the substance containers 3B and 3C as well, just as in the case of the substance container 3A, the solvent 4D is flowed in, and is conducted within the transfer lines 6B and 6C in the directions of the flow rate control valves 9B and 9C. The flows of solvent 4D in the transfer lines 6A through 6D mix together in the transfer line 6E, and the resulting flow of solvent is stored into the drain tank 13 via the open/close valve V5 and the auxiliary line 11.

Explanation of the Fluid Substitution Operation

After the operations of vacuum evacuation, gas purging, and rinsing of the transfer lines 6A through 6D by solvent rinsing have been completed, the operation of fluid substitution is performed. By this operation of fluid substitution, the transfer lines 6A through 6C are filled up with the respective liquid substances 4A through 4C, and the transfer line 6D is filled up with the solvent 4D. It should be noted that if, after the rinsing operation has been completed, the interiors of the conduits are filled up with charge gas, an operation of "gas to liquid" substitution is performed, while, if the interiors of the conduits are filled up with the solvent 4D, an operation of "liquid to liquid" substitution is performed.

Figure 21:
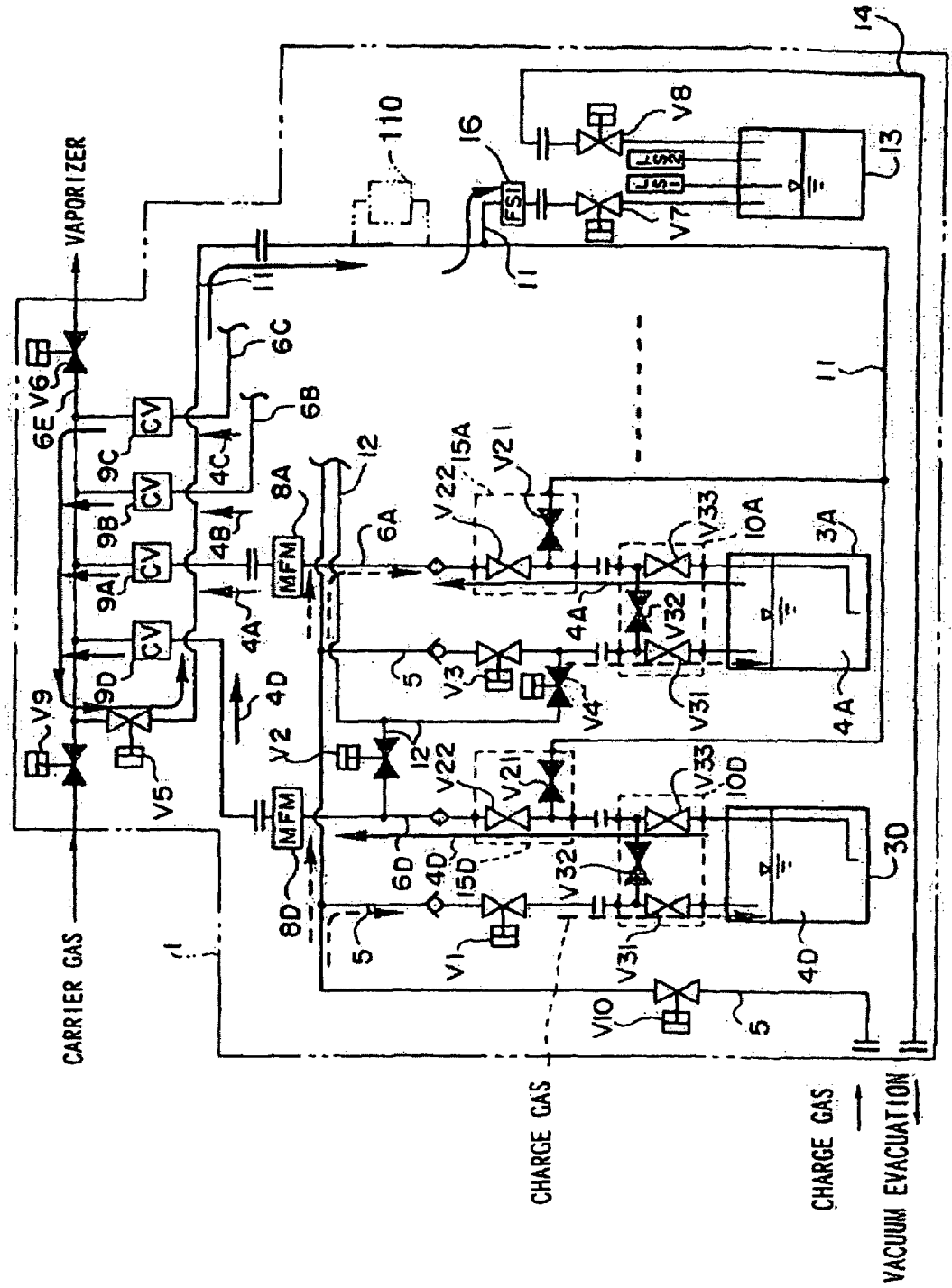
FIG. 21 is a figure showing the open and closed states of the valves during fluid substitution.

FIG. 21 is a figure showing the open and closed states of the valves during fluid substitution. The open/close valves V1, V3, V5, V7, V8, and V10, the valve units V22 of the three port two valve directional control valve assemblies 15A and 15D, and the valve units V31 and V33 of the four port three valve directional control valve assemblies 10A and 10D are put into their open states. On the other hand, the open/close valves V2, V4, V6, and V9, the valve units V21 of the three port two valve directional control valve assemblies 15A and 15D, and the valve units V32 of the four port three valve directional control valve assemblies 10A and 10D are put into their closed states.

The substance in the interiors of the transfer lines 6A through 6C, i.e. charge gas or rinse liquid (the solvent 4D), is replaced by the respective liquid substances 4A through 4C. Within the transfer line 6D, the charge gas or the rinse liquid is replaced by the solvent 4D. The liquid substances 4A through 4C and the solvent 4D which are supplied into the transfer line 6E from the transfer lines 6A through 6D are mixed together in the transfer line 6E. These liquid substances are exhausted in this mixed state via the open/close valve V5 and the auxiliary line 11 into the drain tank 13.

Figure 22:
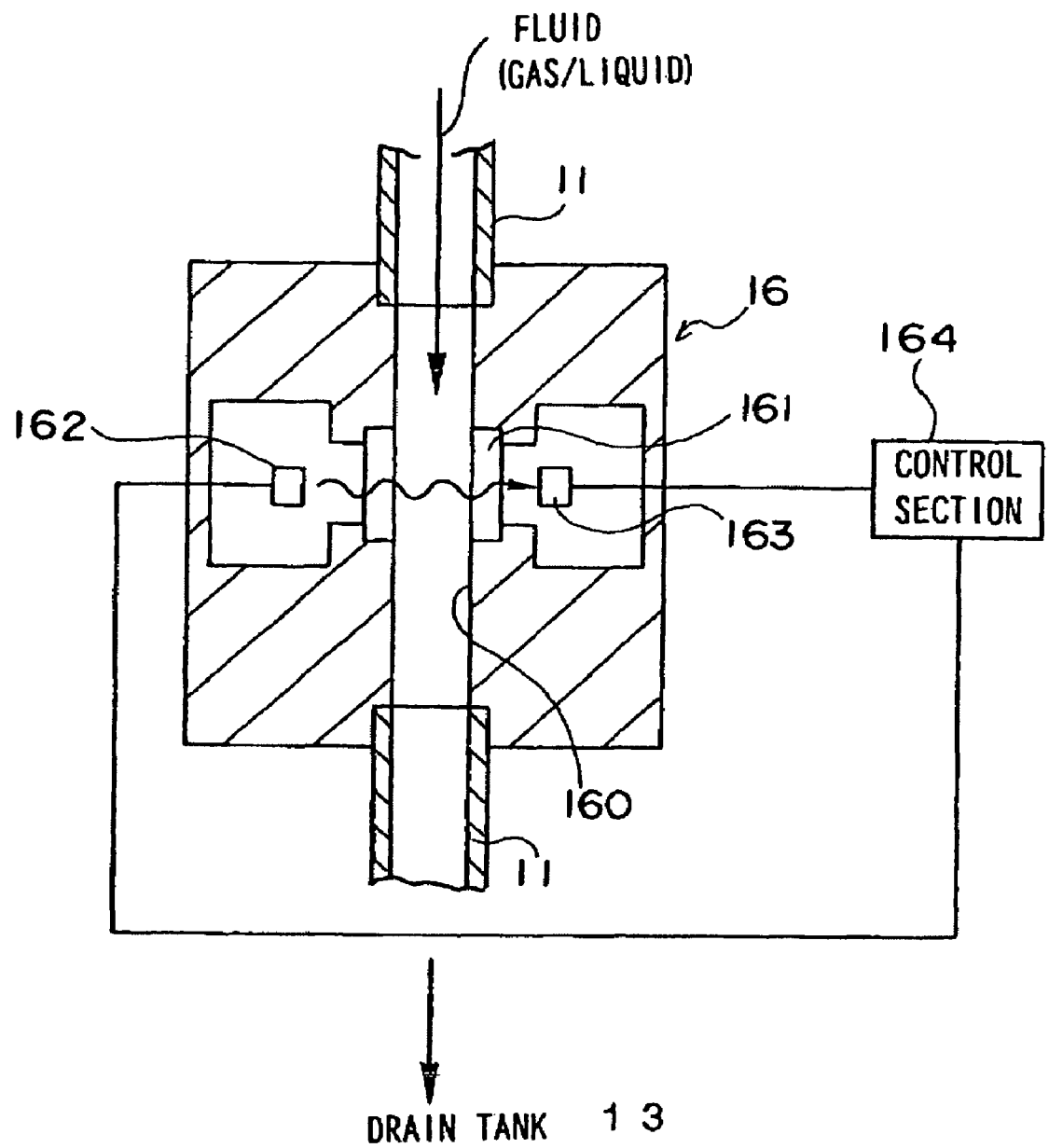
FIG. 22 is a general figure showing an observation device 16.

During this substitution operation, by using an observation device 16, it is possible to observe whether or not all of the charge gas or rinsing liquid in the conduits has been replaced by the liquid substances 4A through 4C and the solvent 4D. FIG. 22 is a general figure showing this observation device 16. A conduit 160 which is formed within the observation device 16 is connected midway in the auxiliary line 11. The liquid (charge gas or a liquid substance 4A through 4C) which has flowed into the observation device 16 from the auxiliary line portion 11 connected to the upper side thereof in the figure is conducted through the conduit 160 and then flows into the auxiliary line portion 11 which is connected to the lower side of the observation device 16 in the figure.

The light-transparent windows 161, which are made from a substance which is transparent to light such as glass, are provided midway along the conduit 160. A light emitting element 162 and a light receiving element 163 are provided within the observation device 16, confronting one another on opposite sides of the portion of the conduit 160 in which the windows 161 are provided, and these elements are controlled by a control section 164. For example, a LED may be used for the light emitting element 162, while a photodiode or a phototransistor or the like may be used for the light receiving element 163.

Since the proportion of light which gets through a mixture of the liquid substances 4A through 4C and the solvent 4D flowing in the conduit 160 is lower, by comparison to the case in which charge gas or the solvent 4D is flowing therein, therefore the amount of light received in the former case by the light receiving element 163 is also lower. A suitable standard amount W3 of received light is set which satisfies the relation W1>W3>W2, where W1 is the amount of light which is received when solvent 4D or charge gas is flowing in the conduit 160, and W2 is the amount of light which is received when a mixture of the liquid substances 4A through 4C and the solvent 4D is flowing in the conduit 160. If the amount W of received light changes from being greater than or equal to W3 to being less than W3, then the control section 164 determines that the "gas to liquid" or "liquid to liquid" substitution in the transfer lines 6A through 6D has been completely finished, and accordingly the substitution operation is terminated. When the substitution operation is terminated, the open and closed states of the various valves are changed over to those shown in FIG. 6, and the vaporization process is commenced.

It should be noted that, although in the above example the observation device 16 which was employed during liquid substitution for checking the progress of the substitution operation was provided in the auxiliary line 11, it would also be possible, for example, to determine upon the generation of bubbles or the presence or absence of liquid by providing observation devices 16 in the transfer lines 6A through 6D. Furthermore, it would also be acceptable to provide an absorptiometric analysis device 110 such as the one disclosed in Japanese Patent Laid-Open Publication Heisei 11-345774 in the auxiliary line 11 of FIG. 21, in order thereby to evaluate deterioration of the liquid or the state of mixing.

When measuring the remaining amounts of the liquid substances 4A through 4C and of the solvent 4D in the substance containers 3A through 3C and in the solvent container 4D, normal fluid surface sensors cannot be employed, from the point of view of chemical resistance. In this connection, in the preferred embodiment described above, it is arranged to determine these remaining amounts by calculating the product of time and the flow rates measured by the mass flow meters 9A through 9D. Furthermore, it would also be possible to determine the amounts of remaining liquid in the containers 3A through 3D from the change of pressure of the pressurization gas (the charge gas) in said containers.

Figure 23:
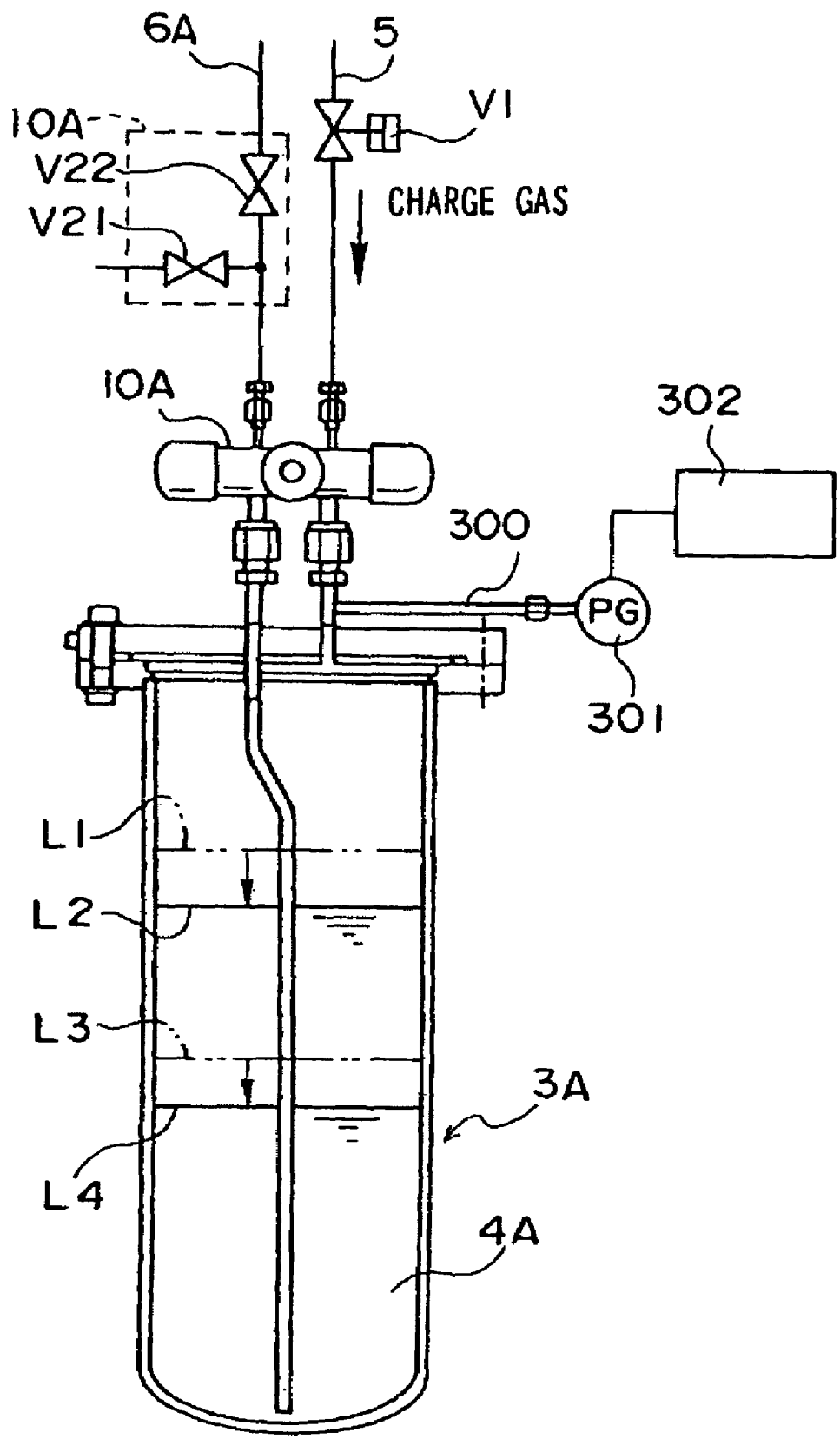
FIG. 23 is a sectional view of a substance container 3A.

FIG. 23 is a sectional view showing the detailed structure of the substance container 3A of FIG. 2. A gas pressure gauge 301 is connected to a conduit 300 on the charge gas line side of this substance container 3A. A remaining quantity measurement device 302 calculates the quantity of liquid which remains in the substance container 3A, based upon the change of pressure detected by the pressure gauge 301. When measuring this remaining quantity, the open/close valve V1 is closed after the pressurized charge gas has been supplied into the substance container 3A, and the change of pressure while a predetermined amount of the liquid substance 4A is outputted or while a predetermined time elapses is measured by the pressure gauge 301. The amount which is outputted from the substance container 3A at this time is measured by the mass flow meter 8A shown in FIG. 21.

In this connection, if the case when the level of the surface of the liquid changes from L1 to L2 and the case when the level of the surface of the liquid changes from L3 to L4 are compared, the amount by which the pressure in the container 3A changes is different, even though the same amount of the liquid substance 4A is outputted. For example, the pressure change in the case when the level of the surface of the liquid changes from L1 to L2 is greater than the pressure change when the level of the surface of the liquid changes from L3 to L4. The relationship between the amount of remaining liquid and the change of pressure is stored in advance in the remaining quantity measurement device 302, and it calculates the quantity of remaining liquid based upon this relationship and the change of pressure detected by the pressure gauge 301. The relationship may be stored as expressions.

Figure 24:
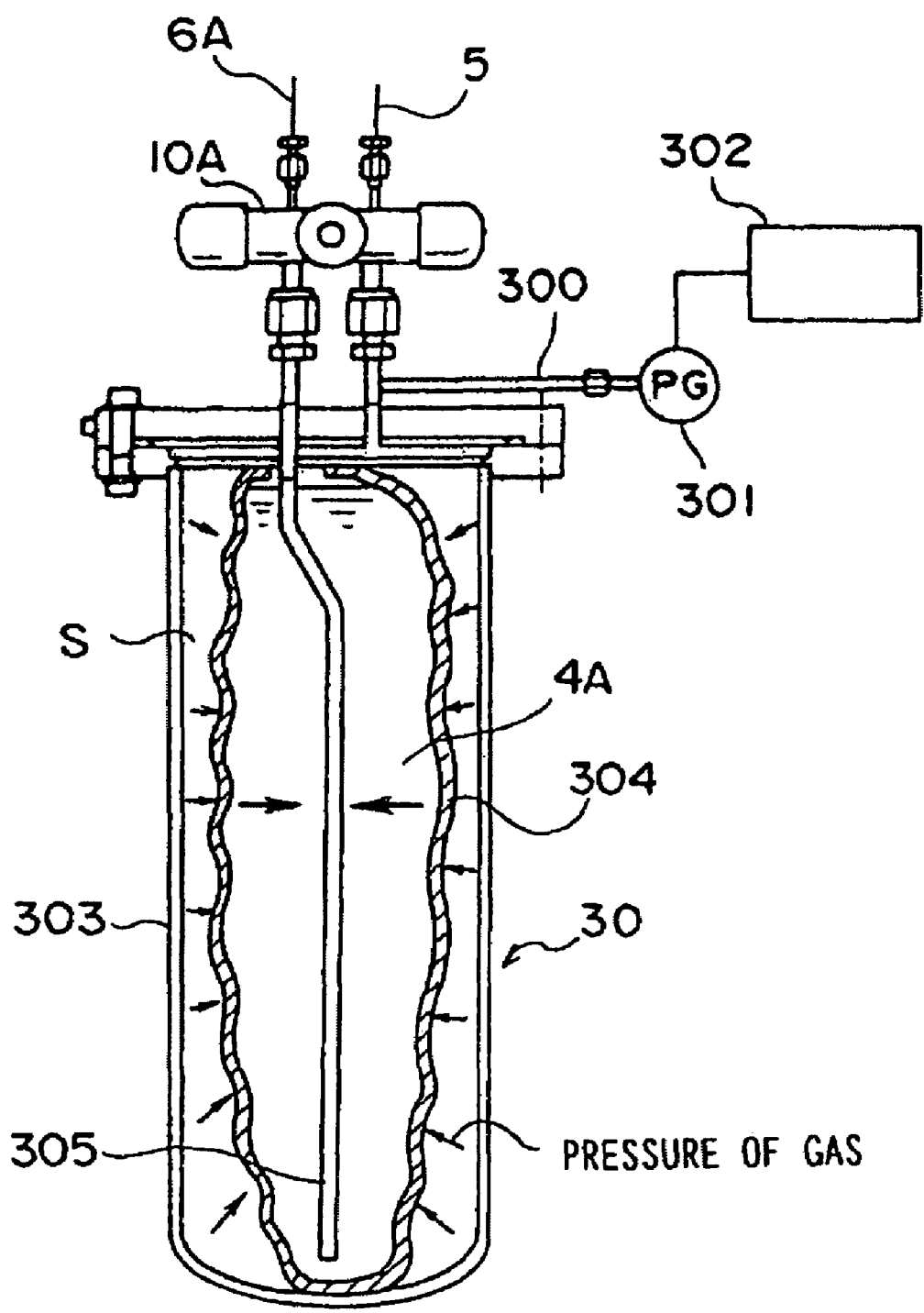
FIG. 24 is a sectional view showing a first variant embodiment of this substance container.
Figure 25:
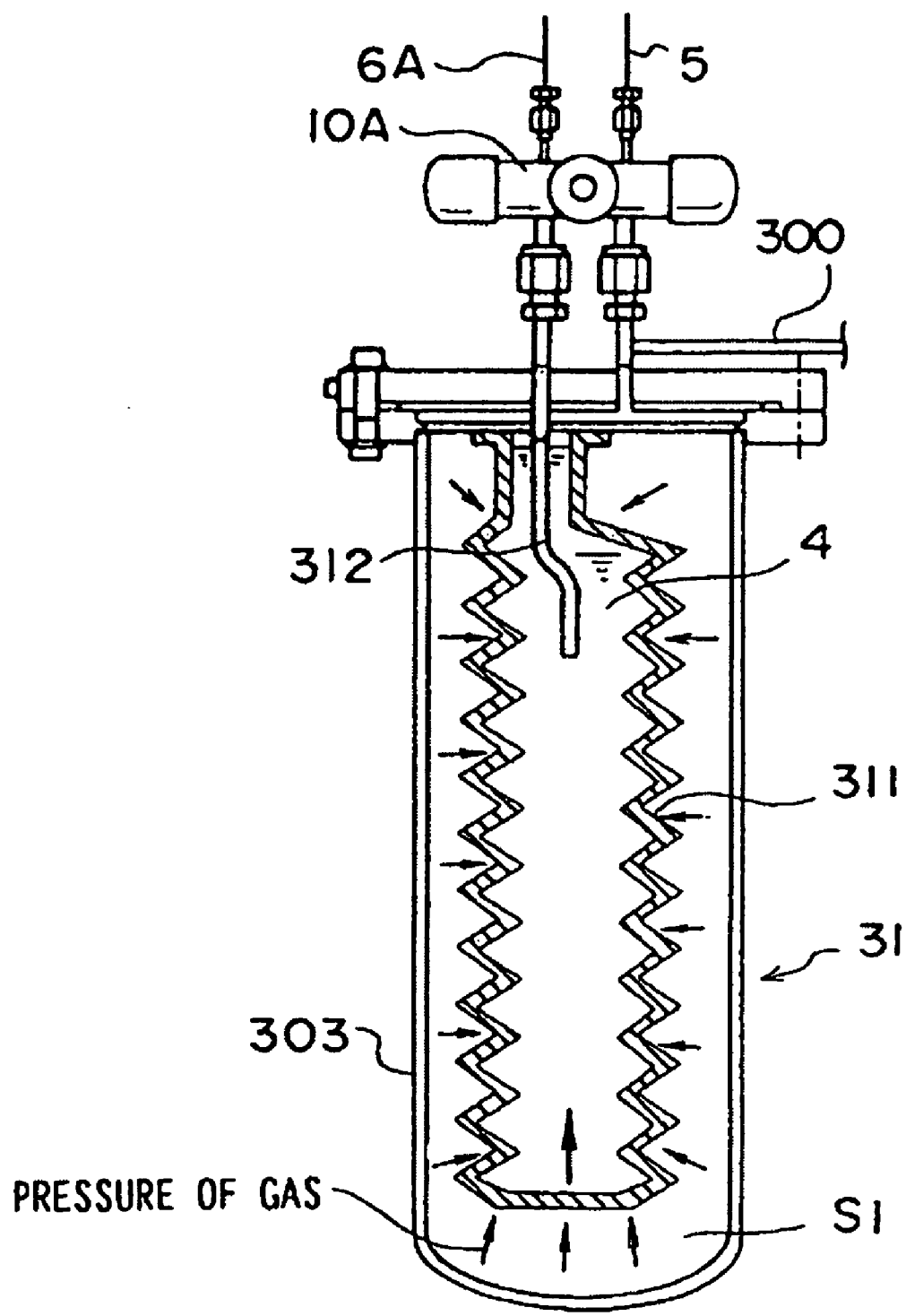
FIG. 25 is a sectional view showing a second variant embodiment of this substance container.

In the exemplary construction for the substance container 3A shown in FIG. 23, the pressurized charge gas is conducted into the substance container 3A to pressurize the liquid substance 4A which is charged therein, and the liquid substance 4A is expelled into the transfer line 6A by the pressure of this charge gas. Since the pressurized charge gas comes into direct contact with the surface of the liquid, it is easy for the charge gas to become dissolved in the liquid substance 4A. As a result, it is easy for the charge gas to come out again in the transfer line 6A to generate bubbles. FIGS. 24 and 25 show variant possibilities for the substance container 3A which can reduce the quantity of gas dissolved in this manner.

FIG. 24 is a sectional view showing a first variant embodiment of the substance container, while FIG. 25 is a sectional view showing a second variant embodiment thereof. The container 30 according to the first variant embodiment shown in FIG. 24 is of double structure, and comprises an outer casing 303 and an inner bag 304. The inner bag 304, which is housed in the interior of the outer casing 303 and is gas-tight, may be made from a chemical resistant substance such as PTFE or the like. The bottom portion of the inner bag 304 is fixed to the outer casing 303. The liquid substance 4A is charged into the inner bag 304, and the space S between the inner bag 304 and the outer casing 303 receives the pressurized charge gas via the charge gas line 5. When the inner bag 304 is thus squeezed in the horizontal direction as seen in the figure by the pressure of the charge gas, the liquid substance 4A in said inner bag 304 is expelled towards the transfer line 6A via the conduit 305 and the four port three valve directional control valve assembly 10A.

The container 31 according to the second variant embodiment shown in FIG. 25 comprises an outer casing 303 and, housed therein, instead of the inner bag 304 of the FIG. 24 variant container 30, a bellows 311 which is made of metal such as stainless steel (SUS) or PTFE. The charge gas is fed into the space S between the bellows 311 and the casing 303, and the bellows 311 is squeezed in the upwards direction in the figure by the pressure of this charge gas. As a result, the liquid substance 4A charged into said bellows 311 is expelled towards the transfer line 6A via the conduit 312 and the four port three valve directional control valve assembly 10A. In this manner, with these two variant embodiments of the container 30 and 31, the liquid substance 4A is charged into the inner bag 304 or into the bellows 311, and accordingly it does not come into contact with the charge gas in the container. As a result, it is possible to prevent any moisture component which the charge gas may contain from being absorbed by the liquid substance 4A.

Figure 26:
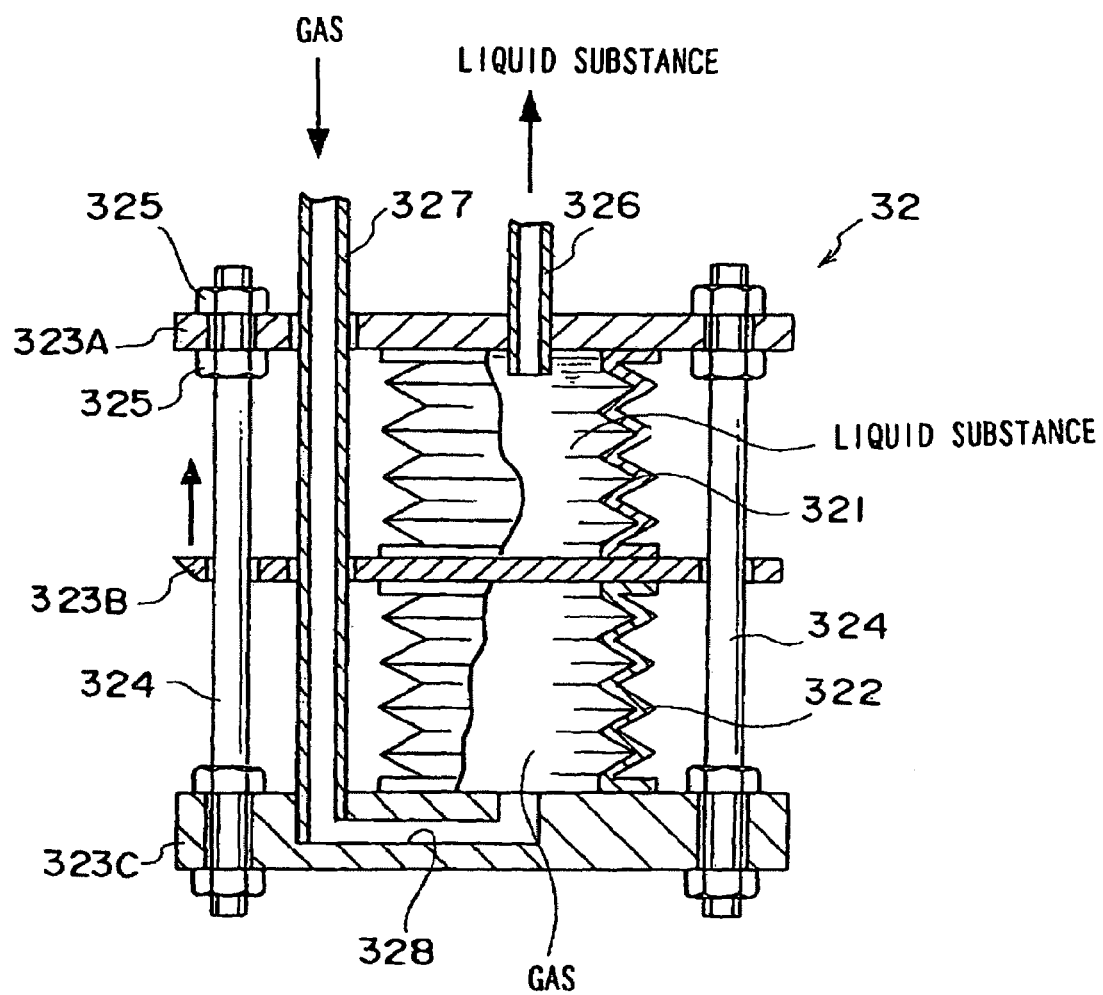
FIG. 26 is a sectional view showing a third variant embodiment of this substance container.

FIG. 26 is a sectional view showing a third variant embodiment of the substance container. This substance container comprises two bellows 321 and 322. The upper and lower ends of the upper bellows 321 are respectively fixed to an upper side plate 323A and a movable plate 323B. Moreover, the upper and lower ends of the lower bellows 322 are respectively fixed to the movable plate 323B and a lower side plate 323C. The upper side plate 323A and the lower side plate 323C are connected together by rods 324 and nuts 325, and thereby a certain predetermined gap is maintained between said upper side place 323A and said lower side plate 323C.

A conduit 326 is provided so as to pierce through the upper side plate 323A. The liquid substance 4A is charged into the interior of the upper bellows 321, and is exhausted therefrom, via this conduit 326. On the other hand, the charge gas is supplied to the interior of the lower bellows 322 via a conduit 327 and a conduit 328 which is formed in the lower side plate 323C. The conduit 327 passes through the upper plate 323A and the movable plate 323B, while it is fixed to the lower side plate 323C. It should be understood that the conduits 326 and 327 are connected to the four port three valve directional control valve assembly 10A, described above.

When in the state shown in FIG. 26 charge gas is again supplied to the interior of the lower bellows 322, the bellows 322 is distended in the vertical direction and pushes the movable plate 323B in the upwards direction in the figure. As a result, the upper bellows 321 is squeezed in the vertical direction, and the liquid substance 4A charged into it is expelled via the conduit 326 towards the transfer line. It is possible to determine the amount of the liquid substance 4A in the upper bellows 321 from the position in the vertical direction of the movable plate 323B.

For the material from which the bellows 321 is manufactured, a metal which has excellent resistance such as stainless steel (SUS), or a composite resin material such as PTFE or the like, may be used. Furthermore although, in the example shown in FIG. 26, the bellows 321 for the liquid substance was squeezed by the supply of charge gas to the interior of the lower bellows 322, it would also be acceptable to squeeze the upper bellows 321 in the vertical direction by using an air cylinder or a pantograph mechanism.

Explanation of the Vaporizer 2

Figure 27:
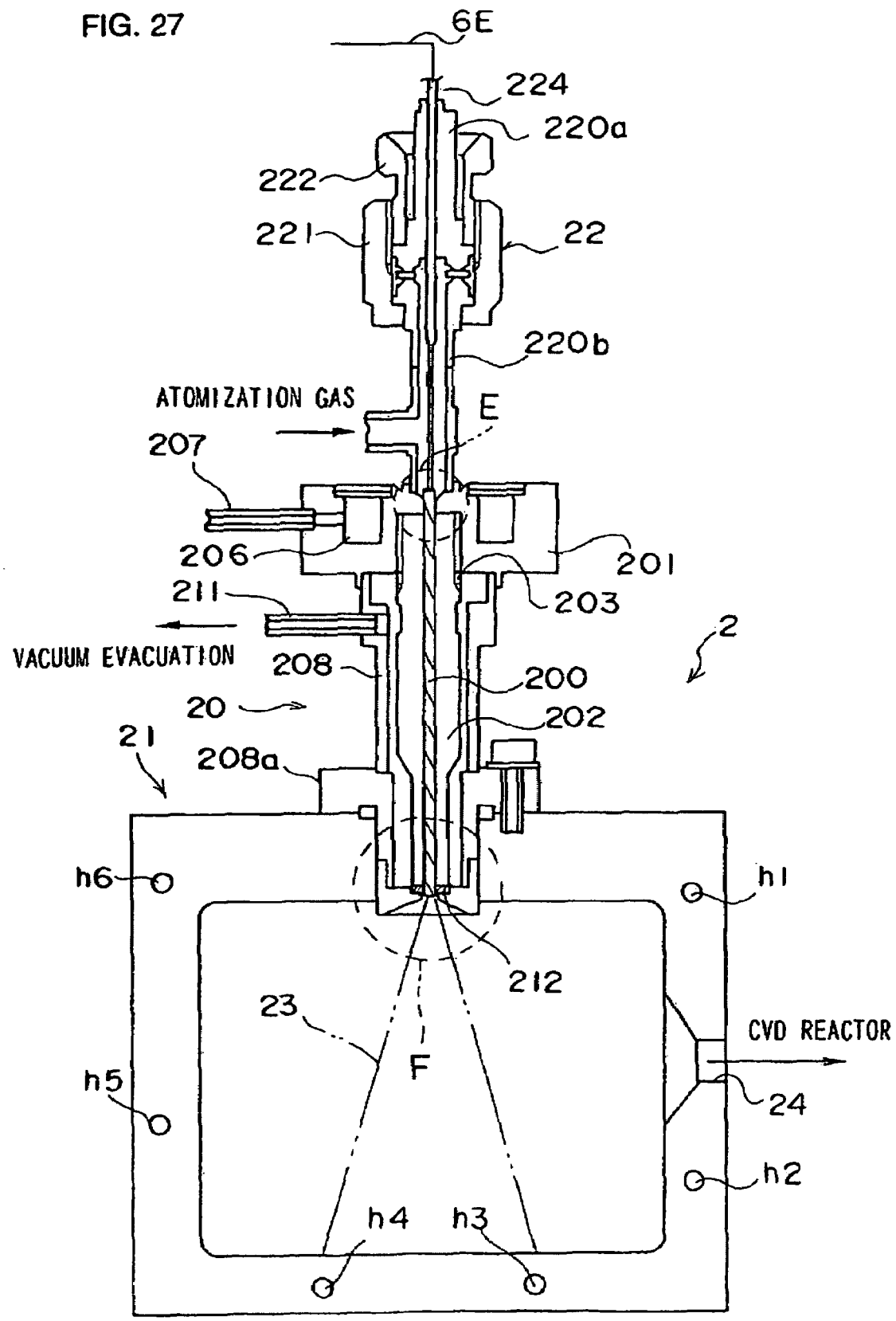
FIG. 27 is a sectional view of a vaporizer 2.

FIG. 27 is a sectional view of the vaporizer 2. This vaporizer 2 comprises a nozzle section 20 and a vaporization chamber 21. The liquid substances 4A through 4C are sprayed in from the nozzle section 20 in the form of a fine mist. These liquid substances which have been sprayed into the vaporization chamber 21 from the nozzle section 20 are then vaporized therein. The liquid mixture of the liquid substances 4A through 4C which has flowed in from the transfer line 6E and the carrier gas which has flowed in from the carrier gas line 7 is supplied into a double conduit 200 which is provided in the nozzle section 20. Since this carrier gas is used for atomizing the liquid substances 4A through 4C, it will hereinafter be termed the atomization gas.

Heaters h1 through h6 for heating are provided in the vaporization chamber 21, and the vaporization chamber 21 is maintained at a temperature which is higher than the vaporization temperature of the liquid substances 4A through 4C by these heaters. The liquid substances 4A through 4C which have been sprayed into the interior of the vaporization chamber 21 from the nozzle section 20 in the vertically downward direction in the figure, as shown by the double dotted lines, are vaporized therein. The vaporized liquid substances are supplied via an exhaust aperture 24 to a CVD reactor not shown in the figures.

Figure 28:
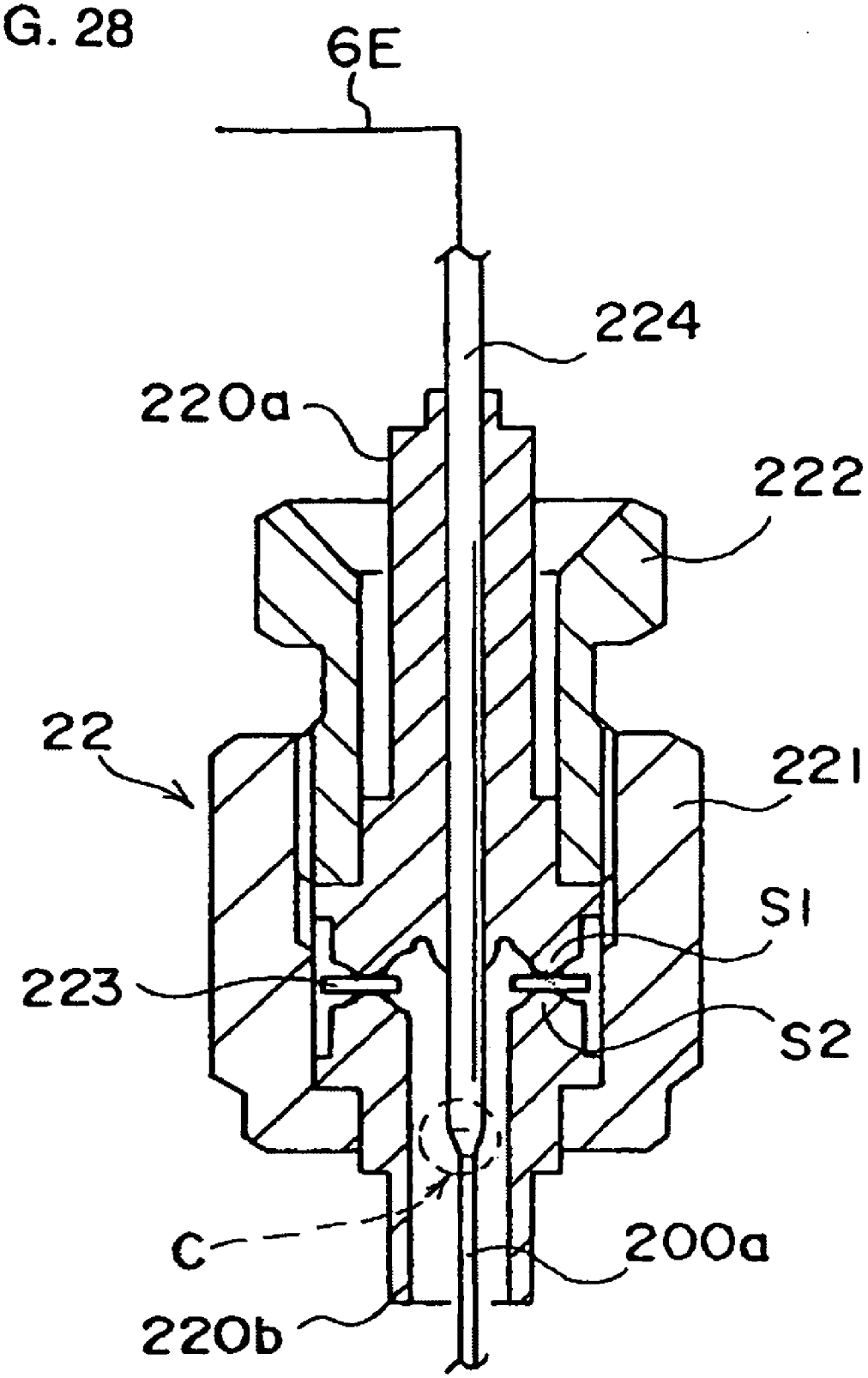
FIG. 28 is an enlarged view of a portion of a coupling 22.

The transfer line 6E is connected to the nozzle section 20 of the vaporizer 2 by a coupling 22. FIG. 28 is an enlarged view of a portion of this coupling 22. This coupling 22 comprises a pair of sleeves 220a and 220b, a nut 221, a plug 222, and a metal gasket 223. A conduit 224 from the transfer line 6E is arranged so as to pierce through the sleeve 220a in its axial direction, and is fixed to the sleeve 220a by welding or the like. The mutually opposing faces of the two sleeves 220a and 220b are respectively formed with seal faces S1 and S2 each of which projects axially as a ring shape. The metal gasket 223 is provided between these seal faces S1 and S2, and, when the plug 222 is screwed into the nut 221, the conduit 224 is fixed to the nozzle section 20. 1/16 inch stainless steel (SUS) pipe is used for the conduit 224, and at its portion denoted by C in the figure it is formed by swaging into a thin tube of less than or equal to 1 mm in outer diameter. As a result, the mixed gas and liquid flow of liquid metal substances and carrier gas is smoothed, and it is possible very greatly to reduce the dead volume, which could otherwise be the cause of blockages of the liquid metal substance flow or of substance degeneration. With regard to the diametrical dimension of this thin tube portion, it should be set to the most suitable value in consideration of the flow rate and so on. In the following discussion, the thin tube portion which extends below the symbol C in the figure will be termed the internal conduit 200a.

Figure 30:
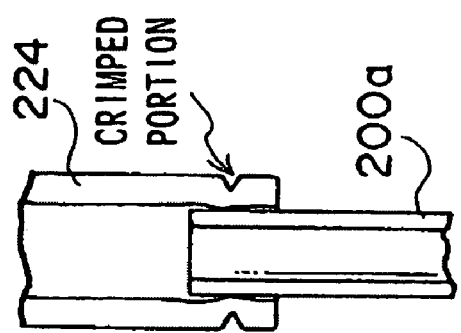
Figure 29:
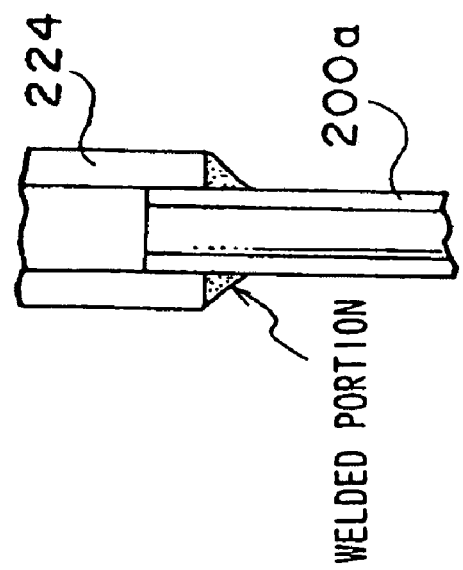

In the examples shown in FIGS. 27 and 28 the internal conduit 200a was made by squeezing down the conduit 224 from the transfer line 6E by swaging and by processing it into a thin tube whose outer diameter is less than or equal to 1 mm, but in the variant examples shown in FIGS. 29 and 30 the conduit 224 and the internal conduit 200a are made as separate conduit members, and they are joined together. In the case shown in FIG. 29, the construction is implemented by inserting the upper tip portion of the internal conduit 200a into the conduit 224 and welding it therein. In the case shown in FIG. 30, the construction is implemented by inserting the upper tip portion of the internal conduit 200a into the conduit 224 and crimping the outer surface of said conduit 224. Both of these manufacturing methods are characterized by low cost.

Figure 31:
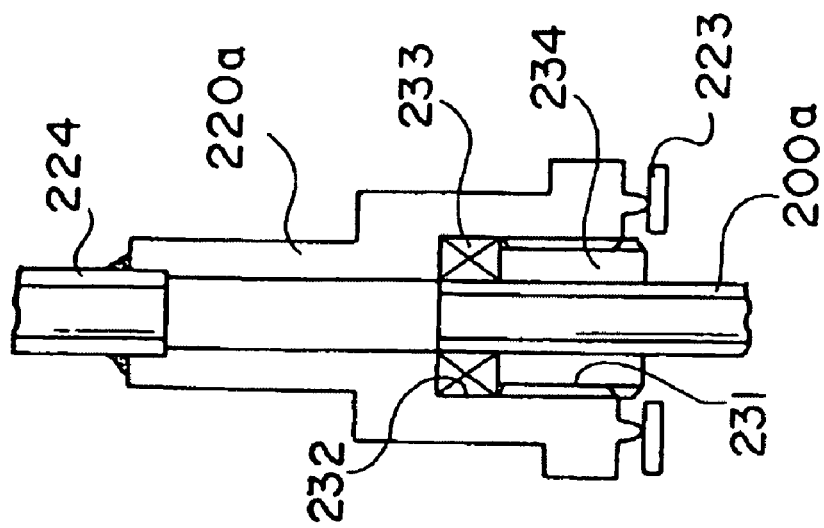

In the further variant shown in FIG. 31, the conduit 224 and the internal conduit 200a are connected together by taking advantage of the coupling 22. The conduit 224 is fixed to the upper end portion of the sleeve 220a by welding or the like. A tubular hole 232 which has a threaded portion 231 is formed in the sleeve 220a. A ring shaped seal member 233 which is made of PTFE is fitted around the outer periphery of the tip portion of the internal conduit 200a, and this internal conduit 200a is inserted into the tubular hole 232 of the sleeve 220a. A set screw 234 which is fitted over the internal conduit 200a is screwed into the threaded portion 231 of the tubular hole 232, and the seal member 233 provides a seal between the outer peripheral surface of the internal conduit 200a and the inner peripheral surface of the tubular hole 232. In this case, along with the cost being comparatively low, there is also the advantage that it is possible easily to change just the internal conduit 200a by itself which is particularly liable to blockage.

Figure 32:
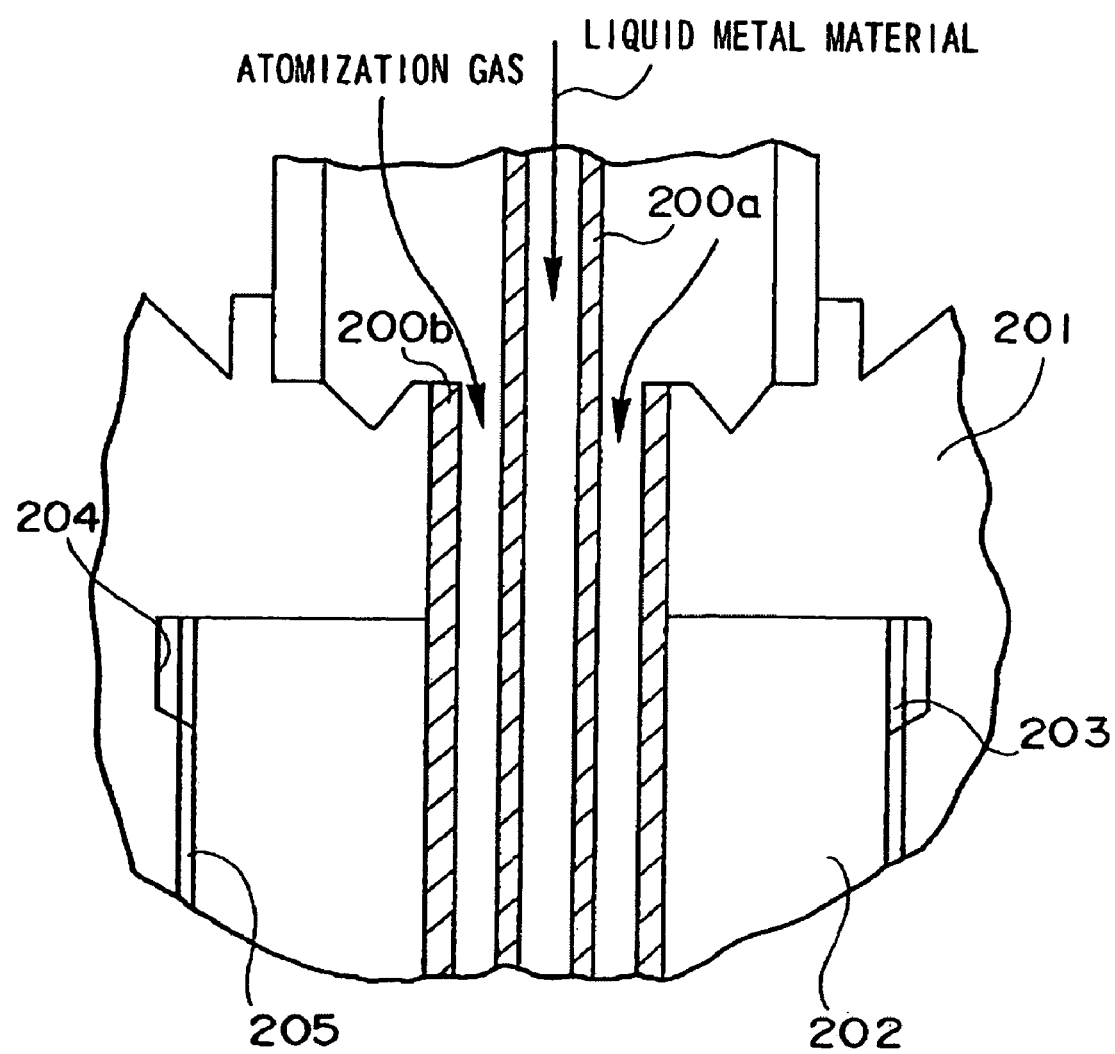
FIG. 32 is an enlarged view showing the portion E of FIG. 27.

FIG. 32 is an enlarged view showing the portion E of FIG. 27. The double conduit 200 is made up of the internal conduit 200a and an external conduit 200b. A gas-liquid mass made up from the liquid substances 4A through 4C and the carrier gas flows through the internal conduit 200a, while the atomization gas flows through the annular space between the internal conduit 200a and the external conduit 200b. The external conduit 200b is fixed to a water cooling block 201 by welding or the like. The internal conduit 200a is fixed to the sleeve 220a described above. A cooling rod 202 is provided around the double conduit 200 in contact with its external conduit 200b. As shown in FIG. 27, the end portion of the cooling rod 202 extends downwards as far as the lower end portion of the double conduit 200.

A male threaded portion 203 is formed at the upper end of the outer peripheral surface of the cooling rod 202. When this male threaded portion 203 of the cooling rod 202 is connected to a female threaded portion 205 which is formed in a concave portion 204 of the water cooling block 201, the cooling rod 202 is fixed to the water cooling block 201. As shown in FIG. 27, a cooling water conduit 206 is formed in the water cooling block 201, and cooling water which is supplied from externally via a cooling water pipe 207 circulates through this cooling water conduit 206 and cools the water cooling block 201. The cooling rod 202 is cooled by the water cooling block 201, and furthermore the cooling rod 202 cools the double conduit 200.

A casing 208 which surrounds the outer peripheral surface of the cooling rod 202 is provided at the lower portion of the water cooling block 201 as seen in FIG. 27. A fixing flange 208a is formed upon the lower portion of the casing 208. The nozzle section 20 is attached to the vaporization chamber 21 by this flange 208a being fixed to the vaporization chamber 21. It should be understood that, although in this preferred embodiment of the present invention the water cooling block 201 and the cooling rod 202 are formed as separate parts and are screwed together, it would also be acceptable, as an alternative, to form them as one unit. Furthermore, a substance whose heat transmission is good, such as copper, may be used as the material for the cooling rod 202.

Figure 33:
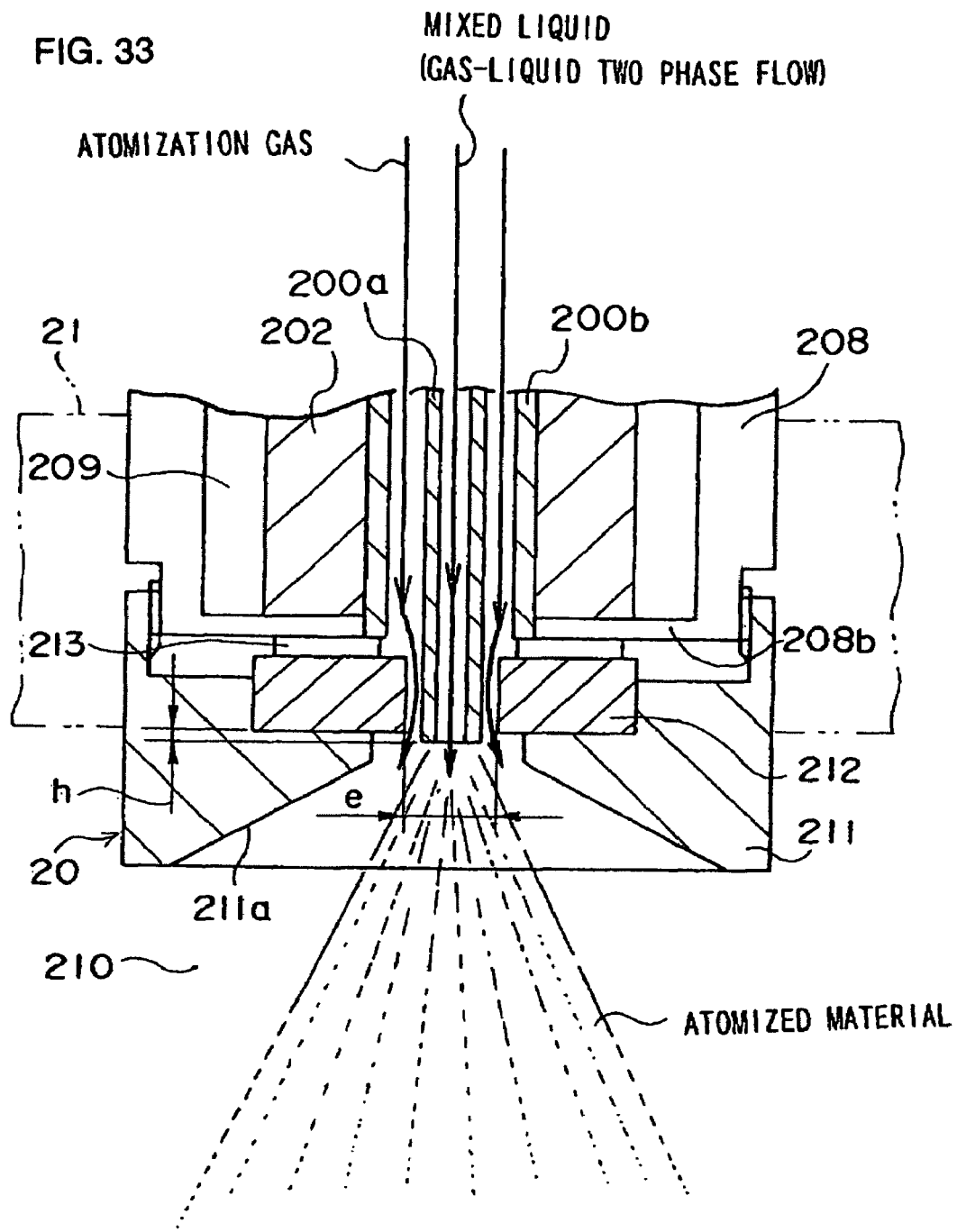
FIG. 33 is a enlarged view showing the portion F of FIG. 27.

FIG. 33 is a enlarged view showing the portion F of FIG. 27. An end portion 208b of the casing 208 is made to be thin, and is connected to the end portion of the external conduit 200b by welding or the like. As a result, a heat insulating space 209 in the interior of the casing 208 and a vaporization chamber space 210 are separated from one another, which prevents the cooling rod 202 from being corroded by the vaporization gas. As shown in FIG. 27, it is arranged for the insulating space 209 to be evacuated via a pipe 208P. By evacuating the insulating space 209, transfer of heat from the casing 208 to the cooling rod 202 due to convection is prevented.

The internal conduit 200a projects more in the downward direction in the figure than does the external conduit 200b, and furthermore passes through a hole which is formed in the central portion of an orifice member 212 and projects therefrom. The atomization gas which has flowed in the downwards direction in the figure between the internal conduit 200a and the external conduit 200b passes through a minute gap which is defined between the orifice member 212 and the internal conduit 200a and is spouted into the vaporization chamber space 210. This gap may, for example, be set to a very small dimension of 1 mm or less. When the liquid substances 4A through 4C are injected from the internal conduit 200a, they are atomized by this atomization gas, and the liquid substance in the form of mist is sprayed in the vaporization chamber space 210.

With the vaporizer of this preferred embodiment, it is desirable to set the end of the internal conduit 200a to a state as somewhat projecting in the downwards direction from the orifice member 212. Adjustment of this amount of projection h is performed by varying the tightening force of the coupling 22 shown in FIG. 28. In concrete terms, the dimensions in the axial direction of the internal conduit 200a are set so that the end of said internal conduit 200a is at almost the same position in the downwards direction as the lower surface of the orifice member when attaching the coupling 22 with the screwing force which is required for sealing against the metal seal, and the minute adjustment of the projection amount h is performed by re-screwing of the coupling 22.

The orifice member 212 is fixed to the casing end portion 208b by a nozzle ring 211. A seal member 213 is provided between the orifice member 212 and the casing end portion 208b. A vaporization surface 211a of conical form is defined upon the nozzle ring 211, which is fitted to the end of the casing 208 like a box nut. This nozzle ring 211 is for preventing the liquid substances 4A through 4C which have been sprayed from the nozzle section 20 from re-condensing upon the end portion of said nozzle section 20, and it is kept at a high temperature by heat which is conducted to it via the flange 208a (refer to FIG. 27) which is fixed to the vaporization chamber 21. As a result, no non-vaporized residue are generated, even if the atomized liquid substances 4A through 4C adhere to the vaporization surface 211a.

The above described casing 208, nozzle ring 211, conduits 200a and 200b etc. are made from stainless steel (SUS) or the like, in view of corrosion resistance and so on. On the other hand, the orifice member 212 and the seal member 213 may be made from resin or a similar material whose heat insulating qualities are good, so as to diminish heat transfer from the nozzle ring 211 to the cooling rod 202. In particular, since the orifice member 212 and the seal member 213 are required to have good chemical resistance with respect to the liquid substances 4A through 4C, it is desirable for them to be formed from PTFE (polytetrafluoroethylene) whose heat insulating properties, thermal resistance, and chemical resistance are excellent. Furthermore, it would also be acceptable to form the orifice member 212 from PEEK (polyether ether ketone) whose hardness is greater, in order to prevent deformation due to the high temperature environment or due to screwing the nozzle ring 211.

In this manner, rise of temperature of the cooling rod 202 is prevented by forming the orifice member 212 or the seal member 213 from an insulating material, so as to reduce transfer of heat from the nozzle ring 212 to the cooling rod 202.

Explanation of the Cooling Benefit Obtained from the Cooling Rod 202

When vaporizing the liquid substances 4A through 4C with the vaporizer, it is necessary to prevent the generation of non-vaporized residue and degradation of the liquid substances 4A through 4C due to heat history. To this end, it is necessary to subject the liquid substances 4A through 4C to low pressure and increased temperature substantially simultaneously and moreover instantaneously. In this preferred embodiment, the cooling rod 202 is arranged to enclose the outer periphery of the double conduit 200, and moreover the cooling rod 202 is provided as extending to the vicinity of the spout portion of the double conduit 200. Due to this, the liquid substances 4A through 4C which are flowing through the internal conduit 200a are sufficiently cooled until immediately before being spouted into the vaporization chamber space 210.

The cooling rod 202 only comes into contact with the very thin end portion 208b of the casing 208, and the insulating space 209 is formed between the cooling rod 202 and the casing 208. Since the orifice member 212 and the seal member 213 which have excellent insulating performance are interposed between the casing 208 and the nozzle ring 211 which is at high temperature, it is possible to reduce the transfer of heat to the cooling rod 202 from the vaporization chamber 21 or the nozzle ring 211 which are at high temperature.

Figure 34:
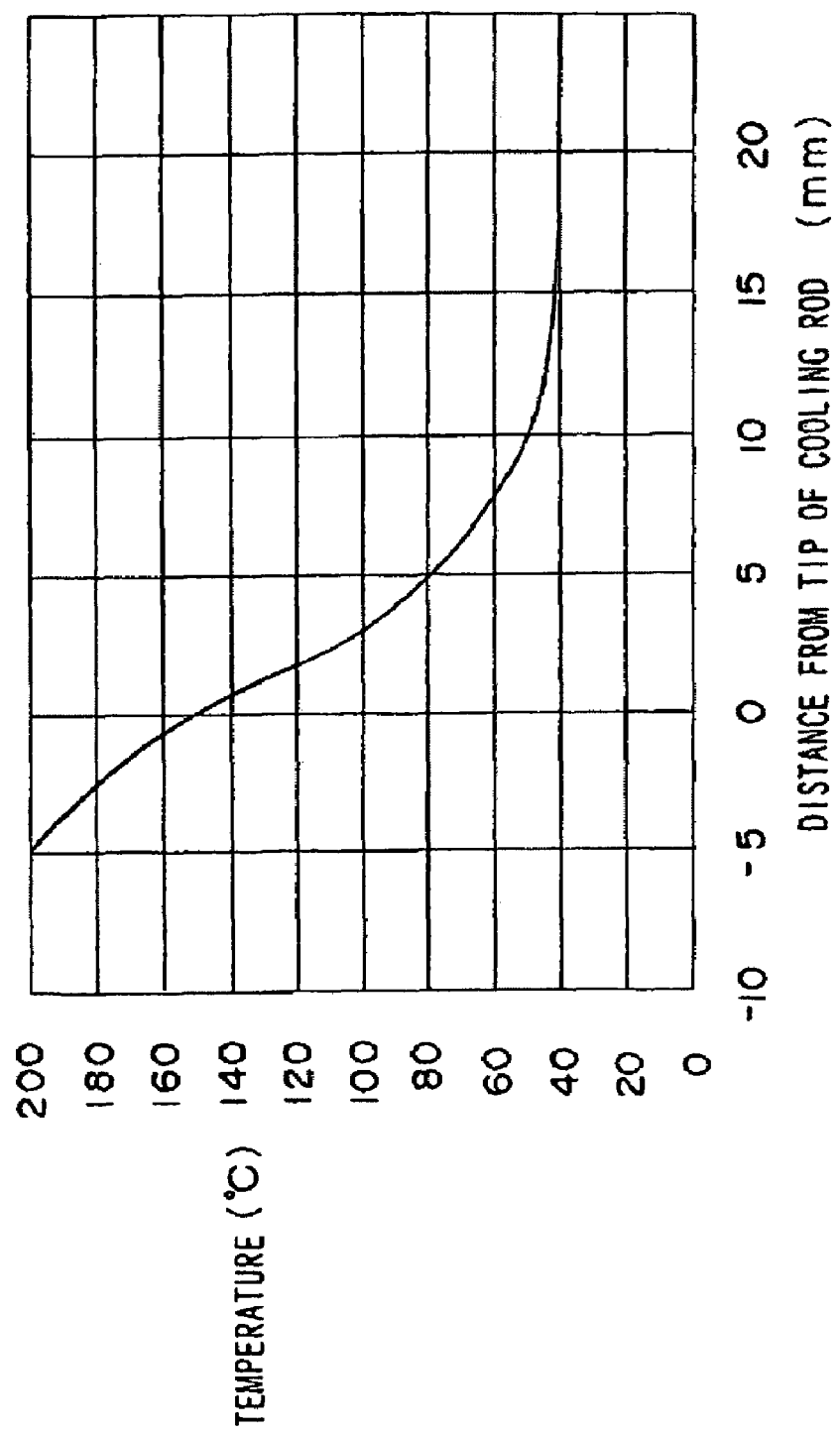

FIG. 34 is a figure showing the temperature distribution in the axial direction within the internal conduit 200a when the vaporization chamber 21 was heated up to 250 degrees C. The temperature of the cooling water was 8 degrees C., and the pressure within the insulating space 209 was 1333 Pa (=10 Torr). In FIG. 34, the temperature of the internal conduit 200a is shown along the vertical axis, while the distance from the end of the cooling rod 202 measured in the upward direction in the figure is shown along the horizontal axis. The portion of this figure in which the distance along the horizontal axis is negative is a portion relating to the case when the internal conduit 200a is projecting downwards from the end of the cooling rod 202. As shown in FIG. 34, even in an environment at a high temperature such as 250 degrees C., the internal conduit 200a is maintained at a sufficiently low temperature, due to the effect of cooling by the cooling rod 202. For example, the portion of the rod about 10 mm from its tip is at about 50 degrees C.

Figure 35:
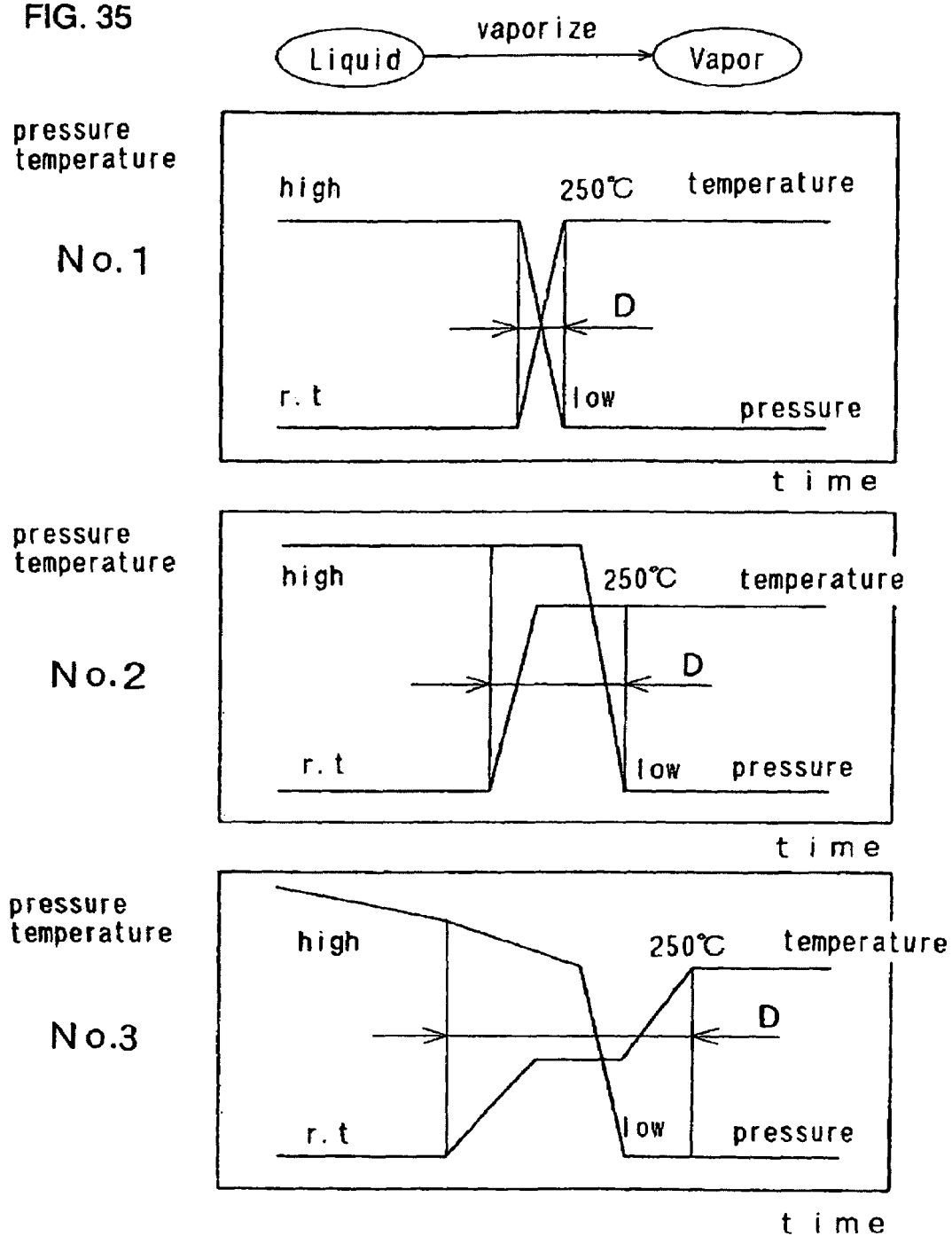
FIG. 35 is a figure qualitatively showing the changes in the temperature and the pressure of a liquid substance before and after vaporization.

FIG. 35 is a figure qualitatively showing the changes in the temperature and the pressure of one of the liquid substances before and after vaporization. Graph No. 1 at the top of this figure relates to the vaporizer of this preferred embodiment, while Graphs Nos. 2 and 3 relate to prior art type vaporizers. In the FIG. 35 graphs, temperature and pressure are shown along the vertical axes, while time is shown along the horizontal axes. Furthermore, in each graph, the temperature and the pressure in the liquid state are shown in the left side region, while the temperature and the pressure after vaporization are shown in the right side region.

The graph No. 2 of FIG. 35 shows the changes of temperature and pressure when the device described in Japanese Laid-open Patent Publication No. Heisei 5-253402 is employed. With this devices the liquid substance which is supplied by the pump to the vaporizer is subjected to a low pressure vaporization process, after having been heated up by contact with a high temperature disk provided in the vaporizer. Furthermore, the graph No. 3 of FIG. 35 shows the changes of temperature and pressure when the device described in Japanese Laid-open Patent Publication No. Heisei 8-508315 is employed. With this device, after the liquid substance has been heated up under pressure, it is soaked into a mesh which is then subjected to low pressure, whereby said liquid substance is vaporized.

Both in the case of graph No. 2 of FIG. 35 and also in the case of graph No. 3, the intermediate state D, when the state of the liquid substance changes from the room temperature high pressure state to the high temperature low pressure state, is continued for a comparatively long time period. In this intermediate state D, the liquid substance can easily be degraded due to heat history, and the generation of non-vaporized residues and of blockages in the vaporizer and so on can easily occur. On the other hand, in the case of the embodiment according to this preferred embodiment of the present invention, the intermediate state D lasts for only a short time period, as shown in graph No. 1 of FIG. 35, because the liquid substances 4A through 4C are cooled by the cooling rod 202 until directly before being spouted from the internal conduit 200a. As a result, it is possible to reduce degradation of the liquid substances 4A through 4C, non-vaporized residues, and blockages in the vaporizer and the like.

Explanation of Spray-Atomization Performance

The internal conduit 200a is made as a thin tube of outer diameter less than or equal to 1 mm, and the flow rate of the liquid substances 4A through 4C and the carrier gas in this internal conduit 200a is adjusted so that the two phase gas/liquid flow in the conduit becomes a ring shaped (annular) spray flow. By a ring shaped spray flow is meant, that the flow rate of the gas phase in this two phase gas/liquid flow is great as compared to the flow rate of the liquid phase therein, and that a liquid film is present upon the conduit wall, with a large number of accompanying liquid droplets in the gas phase flow in the central portion of the conduit as seen in its transverse cross section. It should be noted that the flow rate conditions for performing stable atomization will be described hereinafter.

Figure 36:
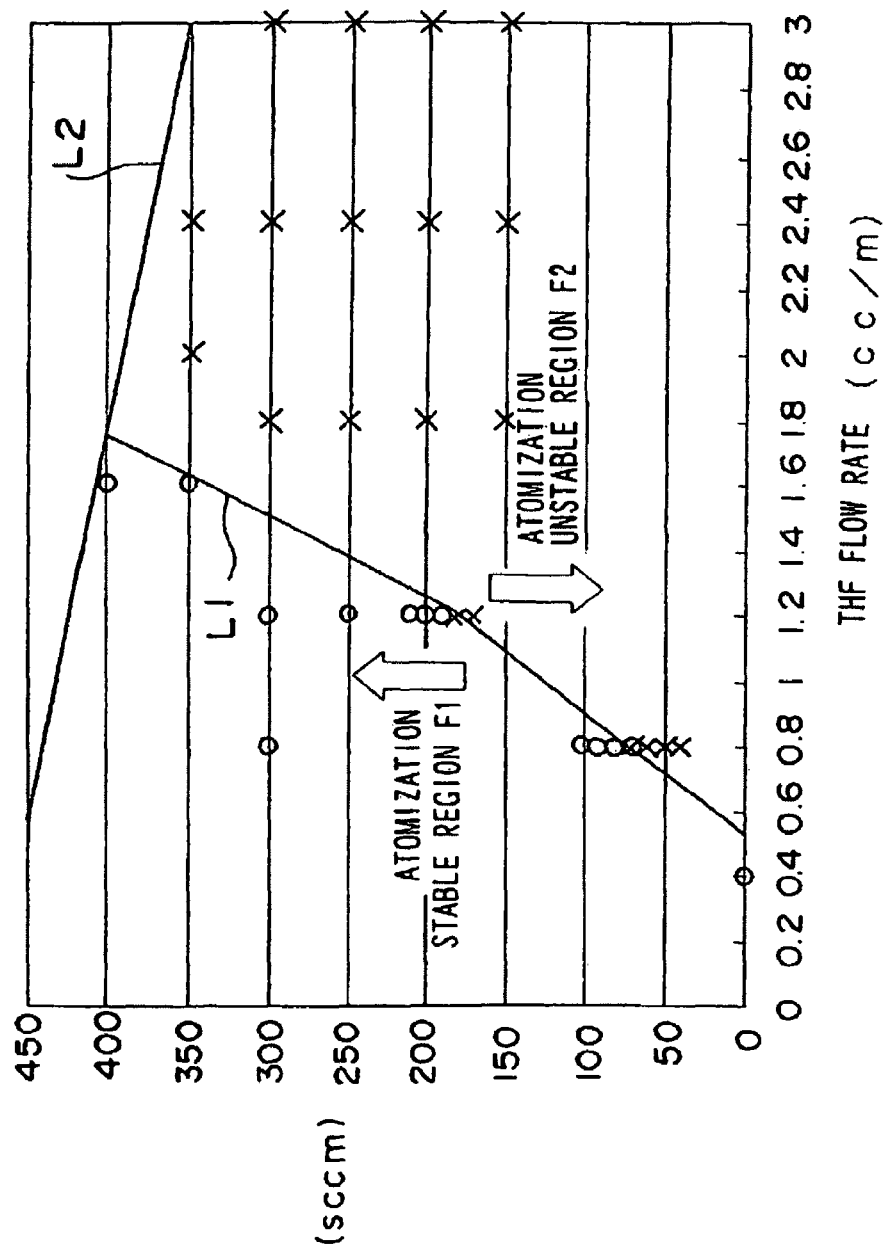
FIG. 36 is a figure for explanation of the stability of atomization in a vaporizer.

Furthermore, the atomization performance does not only depend upon the flow rate of the liquid substances 4A through 4C and the carrier gas, and upon the dimensions of the conduit, as described above, but also upon the flow rate of the atomization gas which flows through the external conduit 200b. FIG. 36 is a figure for explanation of the relationship between the liquid flow rate and the gas flow rate in the internal conduit 200a, the gas flow rate in the external conduit 200b, and the stability of atomization. It should be understood that, when performing these measurements, THF was used as the liquid flowing in the internal conduit 200a, while nitrogen gas was used as the carrier gas and the atomization gas.

In FIG. 36, the flow rate of the carrier gas (in SCCM) is shown along the vertical axis, while the flow rate of the THF (in cc/min) is shown along the horizontal axis. In these measurements, experiments were performed to distinguish between "stable atomization" which means that continuous atomization was observed, and "unstable atomization" which means that liquid droplets suddenly and discontinuously boil and the pressure in the vaporization chamber varied greatly. The "O" points in FIG. 36 denote data points at which stable atomization was observed, while the "X" points denote data points at which unstable atomization was observed. With regard to the atomization gas, the flow rate was 50 SCCM at pressures from 1333 Pa (=10 Torr) to 6666 Pa (=50 Torr), while the primary pressure of the THF was 1.7 Mpa. Furthermore, the temperature of the vaporization chamber was 250 degrees C.

As shown in FIG. 36, the tendency was for the atomization state to become less stable the greater was the THF flow rate, and for the atomization state to become more stable the greater was the amount of carrier gas. Furthermore, when the carrier gas amount was great, the flow rate of the THF reached an upper limit, and the line L2 shows this upper limit. For example, at the intersection of the line denoting a carrier gas rate of 400 SCCM and the line L2, the THF flow rate was about 1.7 cc/min. In other words, when the carrier gas flow rate was 400 SCCM, the flow of THF could not exceed 1.7 cc/min. In a region F1 on the lower side of the line L2 and moreover on the left side of a line L1, it was possible to perform atomization in a stable manner. However, in a region F2 on the lower side of the line L2 but on the right side of the line L1, the atomization was unstable.

When for example the flow rate of the liquid mixture of the liquid metal substance and the solvent THF flowing in the internal conduit 200a was 0.8 cc/min, it was desirable for the carrier gas rate to be 150 SCCM and the atomization gas flow rate to be 50 SCCM; and, when the liquid mixture flow rate was 1.2 cc/min, it was desirable for the carrier gas rate to be 250 SCCM and the atomization gas flow rate to be 50 SCCM.

The flow speed of the atomization gas which flows through the gap between the orifice member 212 and the internal conduit 200a is set to a suitable value by adjusting the diameter e of the hole in the orifice member 212 corresponding to the external diameter of the internal conduit 200a of FIG. 33. The end portion of the internal conduit 200a is centered with respect to the hole in the orifice member 212 by the atomization gas which is flowing through this gap.

Another Example of the Cooling Rod

Figure 37:
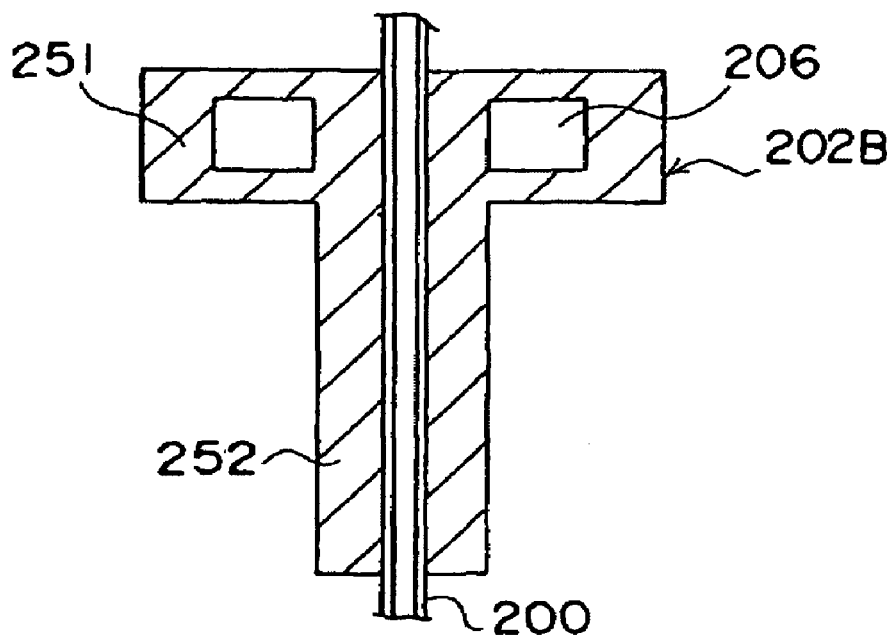
FIG. 37 is a sectional view showing a first variant embodiment of a cooling rod 202.
Figure 38:
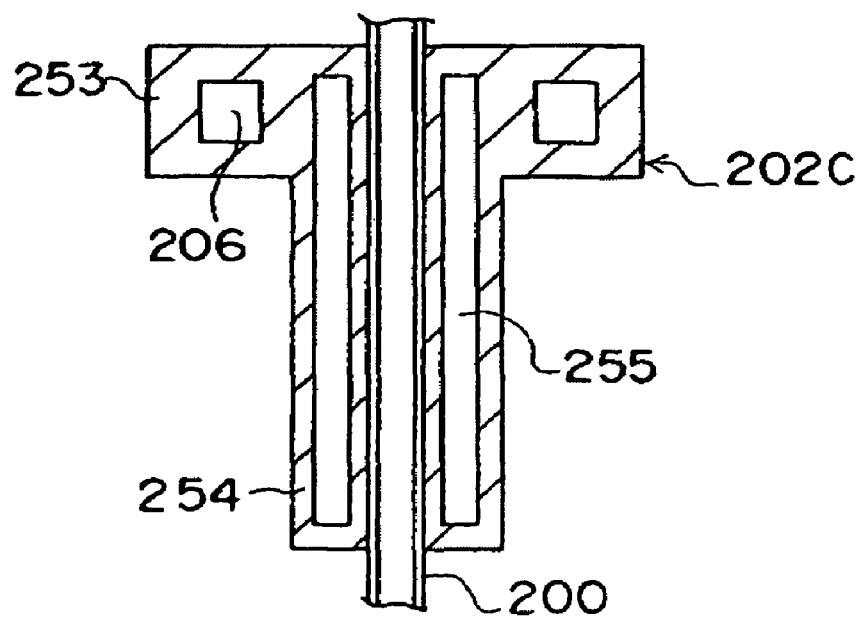
FIG. 38 is a sectional view showing a second variant embodiment of the cooling rod 202.

FIGS. 37 and 38 are sectional views showing first and second variant embodiments of the cooling rod 202. The cooling rod 202B shown in FIG. 37 is a single unit which combines the cooling rod 202 and the water cooling block 201 of FIG. 27. This cooling rod 202B comprises a water cooling section 251 and a rod section 252, and is formed from a substance such as copper whose thermal conductivity is high. By contrast with the cooling rod 202 of FIG. 27 which was fixed to the water cooling block 201 by a screw structure, by forming them in a unitary construction as in FIG. 37, it becomes possible to enhance the cooling efficiency of the rod section 252.

The cooling rod 202C shown in FIG. 38 comprises a further heat pipe structure in addition to the cooling rod 202B of FIG. 37. In detail, in this cooling rod 202C, an annular chamber 255 is formed from a portion in the vicinity of the cooling water conduit 206 which is provided in the water cooling section 253 to the tip of the rod section 254. A refrigerant such as alcohol or the like is enclosed in this chamber 255. This refrigerant enclosed in the chamber 255 is vaporized in the lower portion of the chamber 255 which is its portion which is at high temperature, and liquefies in the upper portion of the chamber 255 which is its portion which is at low temperature. Due to this, the cooling efficiency is enhanced by heat being transferred from the rod section 254 to the water cooling section 253 via the refrigerant in addition to the thermal conduction of the rod section 254, as compared to the cooling rod 202B of FIG. 37. Although with this cooling rod 202C the heat pipe structure was provided by forming the chamber 255 in the rod section 254, it would also be acceptable to employ a structure in which a commercially available heat pipe was embedded in the cooling rod 202B shown in FIG. 37.

Although in FIGS. 27 and 28 the water cooling block 201 and the cooling rod 202 were connected together into one unit by a screw construction, it would also be acceptable for them to be connected together into one unit by using welding with pressure. In the case that for example such a welding with pressure structure is employed, even if the water cooling block 201 is made from stainless steel (SUS) which is a different metal from copper from which the cooling rod 202 is made, it is possible to enhance the heat transfer efficiency at the interface between these two different types of metal.

Other Examples of the Nozzle Ring

Figure 39:
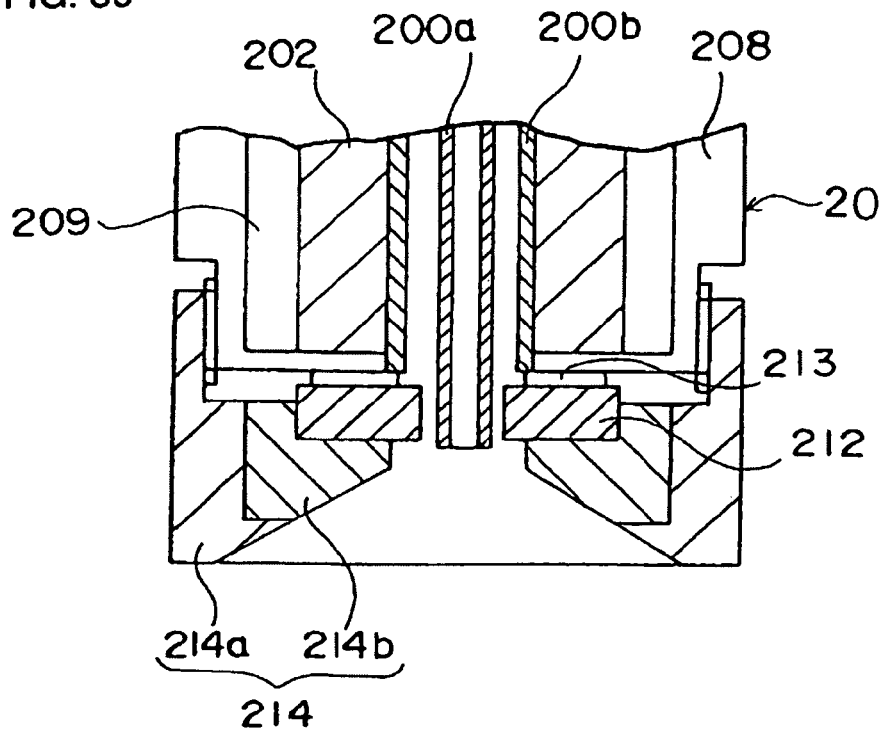
FIG. 39 is a figure showing a first variant embodiment of a nozzle ring 211.
Figure 40:
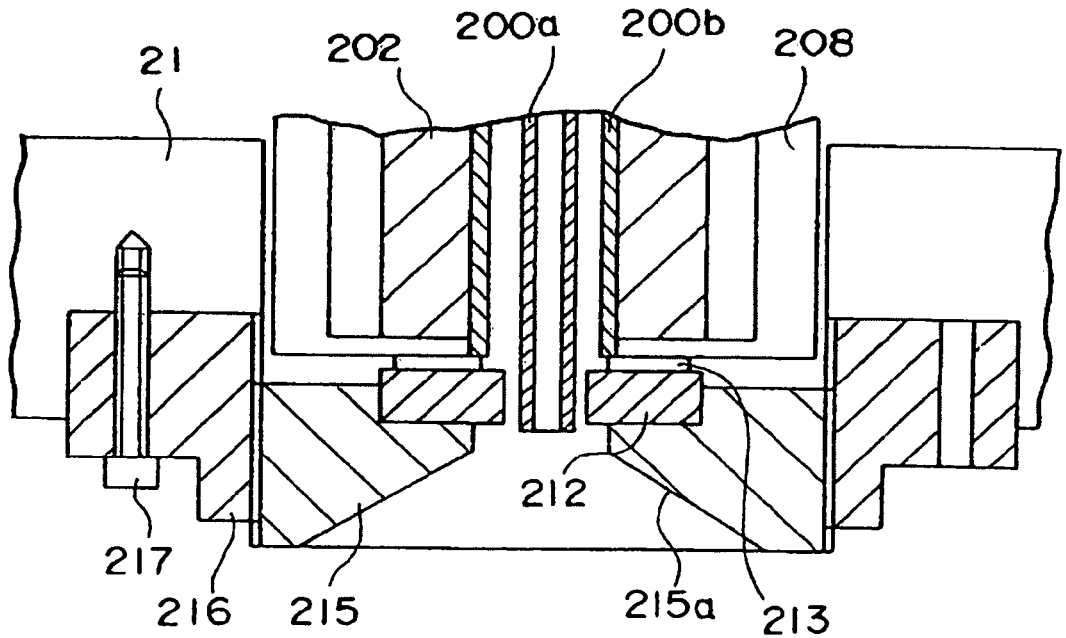
FIG. 40 is a figure showing a second variant embodiment of the nozzle ring 211.

FIGS. 39 and 40 are figures showing first and second variant embodiments of the nozzle ring 211. The nozzle ring 214 of FIG. 39 is made as a two-part structure, and comprises a box nut section 214a and a press ring 214b. With the nozzle ring shown in FIG. 33, when fixing the nozzle ring 211 to the casing by screwing it on, it may happen that the inconvenience occurs of the orifice member 212 as well rotating together therewith. However, in the case of the nozzle ring of the two-part construction shown in FIG. 39, even when the box nut section 214a is being screwed on, the orifice member 212 is pressed by the press ring 214b, and thus it is possible to avoid said orifice member 212 turning together with the box nut 214a.

The nozzle ring 215 shown in FIG. 40 is fixed by a screw structure to a flange 216. This flange 216 to which the nozzle ring 215 is fixed is itself fixed to the inner wall surface of the vaporization chamber 21 by a bolt 217. Since heat is conducted from the vaporization chamber 21 to the nozzle ring 215 via the flange 216, the nozzle ring 215 is maintained at almost the same high temperature as the vaporization chamber 21. As a result, it is possible to prevent the development of non vaporized residues upon the vaporization surface 215a. The position in the axial direction of the nozzle ring 215 can be adjusted by screwing the nozzle ring 215 into the flange 216. Although in the example shown in FIG. 40 the nozzle ring 215 and the flange 216 are provided as separate, it would also be acceptable for them to be formed as a single unit.

It would also be acceptable to coat the surfaces of any of the above nozzle rings 211, 214, or 215 with PTFE. By doing this, it is made more difficult for the liquid metal substances to adhere to the nozzle rings 211, 214, or 215, and the development of non vaporized residues is further reduced. Furthermore, it would also be acceptable to form a black colored protective film of high chemical resistance such as an oxide layer or the like upon the surface of the nozzle ring 211, 214, or 215. This black colored protective layer easily absorbs radiant heat from the vaporization chamber 21, so as to bring the temperature of the nozzle ring 211, 214, or 215 to be even closer to the temperature of the vaporization chamber 21.

With the above described vaporizer 2, the metal portions which are in contact with the liquid substances 4A through 4C, such as for example the conduits 200a, 200b, and 224 and the couplings 22, may be made from stainless steel (SUS) but it would also be acceptable for these parts to be manufactured from a material which has a higher chemical resistance, such as Ti or a Ti alloy such as TiN or the like.

Another Example of the Vaporizer 2

Figure 41:
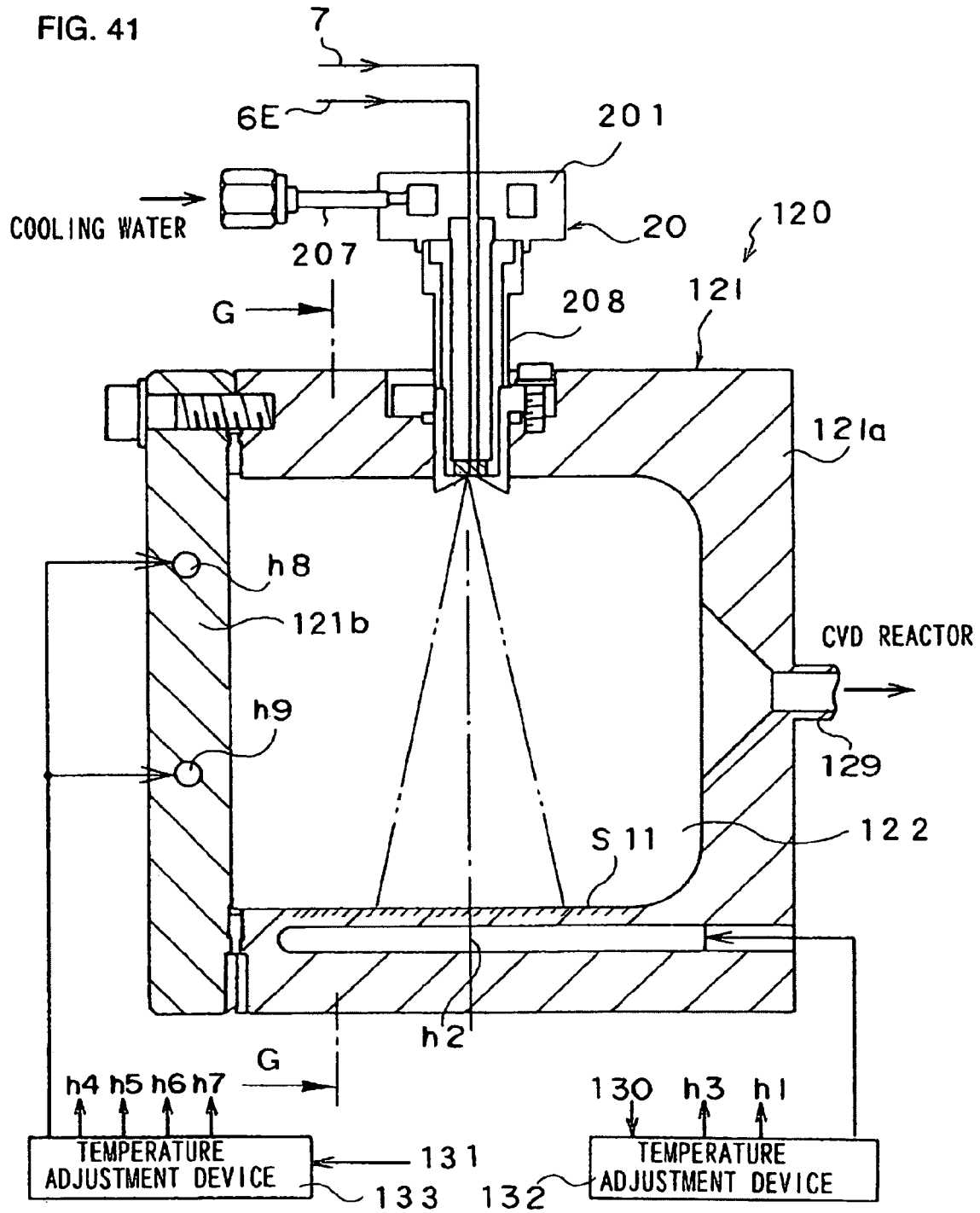
FIG. 41 is a sectional view of another vaporizer 120.
Figure 42:
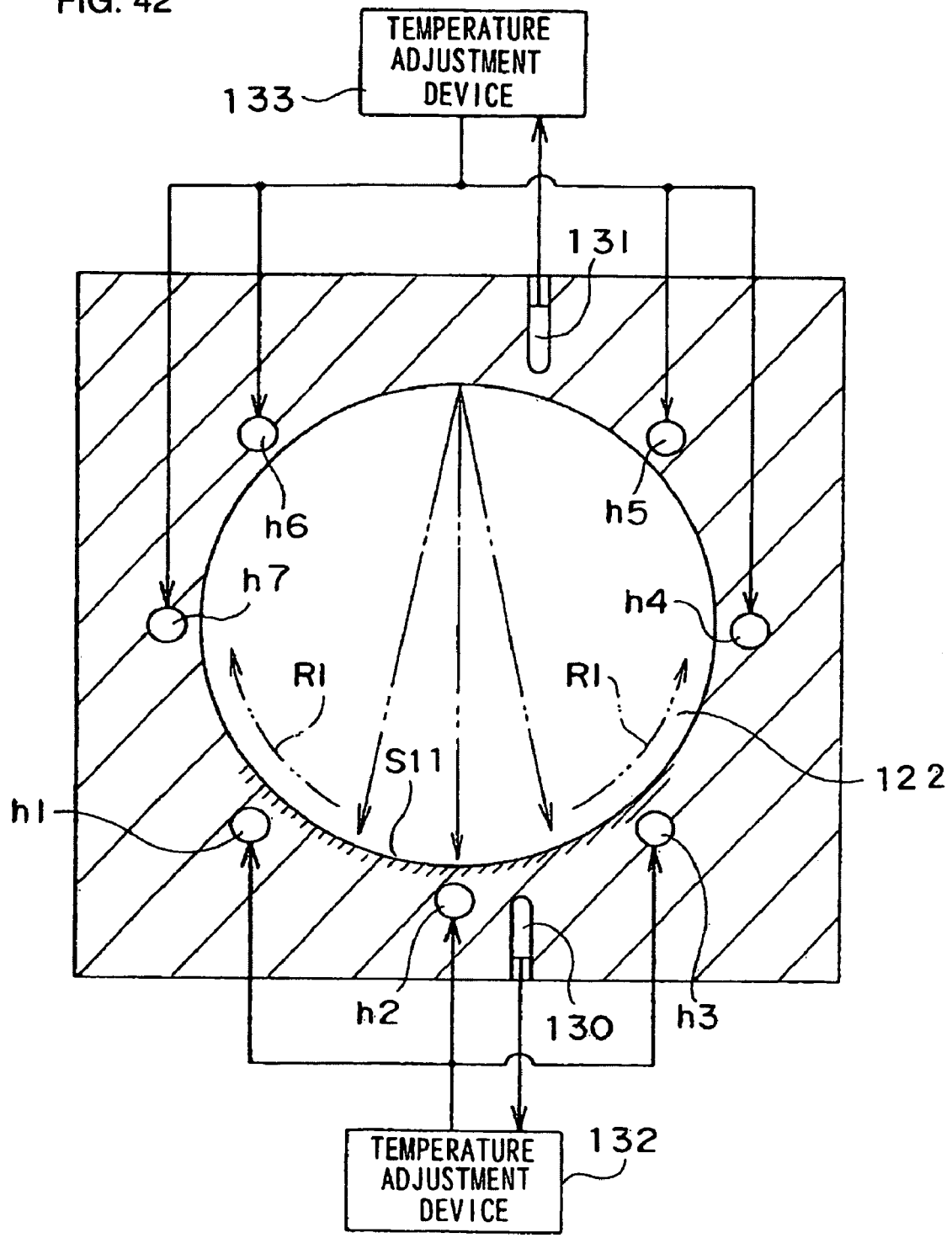
FIG. 42 is a sectional view of the vaporizer 120 of FIG. 41 taken in a plane shown by the arrows G-G in FIG. 41.

Next, another example of the vaporizer 2 will be explained. FIG. 41 is a sectional view of this other vaporizer 120, while FIG. 42 is a sectional view of the vaporizer 120 of FIG. 41 taken in a plane shown by the arrows G-G in FIG. 41. In the vaporizer 120 shown in FIG. 41, the structure of the vaporization chamber 121 is different from that in the vaporizer 2 of FIG. 27, but the structure of the nozzle section 20 which atomizes the liquid substances 4A through 4C is the same as in the FIG. 27 case. The following explanation will focus upon this variant structure for the vaporization chamber 121. A tubular chamber 122 is formed in the chamber main body 121a of the vaporization chamber 121 so as to extend in the horizontal direction (the left and right direction in the figure). The nozzle section 20 is fitted so as to inject atomized gas downwards in the vertical direction into the tubular chamber 122. A side cover (flange) 121b of the vaporization chamber 121 is formed so as to be detachable and attachable with respect to the chamber main body 121a. For example, when it is desired to perform cleaning of the interior of the vaporization chamber 121, the side cover 121b is removed, and the tubular chamber 122 is exposed to the atmosphere and cleaning is performed.

The liquid substances 4A through 4C which have been atomized by the nozzle section 20 of FIG. 41 are spouted in the direction of the surface of the tubular chamber 22 which opposes the end portion of the atomization section, and as shown in FIG. 42 flow back upwards along the inner peripheral surface of the tubular chamber 122 as shown by the arrows R1. Heaters h1 through h9 are provided in the vaporization chamber 121, and temperature control is performed so as to keep higher than the vaporization temperature. Due to this, the liquid substances 4A through 4C, which already are in the form of mist, are vaporized while flowing around the inner peripheral chamber surface in this manner, and are expelled along with the carrier gas from the exhaust orifice 129 towards the CVD reactor.

The heaters h1 through h9 are provided in the vaporization chamber main body 121a and the side cover 121b. Three of the heaters h1 through h3 are controlled by a temperature adjustment device 132 based upon the temperature which is detected by a temperature sensor 130. The other six heaters h4 through h9 are controlled by another temperature adjustment device 133 based upon the temperature detected by a temperature sensor 131. The entire inner peripheral surface of the tubular chamber 122 functions as a vaporization surface. In particular, since as shown in FIGS. 41 and 42 the liquid substances 4A through 4C are spouted from the nozzle section 20 almost in the vertically downwards direction, the surface S11 shown in FIG. 42 constitutes the main vaporization surface. Due to this, when the amount to be vaporized (in other words, the flow rate of the liquid substances 4A through 4C) is large, the temperature of the vaporization surface S11 drops below the vaporization temperature and it can easily happen that non vaporized residues may accumulate upon this vaporization surface S11.

In this connection, with the vaporizer 120, the heaters h1 through h3 which are in the vicinity of this main vaporization surface S11 and the other heaters h4 through h9 are controlled by the two different temperature adjustment devices 132 and 133, so as to ensure that the temperature of said main vaporization surface S11 is maintained at the most suitable temperature for vaporization. In other words, the supply of power to the heaters h1 through h3 to generate heat energy is adjusted according to the natures of the liquid substances 4A through 4C which are to be vaporized and according to their flow rates, so as to maintain the temperature of the main vaporization surface S11 at the most suitable temperature for vaporization. As a result, it is possible to reduce the generation of non vaporized residues upon the vaporization surface S11. For example, if the amount of heating energy is increased, and the temperature of the vaporization surface S11 is set to be higher than the temperature of the vaporization chamber 121, this can be very effective in the case when the temperature of pyrolysis (thermal decomposition) of the liquid substances 4A through 4C is quite close to their vaporization temperature.

Although the vaporization chamber 121 is generally made from stainless steel (SUS), in this case, there have been problems of chemical reactions taking place between the wall surface of the tubular chamber which functions as the vaporization surface, and the liquid substances 4A through 4C.

With the vaporizer 120, in order to prevent this type of chemical reaction taking place between the wall surface and the liquid substances 4A through 4C, the wall surface is coated with a film made from a material such as CVD. As a result, the wall surface of the tubular chamber 122 is protected by this film coating, and it is possible to prevent the occurrence of chemical reactions between said wall surface and the liquid substances 4A through 4C. For example, in the case of a vaporizer which is used in a CVD device which forms a BST film (a film of BaSrTi oxide), a similar BST film is used as the coating for the wall surface. As such a film, instead of BST, it would also be possible to utilize a dielectric film such as a PZT film (a PbZrTi film), a STO film ($SrTiO_2$), a $TiO_2$ film, a SBT film (a SrBiTa oxide film) or the like, or an oxide superconducting film or the like.

With the above described vaporizer 120, the construction is such that the various types of liquid substance 4A through 4C are mixed together, and the resultant liquid mixture is sprayed into the vaporization chamber 121 and atomized, so as to be vaporized therein. However, if as shown in FIG. 43 the pyrolysis temperatures and the vaporization temperatures of the various liquid substances 4A through 4C are radically different from one another, problems can arise when the mixed liquid consisting of all the liquid substances 4A through 4C is vaporized upon the single vaporization surface S11, as in the case of the vaporizer 120 described above.

Figure 43:
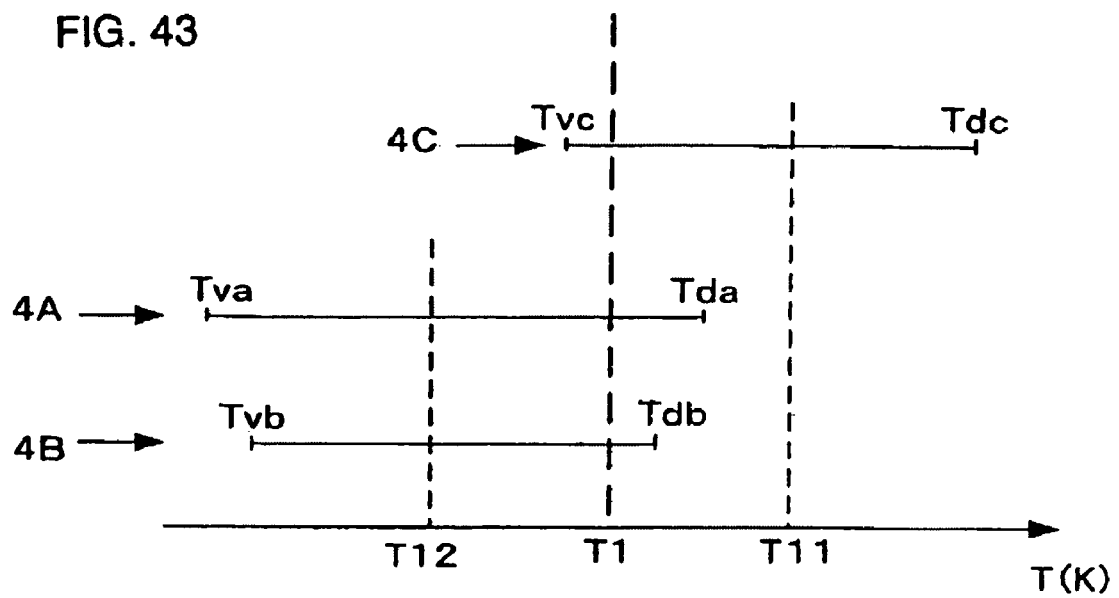
FIG. 43 is a figure showing the relationship between the pyrolysis temperatures and the vaporization temperatures of liquid substances 4A through 4C, and the temperature of a vaporization surface.

In the example shown in FIG. 43, the liquid substances 4A and 4B have almost the same pyrolysis temperatures and vaporization temperatures, while the liquid substance 4C has a much higher pyrolysis temperature and vaporization temperature. The vaporization temperature of a material is defined as the minimum temperature at which vaporization can be performed, while the pyrolysis temperature of a material is defined as the minimum temperature at which pyrolysis occurs. It is necessary to maintain the temperature of a vaporization surface between the vaporization temperature and the pyrolysis temperature. If the pyrolysis temperatures $T_{da}$, $T_{db}$, and $T_{dc}$ and the vaporization temperatures $T_{va}$, $T_{vb}$, and $T_{vc}$ of the liquid substances 4A through 4C are as shown in FIG. 43, the temperature of the vaporization surface S11 should be set to and maintained at a temperature like the temperature T1 shown in FIG. 43

When this temperature has been set to T1, for the substance 4C, vaporization is being performed at a temperature at which vaporization is only marginally possible, while, for the liquid substances 4A and 4B, vaporization is being performed at a temperature at which pyrolysis is almost occurring. As a result, the temperature control of the vaporization surface S11 becomes an extremely demanding task, and the problem arises that any variation of the temperature will cause the vaporization conditions to become unacceptable.

Figure 44:
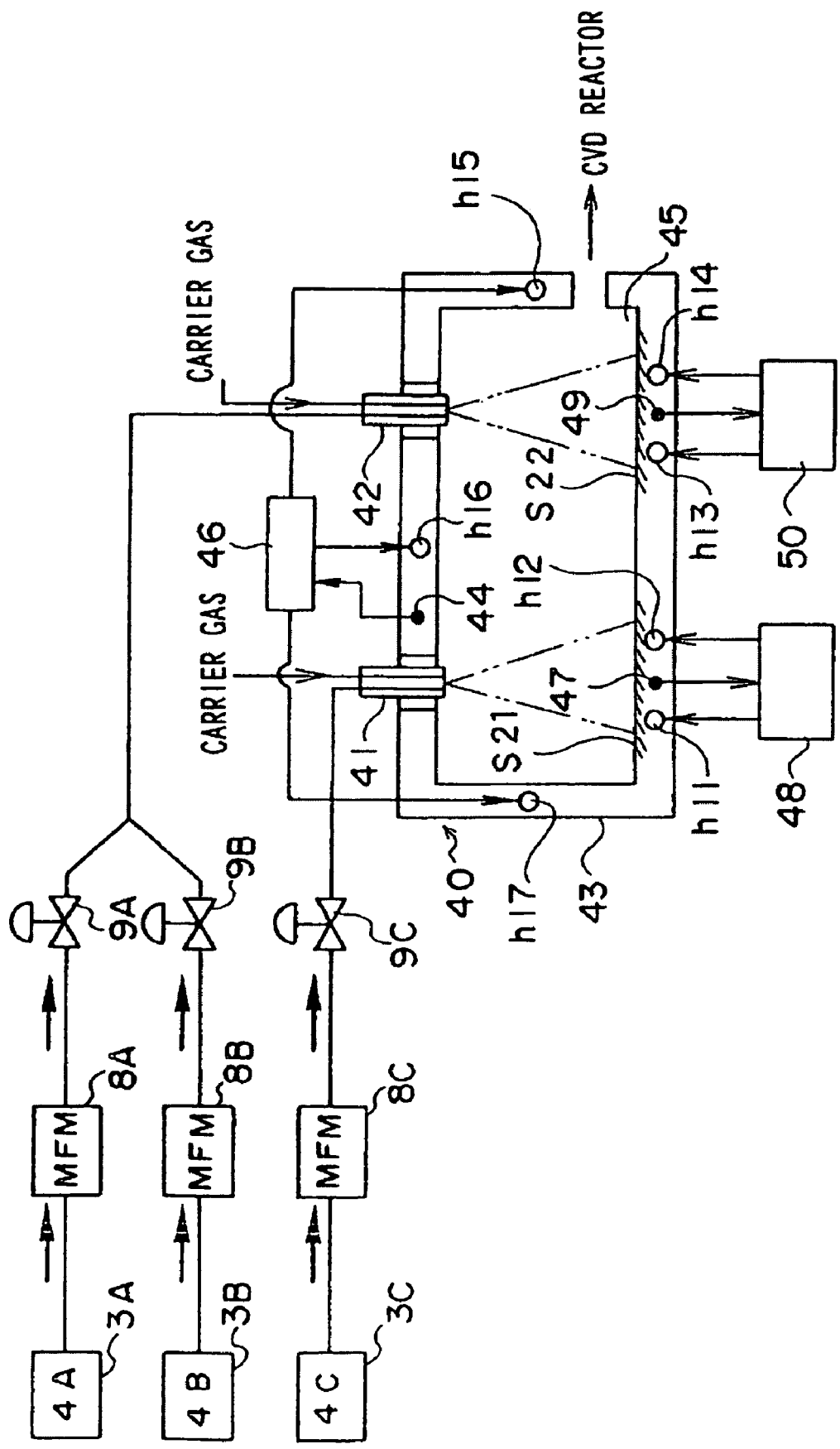
FIG. 44 is a figure showing another vaporizer 40.

In this connection, in the vaporizer 40 of FIG. 44, the mixture of the two liquid substances 4A and 4B, and the liquid substance 4C, are individually vaporized upon two different vaporization surfaces S21 and S22 which are temperature controlled independently. Thus, in the vaporizer 40 of FIG. 44, two nozzle sections 41 and 42 are provided in the vaporization chamber 43. The liquid substance 4C is atomized by the nozzle section 41, while the liquid substances 4A and 4B are mixed together and the resultant mixture is atomized by the nozzle section 42. The liquid substance 4C which has been atomized by the nozzle section 41 is spouted in the vertically downwards direction towards the vaporization surface S21 in the tubular chamber 45, and is mainly vaporized by this vaporization surface S21. On the other hand, the mixture of the liquid substances 4A and 4B which has been atomized by the nozzle section 42 is spouted in the vertically downwards direction towards the vaporization surface S22 in the tubular chamber 45, and is mainly vaporized by this vaporization surface S22.

Heaters h11 through h17 are provided in the vaporization chamber 43 for heating it. Temperature control of the chamber 43 as a whole is performed by a temperature adjustment device 46, based upon the temperature detected by a temperature sensor 44, by controlling the energy supplied to the heaters h15 through h17 and thereby the heat energy emitted by them. Temperature control of the vaporization surface S21 is performed by a temperature adjustment device 48, based upon the temperature detected by a temperature sensor 47, by controlling the energy supplied to the heaters h11 and h12 and thereby the heat energy emitted by them. And temperature control of the vaporization surface S22 is performed by a temperature adjustment device 50, based upon the temperature detected by a temperature sensor 49, by controlling the energy supplied to the heaters h13 and h14 and thereby the heat energy emitted by them.

If for example the qualities of the liquid substances 4A through 4C are as shown in FIG. 43, the temperatures of the vaporization surfaces S21 and S22 are individually controlled to be equal to the temperatures T11 and T12, which are substantially different from one another. Due to this, it is possible to perform vaporization of all of the liquid substances 4A through 4C at the most suitable vaporization temperatures in view of their particular characteristics. Furthermore, since two nozzle sections are provided, it is possible to anticipate a greater overall rate of vaporization per unit time, by contrast with the case of a vaporizer such as that shown in FIG. 41 in which only one nozzle section is provided.

Moreover, it would be possible to perform vaporization of all of the liquid substances 4A through 4C at the most suitable vaporization temperatures in the prior art type vaporizer case as well, if two separate vaporizers were to be provided, in one of which the mixture of the liquid substances 4A and 4B was vaporized, while the liquid substance 4C was vaporized in the other. However, along with increasing the size of the system as a whole, such an expedient would also greatly increase its cost. By contrast, it is possible remarkably to restrain increase in the size and cost of the vaporizer system by using the vaporizer 40 of the type described above.

Since in the example shown in FIG. 43 the characteristics with regard to vaporization and pyrolysis of two of the liquid substances 4A and 4B were very similar, they were mixed together and the resultant mixture was injected through a single nozzle section 41 and thereby was atomized and vaporized; but, if the characteristics of all the three liquid substances 4A, 4B, and 4C differed markedly from one another, it would also be possible, as an alternative, to provide each of these liquid substances 4A through 4C with its own dedicated nozzle section.

Figure 45:
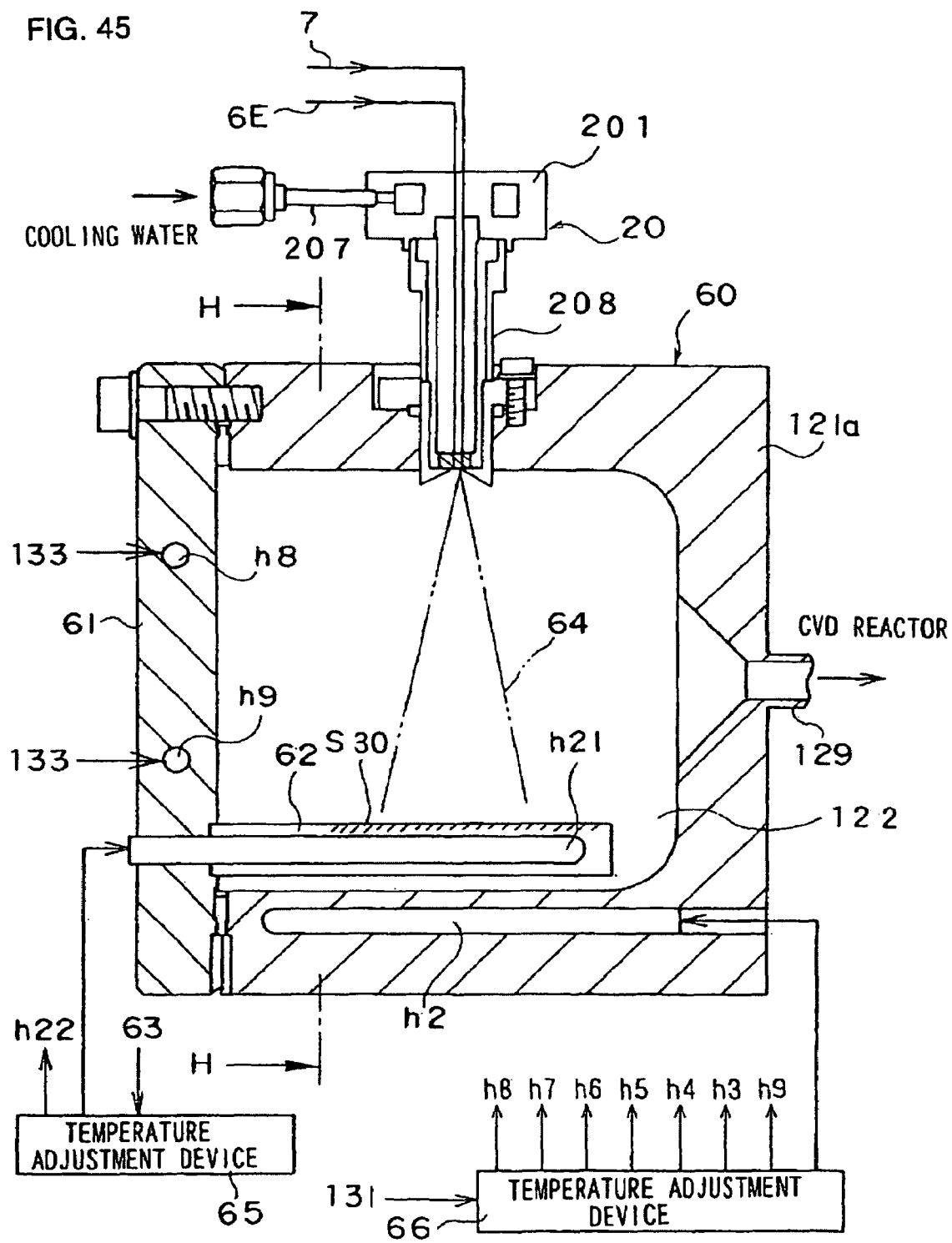
FIG. 45 is a sectional view of yet another vaporizer 60.
Figure 46:
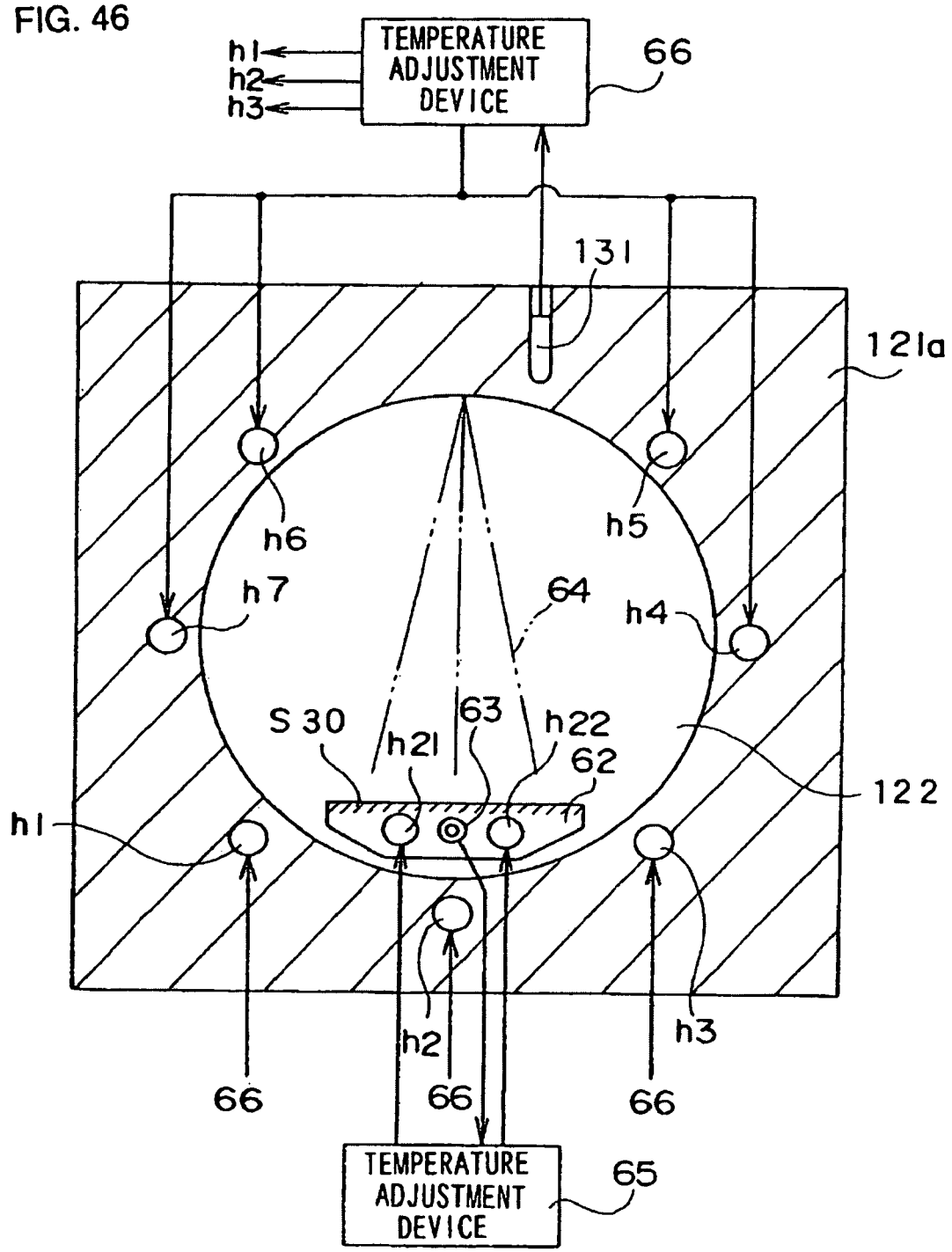
FIG. 46 is a sectional view of the vaporizer 60 of FIG. 45 taken in a plane shown by the arrows H-H in FIG. 45.

In another vaporizer variant shown in FIG. 45, a tongue 62 is provided upon the inner side of the side cover 61. FIG. 46 is a sectional view of the vaporizer 60 of FIG. 45 taken in a plane shown by the arrows H-H in FIG. 45, and shows a cross section of the tongue 62, which extends in the horizontal direction and opposes the nozzle section 20 in the vertical direction. Heaters h21 and h22 and a temperature sensor 63 are provided in the tongue 62. These heaters h21 and h22 and the temperature sensor 63 are connected to a temperature adjustment device 65. The liquid substance 64 which is spouted towards the tongue 62 is vaporized by the vaporization surface S30 of the tongue 62. The heaters h21 and h22 are controlled, based upon the temperature which is detected by the temperature sensor 63, so as to keep the temperature of the tongue 62 at a somewhat higher temperature than that of the chamber main body 121a. On the other hand, the amounts of energy supplied to the heaters h1 through h9, and thereby the amounts of heat energy which they evolve, are controlled by a temperature adjustment device 66 based upon the temperature which is detected by a temperature sensor 131 which is provided in the chamber main body 121a.

In the case of this vaporizer 60 as well, it is possible to obtain the same beneficial results as in the case of the vaporizer 120 described above, since the construction makes it possible to adjust the temperature of the vaporization surface S30 separately from the temperature of the chamber main body 121a. Furthermore, since in this vaporizer 60 the tongue 62 is provided as a separate unit and its temperature can be independently controlled, therefore this vaporizer 60 differs from the previously described vaporizer 120 in that a portion of the vaporization chamber 121 is independently temperature controlled, and accordingly the temperature control characteristics are improved.

Yet further, when cleaning the vaporization chamber 60, since the non vaporized components which are inevitably produced by a substantial period of vaporization chiefly adhere to the upper side of the tongue 62, therefore it is possible to remove the side cover 61 to cleanse the tongue 62 separately. Due to this it is possible to perform the operation of cleaning simply, and also the reliability of the cleaning operation is enhanced.

Figure 47:
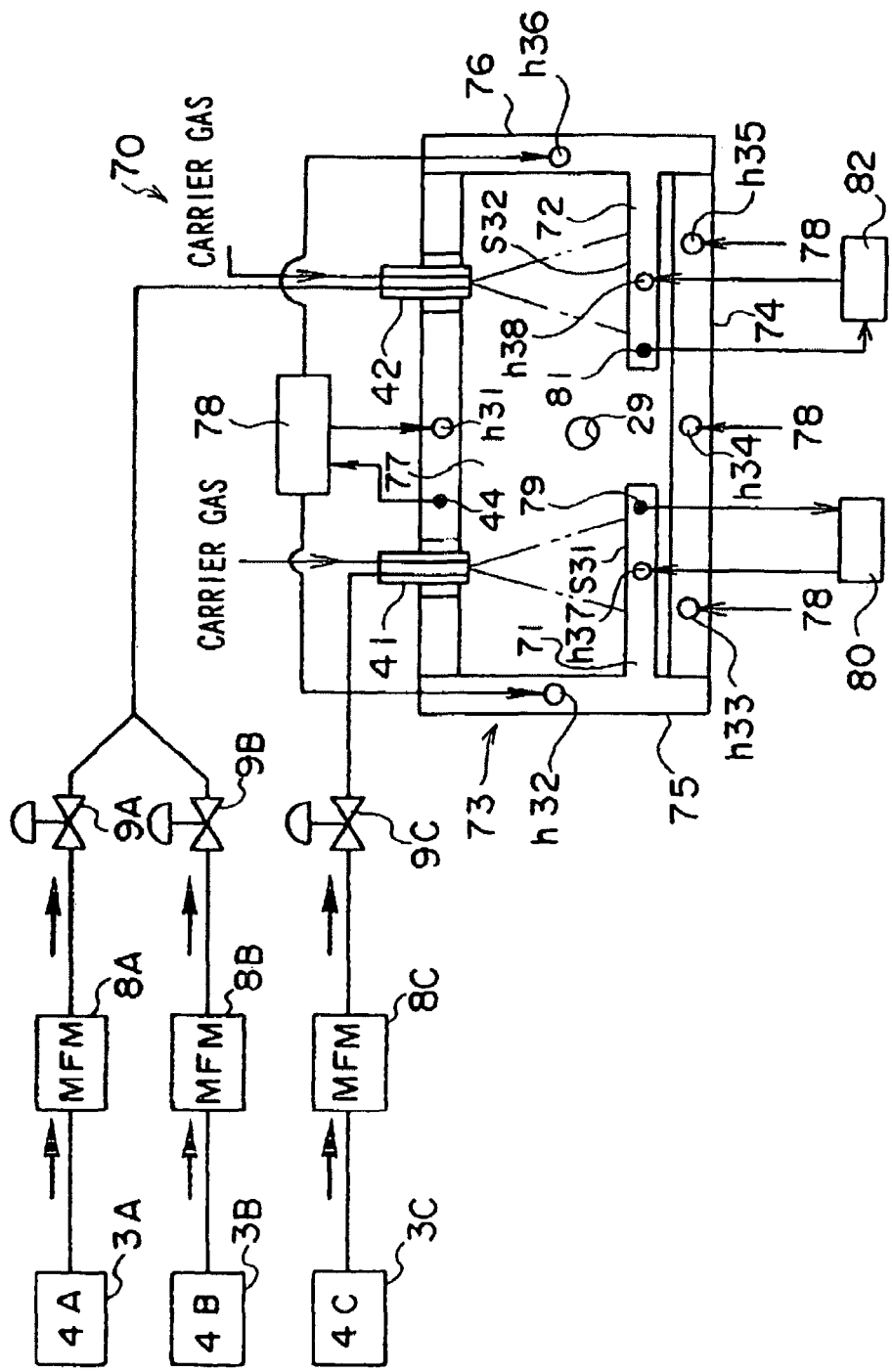
FIG. 47 is a figure showing still another vaporizer 70.

In another vaporizer variant shown in FIG. 47 two nozzle sections 41 and 42 are provided, in the same manner as in the vaporizer 40 which was shown in FIG. 44. A tubular chamber 77 is formed in the chamber main body 74 of the vaporization chamber 73, and extends in the horizontal direction in the figure. At the left and right ends of this tubular chamber 77 there are provided covers (flanges) 75 and 76 which can be removed and re-attached. Tongues 71 and 72 are formed upon these covers 75 and 76. The temperature of the vaporization chamber 73 is maintained at a specified temperature by heaters h31 through h36, a temperature sensor 77 and a temperature adjustment device 78.

The tongue 71 is provided at a position upon the cover 75 which opposes the nozzle section 41, and the surface S31 of this tongue 71 functions as a vaporization surface for the liquid substance 4C. A heater h37 and a temperature sensor 79 are provided in this tongue 71. The heater h37 is controlled by a temperature adjustment device 80, based upon the temperature sensed by the temperature sensor 79, so as to maintain the temperature of the tongue 71 at the temperature T11 shown in FIG. 43. Similarly, the tongue 72 is provided at a position upon the cover 76 which opposes the nozzle section 42, and the surface S32 of this tongue 72 functions as a vaporization surface for the mixture of the liquid substances 4A and 4B. A heater h38 and a temperature sensor 81 are provided in this tongue 71. The heater h38 is controlled by a temperature adjustment device 82, based upon the temperature sensed by the temperature sensor 81, so as to maintain the temperature of the tongue 72 at the temperature T12 shown in FIG. 43.

In this vaporizer 70 shown in FIG. 47 as well, in the same manner as in the vaporizer 40 shown in FIG. 44, there are provided two vaporization surfaces S31 and S32 whose temperatures are different and are set individually in correspondence to the characteristics of the liquid substances 4A through 4C which are to be vaporized. And, since the temperatures of these two vaporization surfaces S31 and S32 are controlled independently, the same benefits are obtained as in the case of the vaporizer 40, described above. Moreover, since in this vaporizer 70 the two separate tongues 71 and 72 are provided and the vaporization surfaces S31 and S32 are formed upon the upper surfaces of these tongues 71 and 72, therefore the temperature controllability for these two vaporization surfaces S31 and S32 is even more improved, as compared to the case with the vaporizer 40 described above.

Explanation of the Vaporization Performance Appraisal Method

Figure 48:
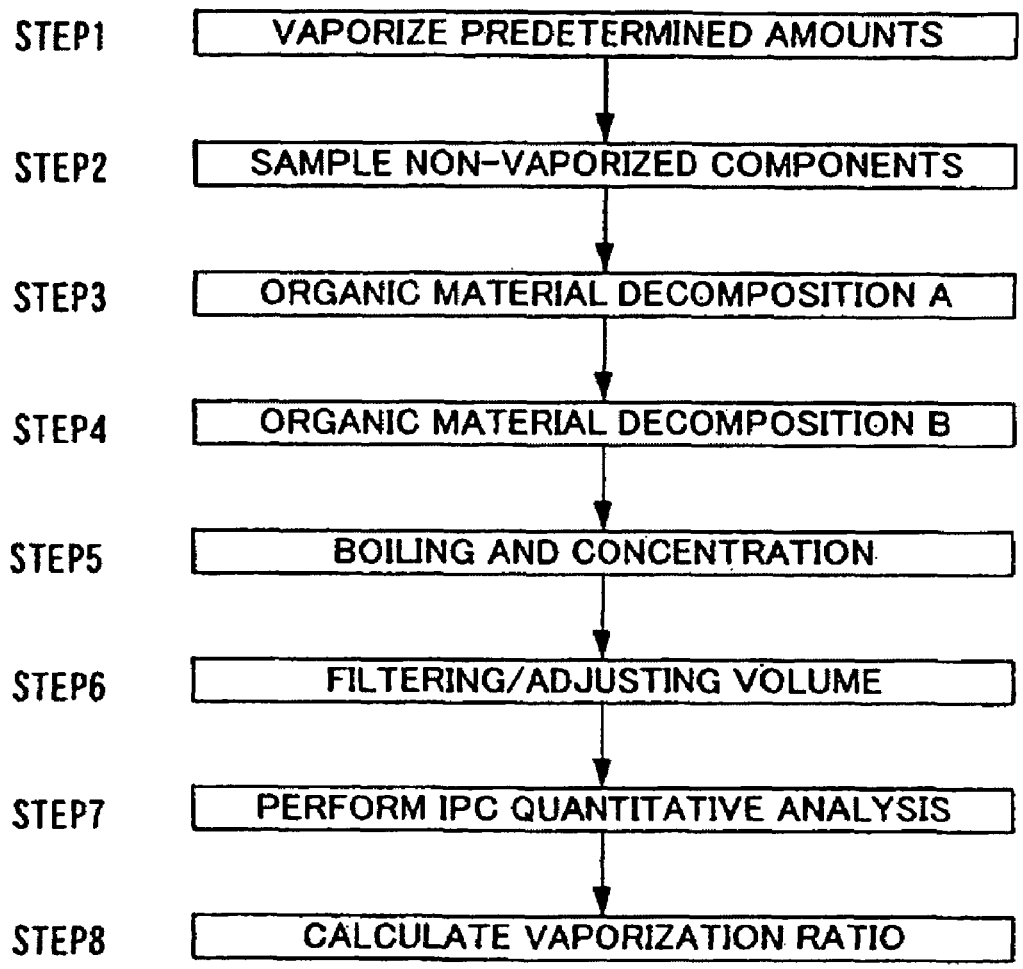
FIG. 48 is a figure showing a procedure for measuring in vaporization performance appraisal.

Next, the method according to this preferred embodiment of the present invention for appraising the vaporization performance of the vaporizer will be explained. The vaporization performance of the vaporizer is appraised according to what percent of the liquid substance which is supplied to the vaporizer is vaporized. This can be determined according to the difference between the amount of supply and the amount of the non-vaporized component within the vaporizer. FIG. 48 is a figure showing a procedure for measuring vaporization performance, and this procedure will be explained in the following in terms of the case in which Ba, Sr and Ti are used as the substances to be vaporized.

In the step 1 of FIG. 48, predetermined amount of liquid substances are vaporized by the vaporizer. Next, in the sampling process of step 2, the non-vaporized components which have adhered over the entire wall surface of the vaporization chamber including the vaporization surface are removed by the use of ethyl alcohol or the like. For example, a cloth of about 0.1 to 0.3 g in weight is wetted with ethyl alcohol, and the non-vaporized components which have adhered to the wall surfaces are wiped off with this cloth. In an organic material decomposition "A" process of step 3, the cloth, after it has thus been used for wiping off the wall surfaces, is soaked with a mixture liquid consisting of 2 ml of hydrochloric acid, 0.5 ml of hydrogen peroxide and 1 ml of pure water, which is then heated for 1.5 hours at a temperature of 150 degrees C., so that the organic material which has adhered to the cloth is decomposed. In an organic material decomposition "B" process of step 4, a further 1 ml of hydrochloric acid, 0.5 ml of hydrogen peroxide and 1 ml of pure water are added to the solution of step 3, and is heated for a further 1.5 hours at a temperature of 150 degrees C.

In a boiling and concentration process of step 5, a further 1 ml of pure water is added, and the solution is heated for a further 0.5 hours at a temperature of 150 degrees C. In a filtering and constant volume process of FIG. 6, after the solution of step 5 has been filtered, 1 ml of hydrochloric acid is added, and the volume is adjusted to 20 to 100 ml. In a step 7, quantitative analysis for each of the elements Ba, Sr, and Ti is performed by an analysis device which uses ICP (inductively coupled plasma), and the amounts of the non-vaporized components are calculated. When performing this quantitative analysis, working curves based upon the ICP analysis which has been performed on the test materials like those shown in FIG. 49 are used and the amounts of non-vaporized components are calculated by comparison with these working curves. In a step 8, the vaporization ratio is calculated from the amounts of the liquid substances which were used for vaporization and from the amounts of non-vaporized components which were calculated in the step 7. With the appraisal method shown in FIG. 48, it becomes possible to appraise the vaporization performance of the vaporizer accurately, because the non-vaporized components which adhere to the wall surfaces within the vaporizer are actually subjected to quantitative analysis.

What is claimed is:

1. A liquid substance supply device that supplies gas via a gas supply line to a substance container which stores a liquid substance comprising a liquid organometal or an organometal solution, supplies the liquid substance by pressure of the gas to a liquid substance transfer line, and supplies the liquid substance to a vaporizer via said liquid substance transfer line, comprising:

a four port three valve directional control valve that is of unitary structure and comprises a first valve body which is provided between a first conduit and a second conduit and performs an ON-OFF control of transfer of fluid between said first conduit and said second conduit, a second valve body which is provided between said first conduit and a third conduit and performs an ON-OFF control of transfer of fluid between said first conduit and said third conduit, and a third valve body which is provided between said third conduit and a fourth conduit and performs an ON-OFF control of transfer of fluid between said third conduit and said fourth conduit, said first conduit being provided between said first valve body and said second valve body, said third conduit being provided between said second valve body and said third valve body, wherein:

four port three valve directional control valve is provided between said liquid substance transfer and said gas supply lines and said substance container;

said first conduit and said gas supply line are connected together;

said second conduit and a gas region of said substance container are connected together;

said third conduit and said liquid substance transfer line are connected together;

said fourth conduit and a liquid region of said substance container are connected together; and said substance container and said four port three valve directional control valve can be attached to and removed from said gas supply line and said liquid substance transfer line as one unit.

2. A liquid substance supply device according to claim 1, further comprising:

a drain tank whose interior is evacuated to a low pressure state, which receives waste fluid which is exhausted when liquid substitution or conduit rinsing is being performed in said liquid substance transfer line, and which is connected via a valve to said liquid substance transfer line directly before said vaporizer.

3. A liquid substance supply device according to claim 1, further comprising:

a detection device that is provided at said liquid substance transfer line, and detects a presence or absence of the liquid substance in said liquid substance transfer line, or a presence or absence of bubbles generated from the liquid substance by using a photoelectric sensor.

* * * * *